US005581746A

United States Patent [19]
Watanabe

[11] Patent Number: 5,581,746
[45] Date of Patent: Dec. 3, 1996

[54] SYNCHRONOUS LSI MEMORY DEVICE

[75] Inventor: Yuji Watanabe, Kawasaki, Japan

[73] Assignee: Kabushiki Kaisha Toshiba, Kawasaki, Japan

[21] Appl. No.: 174,038

[22] Filed: Dec. 28, 1993

[30] Foreign Application Priority Data

Dec. 28, 1992 [JP] Japan .................................. 4-359930

[51] Int. Cl.$^6$ .................................................. G06F 13/00
[52] U.S. Cl. .................................................. 395/551
[58] Field of Search .................................................. 395/550

[56] References Cited

U.S. PATENT DOCUMENTS 5,033,001  7/1991  Ibi .......................................... 395/550

Primary Examiner—Kevin A. Kriess
Assistant Examiner—John I. Chavis
Attorney, Agent, or Firm—Foley & Lardner

[57] ABSTRACT

A synchronous LSI memory device, comprises memory cell array sections (BK1, BK2) each having a plurality of memory cells; a timing generating section (CLOCK MASKED SECT) for generating a first basic signal (CPOR) synchronous with a clock signal (CLK) and masked according to the status of a control signal (CKE); a signal generating section (SERIAL SYS CONTROL) for generating a second signal (CP) in synchronism with the first basic signal (CPOR) and stopping generating the second signal after a predetermined number of accesses or in response to a stop signal (MRRST, MWSTP, LADA, BSTP); and a control section (SHIFT REGISTER) for controlling the cell array sections (BK1, BK2) on the basis of outputs of the timing signal generating section and the signal generating section. In the synchronous LSI memory device, it is possible to operate the memory device whose access speed is lower than the CPU on the basis of a single high speed clock signal suitable for the CPU, so that it is possible to simplify the clock control so as to correspond to the higher speed CPU without complicating the system configuration.

10 Claims, 82 Drawing Sheets

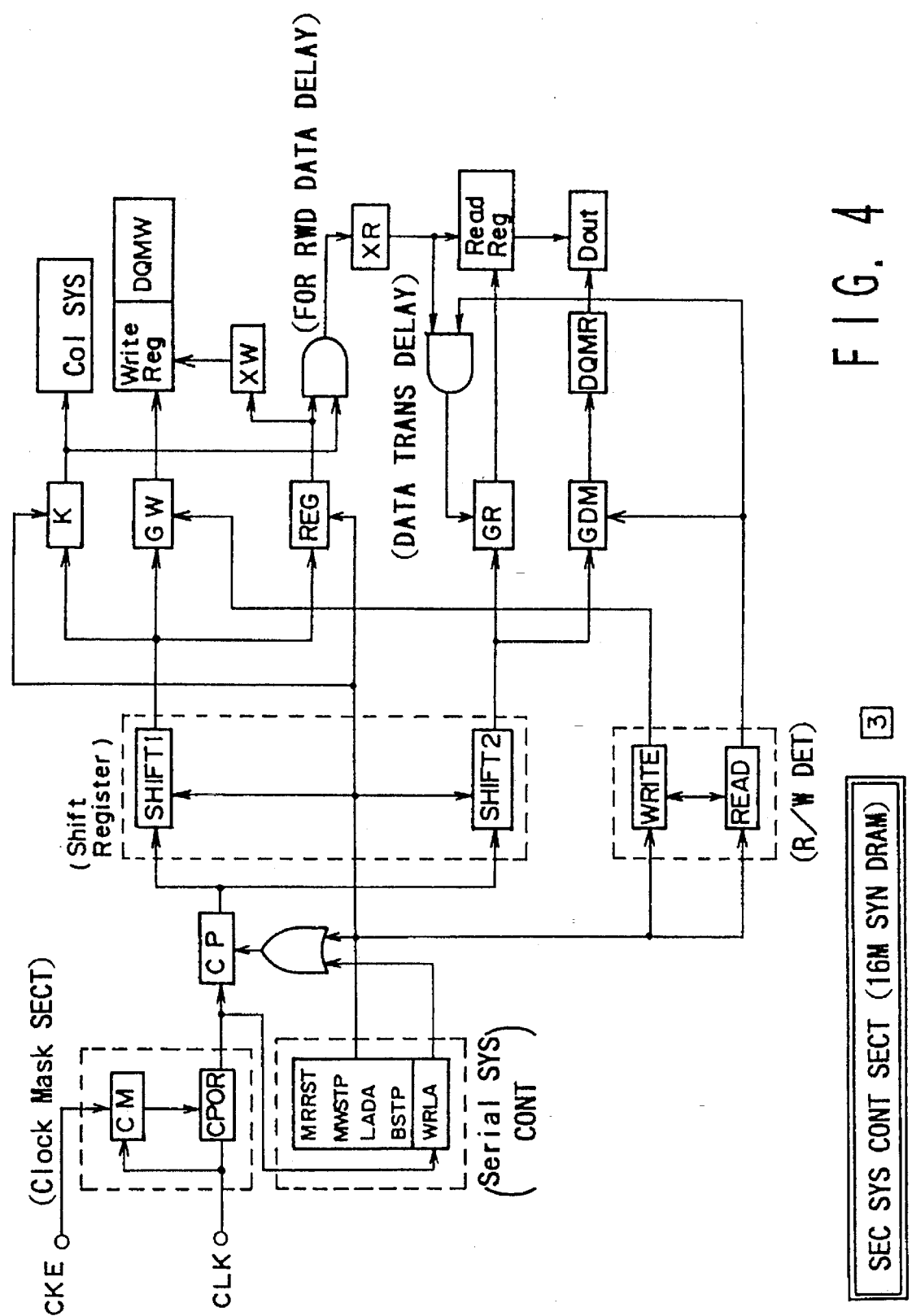
F I G. 4

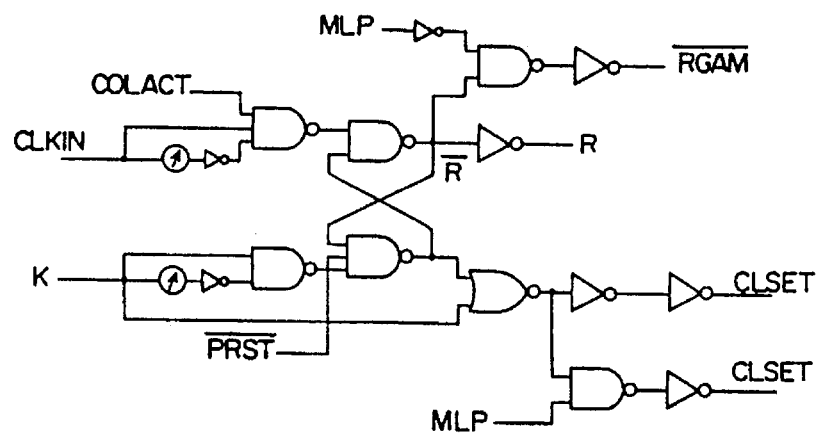
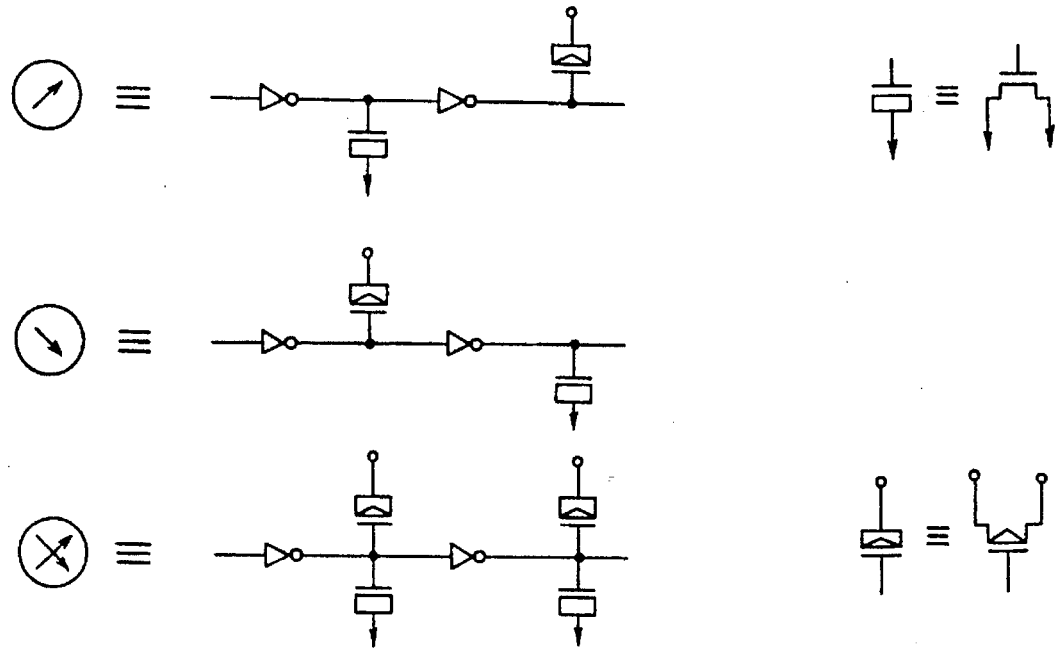
FIG. 13

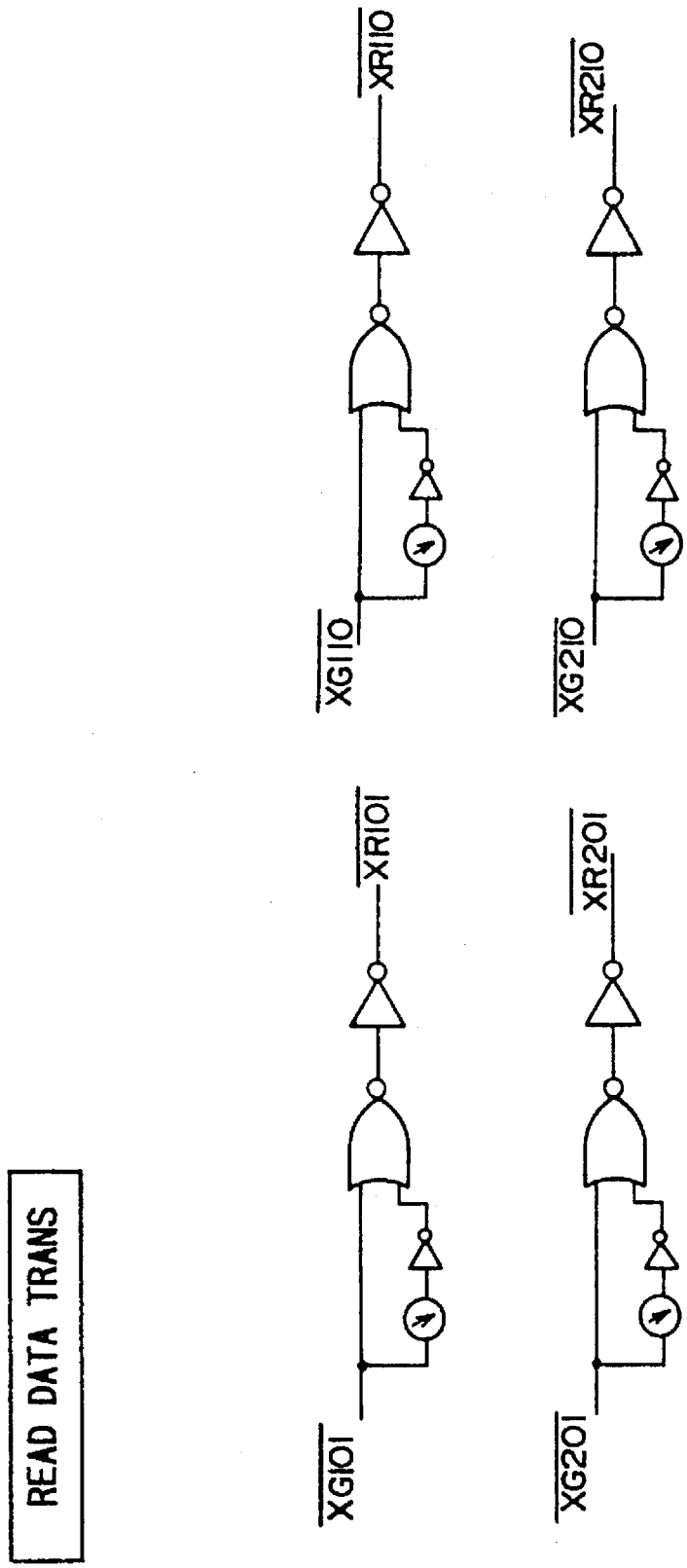
READ DATA TRANS
F I G. 23 (A)
F I G. 23 (B)

ADDRESS BUFF

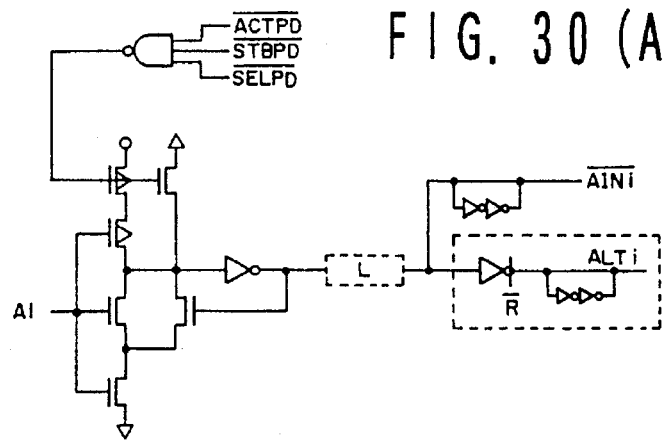

FIG. 30 (A)

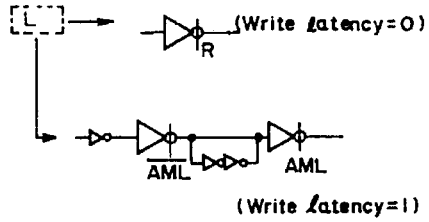

FIG. 30 (B)

| ADDRESS | SIG NAME | DESTINATION |
|---|---|---|
| A0 | ALT0 | XR, XW, QACT SEL, CDRV SEL |
| A1 | ALT1 | QACT SEL, CDRV SEL |
| A2 | ALT2 | CDRV SEL |
| A3 | ALT3 | CTR CONT, CDRV |
| | $\overline{AIN3}$ | CTR |
| A4 | $\overline{AIN4}$ | CTR |
| A5 | $\overline{AIN5}$ | CTR |
| A6 | $\overline{AIN6}$ | CTR |
| A7 | $\overline{AIN7}$ | CTR |
| A8 | $\overline{AIN8}$ | CTR |
| A9 | ALT9 | QACT SEL |
| A10 | | ROW |
| BS | $\overline{BSCL}$ | KI/II |

FIG. 30 (C)

| SIG NAME | ADDRESS SIG NAME |
|---|---|
| XR, XW | ALT0 |
| CDRV SEL | ALT0, ALT1, ALT2, ALT3 |
| QACT SEL | ALT0, ALT1, ALT9 |
| CTR CONT | ALT3 |
| CTR | $\overline{AIN}$ ~ $\overline{AIN8}$ |
| KI/II | $\overline{BSCL}$ |

FIG. 30 (D)

| SIG | DESTINATION |
|---|---|
| WEIN | READ, WRITE, BURST STOP |
| $\overline{\text{WECL}}$ | READ, WRITE, XGijk, XW<br>DQ READ CONT<br>DQ WRITE CONT |

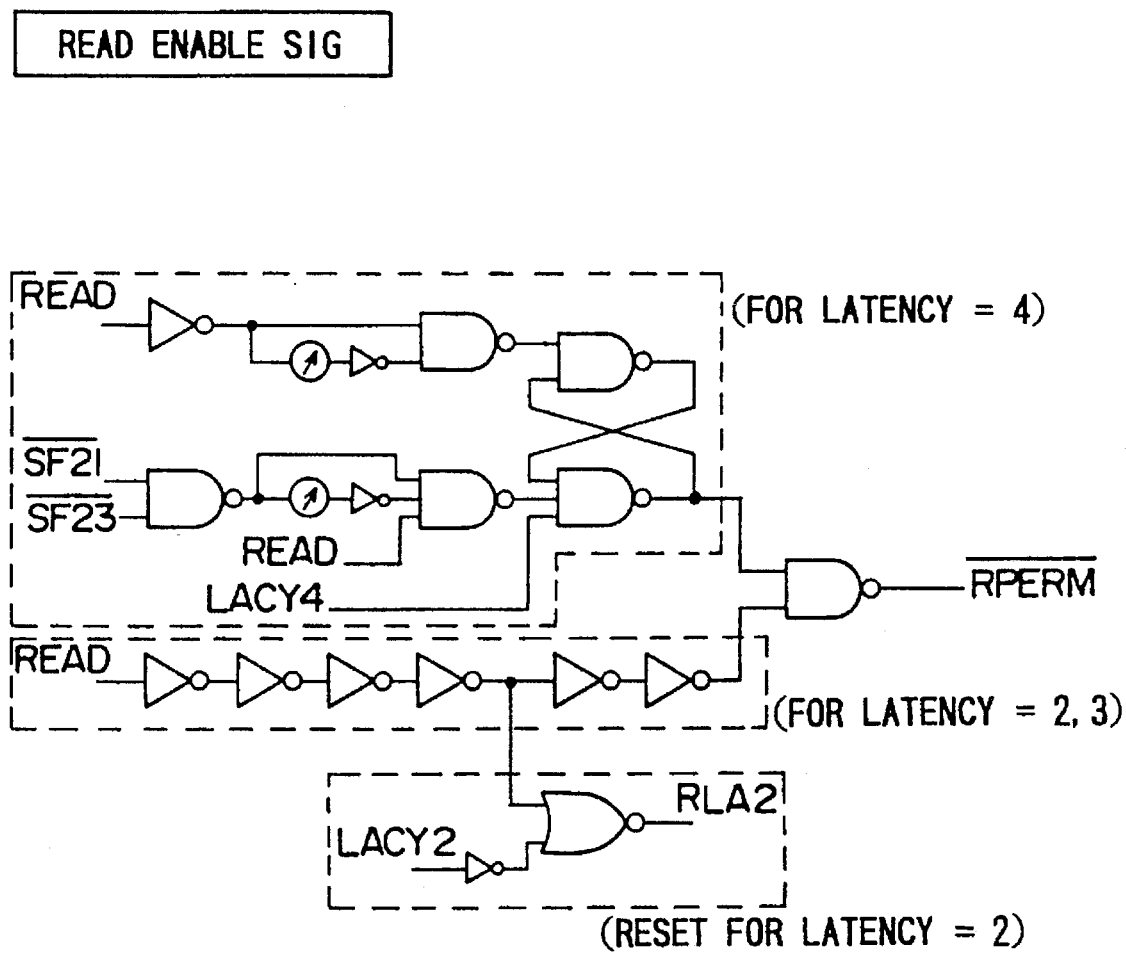
F I G. 33

DQMR GATE
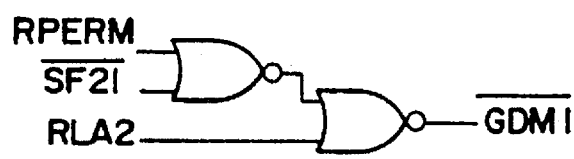
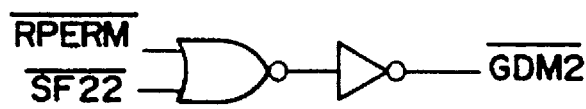
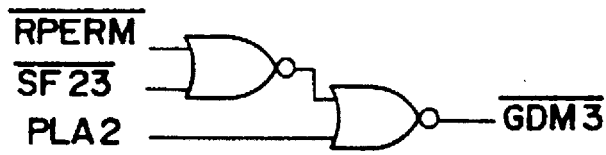
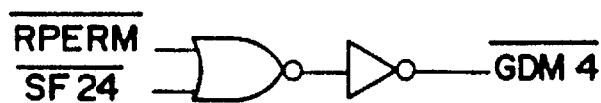
FIG. 34

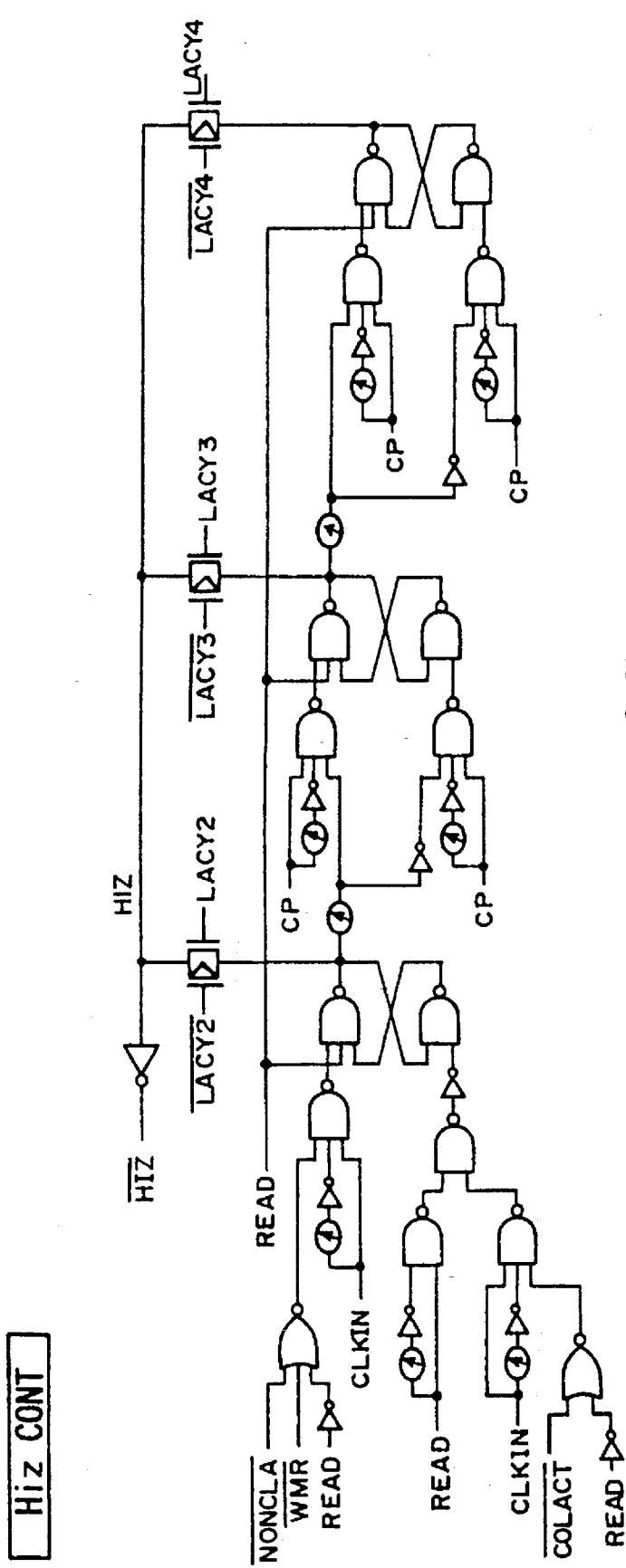
F I G. 35

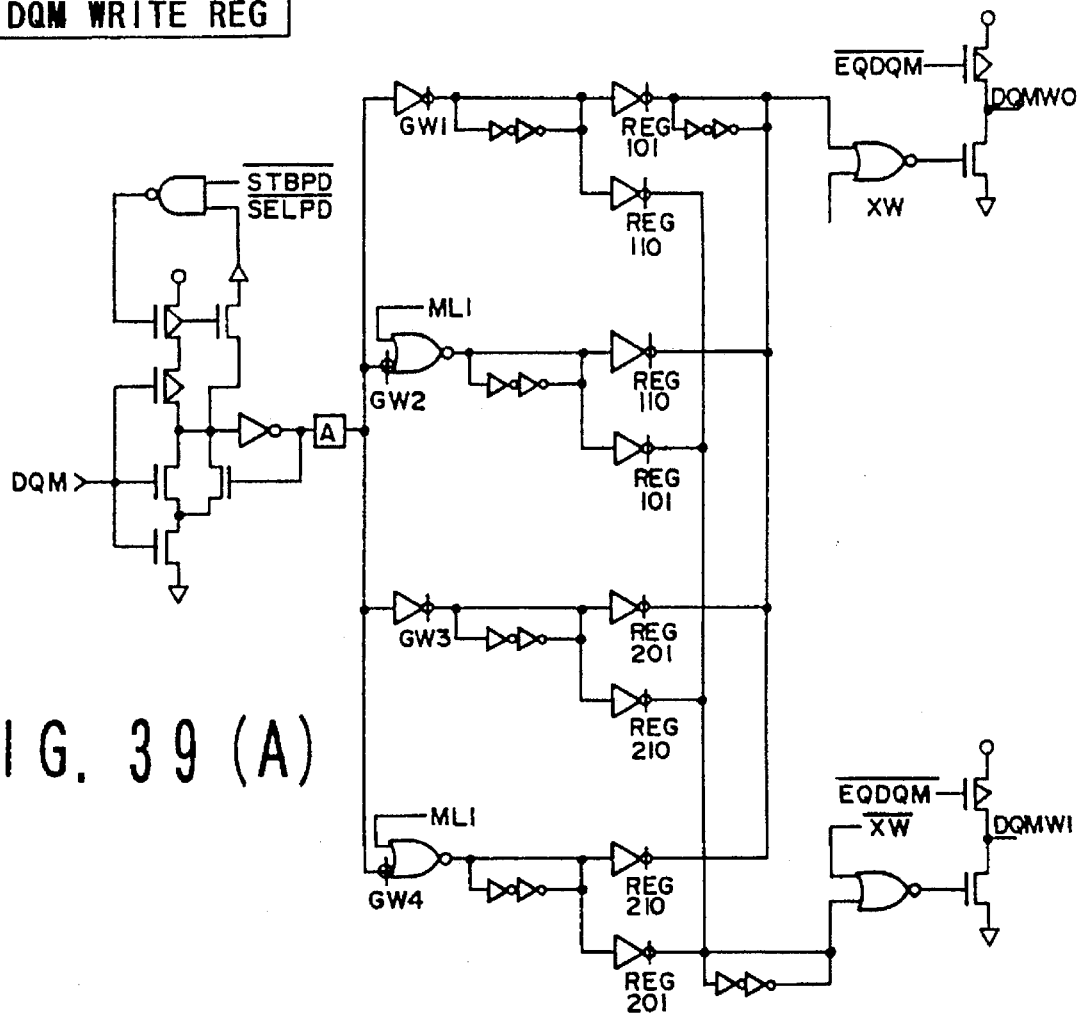
F I G. 39 (A)
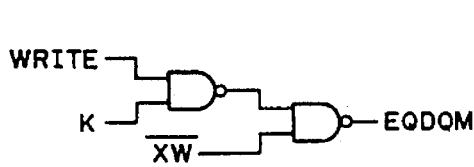
F I G. 39 (B)
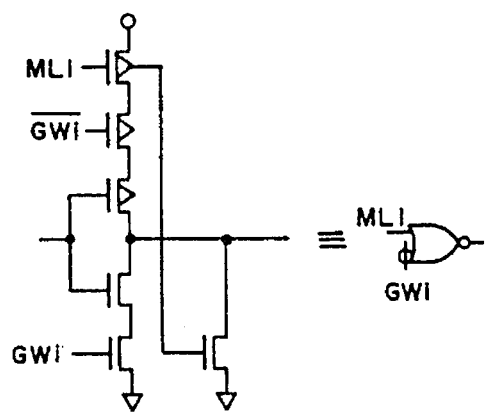
F I G. 39 (C)

DQM OPTION CKT FOR WRITE LATENCY
-[A]-
(OP21) —— (ONLY CONNECT)
(OP22)
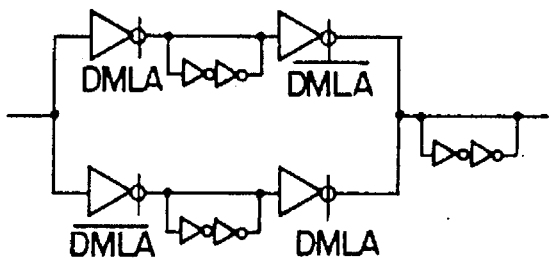
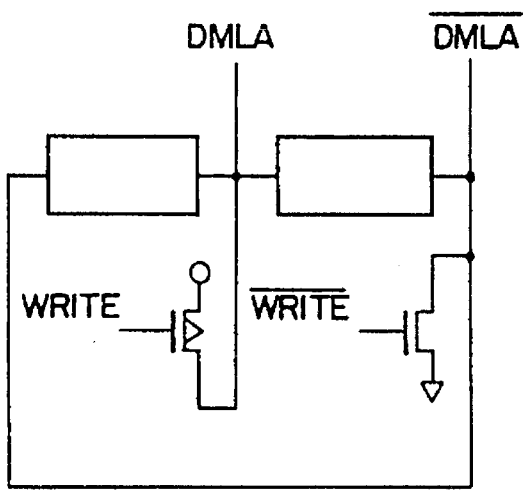
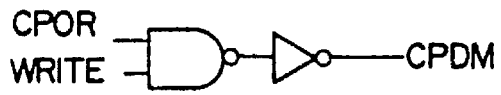
FIG. 40

MODULE LG DET PROC SELECT
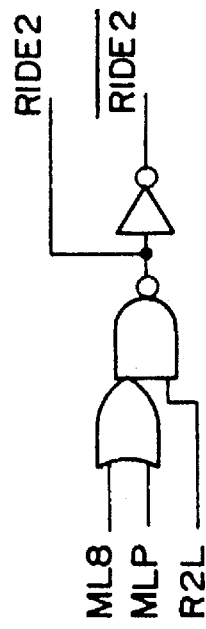
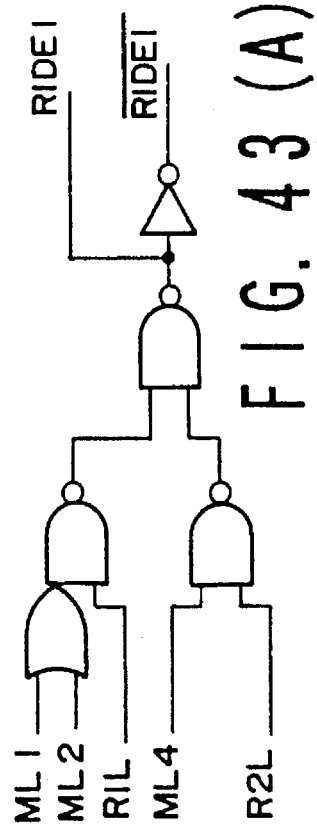
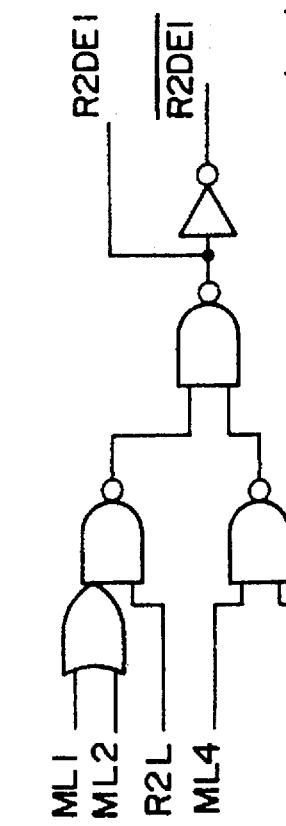
FIG. 43 (A)
FIG. 43 (B)
FIG. 43 (C)
FIG. 43 (D)

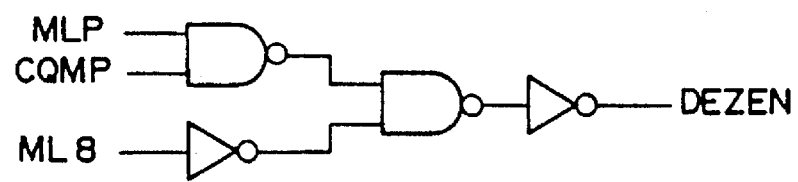
F I G. 44 (A)
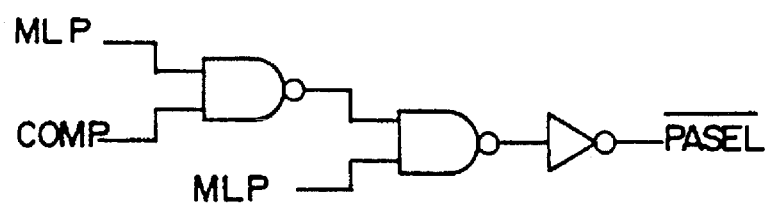
F I G. 44 (B)

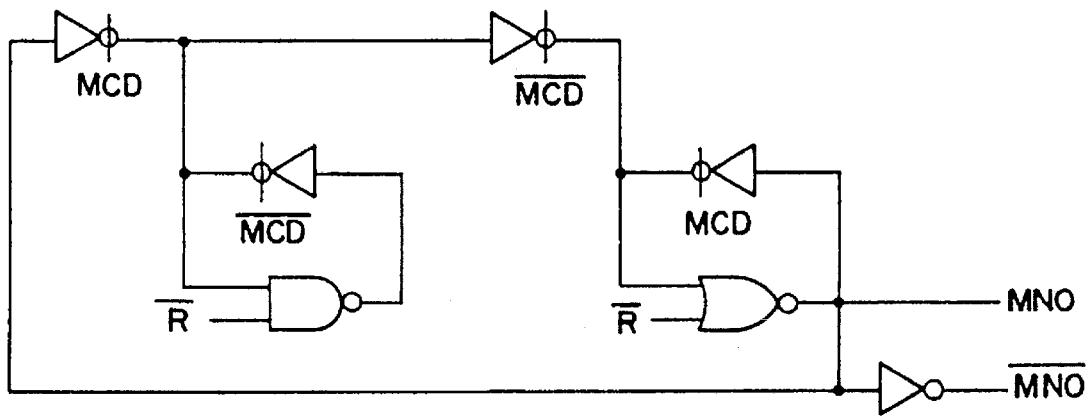
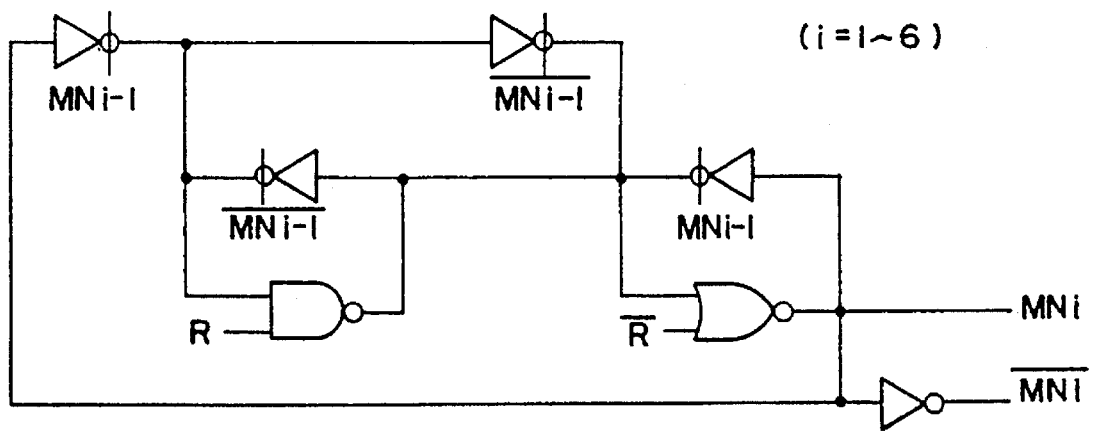
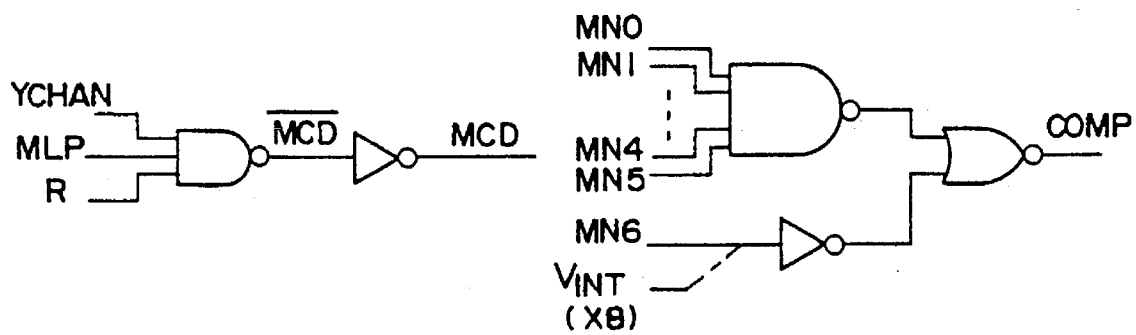
FIG. 49

COL SYS SEL
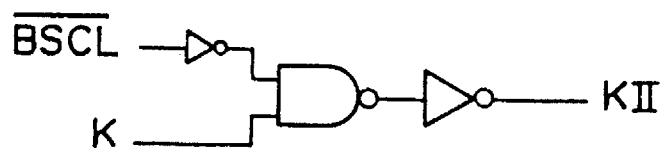
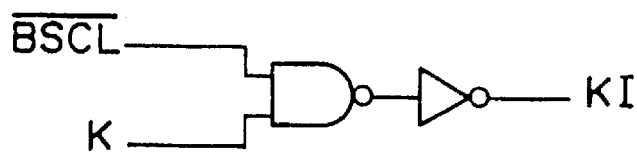
FIG. 52
(WHEN KI/II ARE USED AS OPPOSITE PHASE SIG)
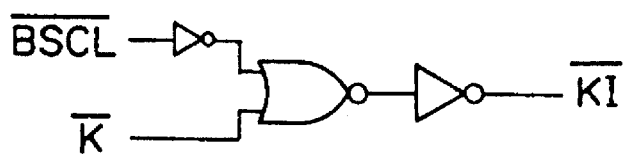
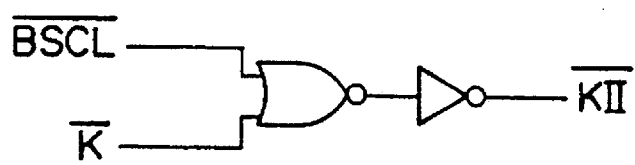
FIG. 53

CSL SELECTOR TAP SEL SIG (BOTH FOR I/II)

ADDRESS CHG BASIC PULSE

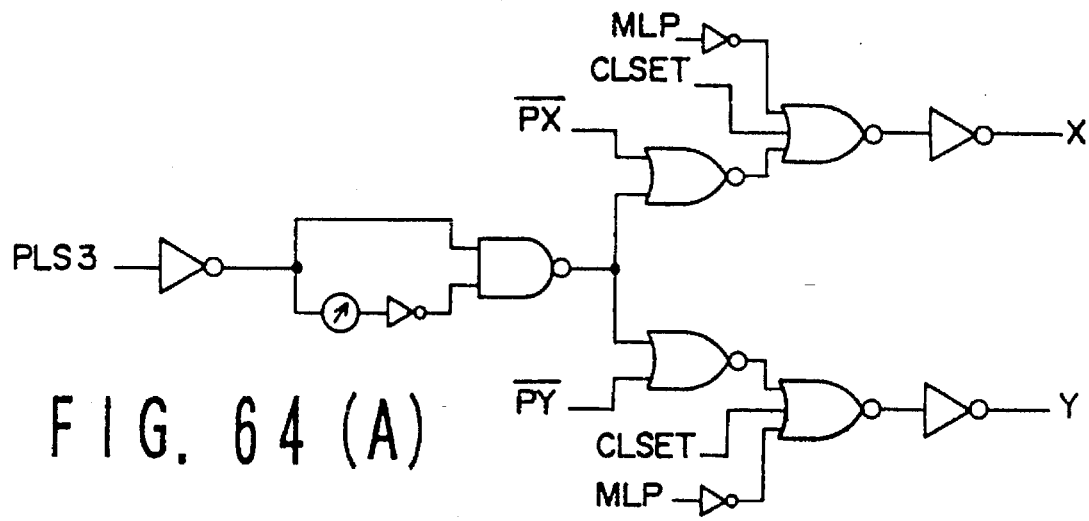
F I G. 64 (A)
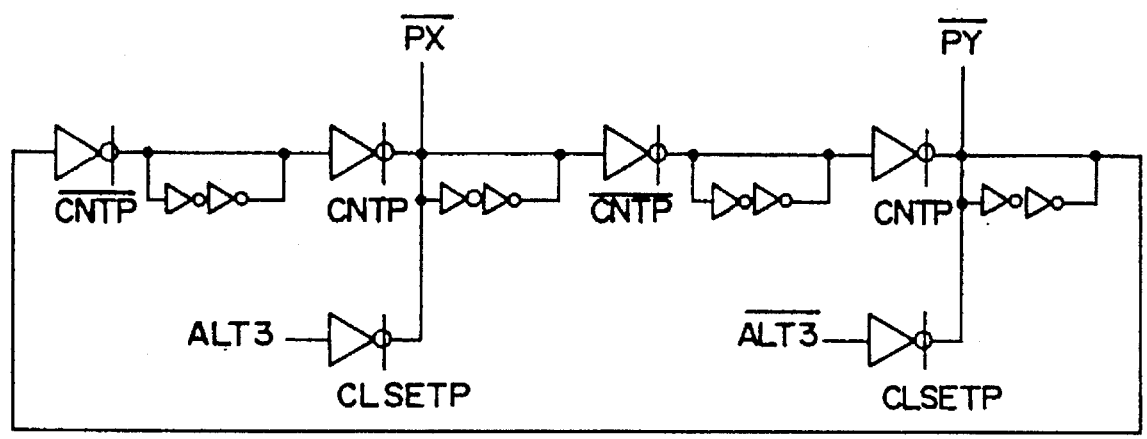
F I G. 64 (B)
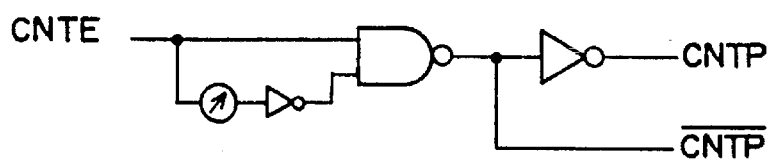
F I G. 64 (C)

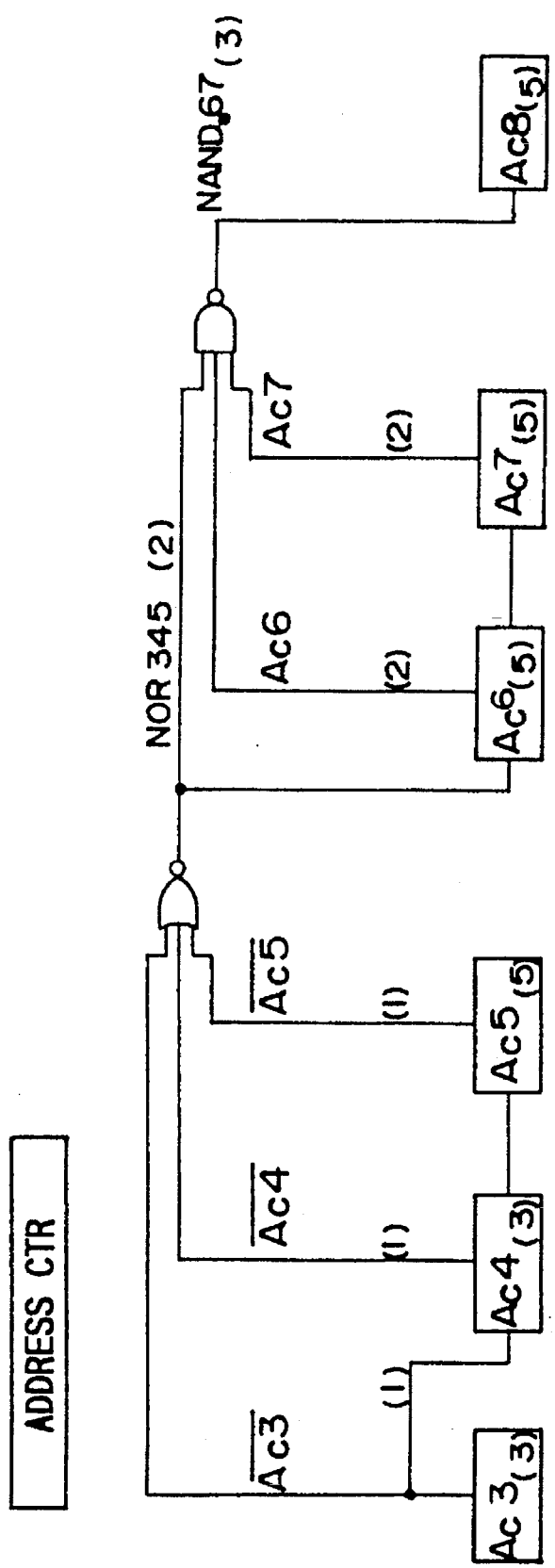
F I G. 66

ADDRESS CTR

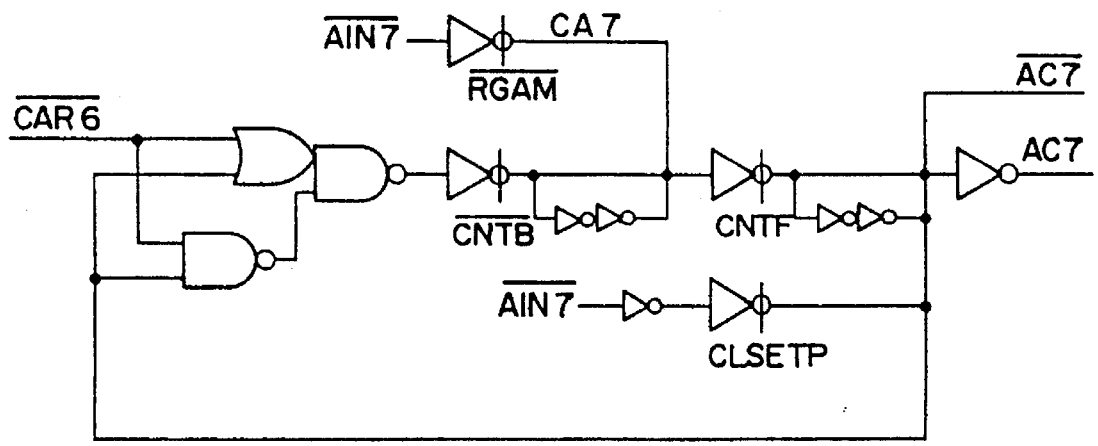
F I G. 71
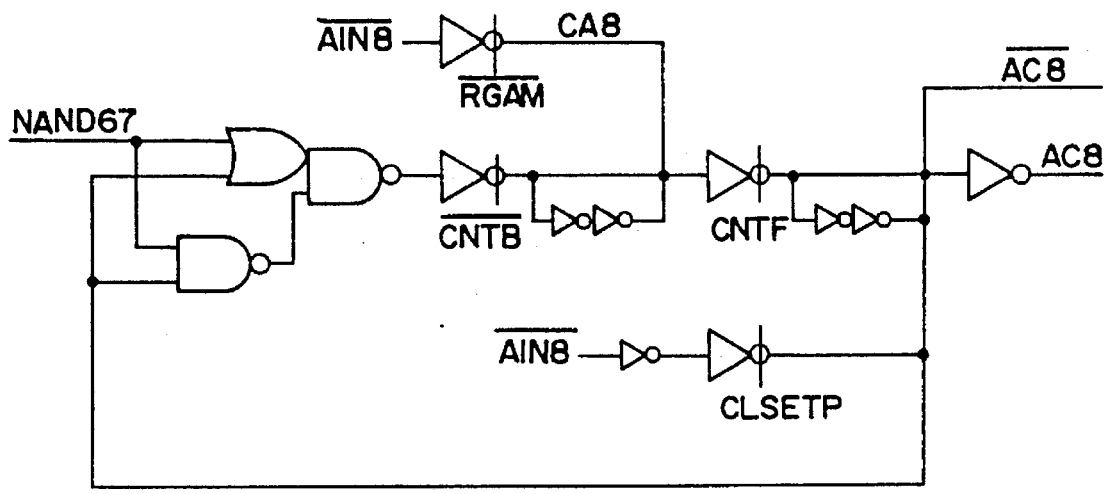
F I G. 72

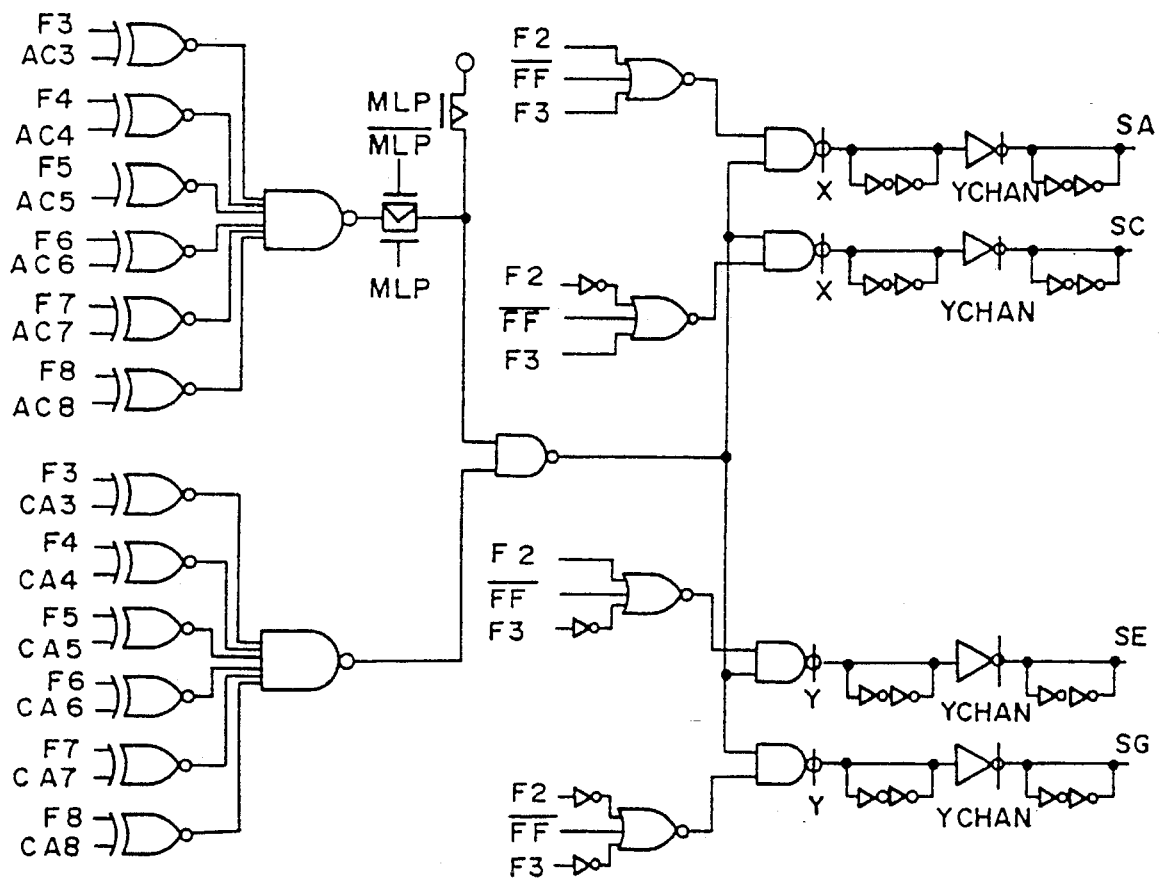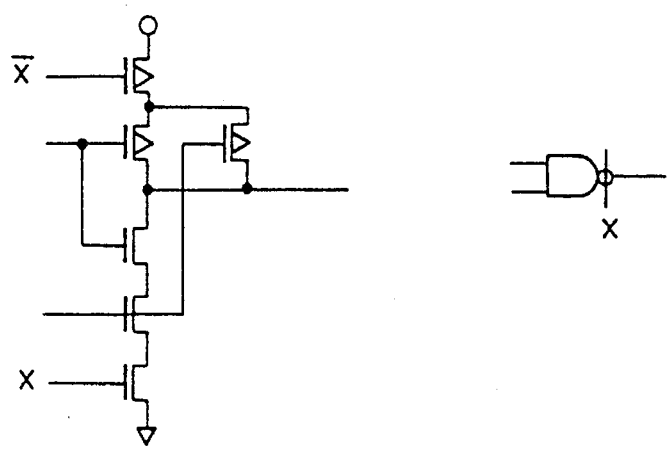
FIG. 75

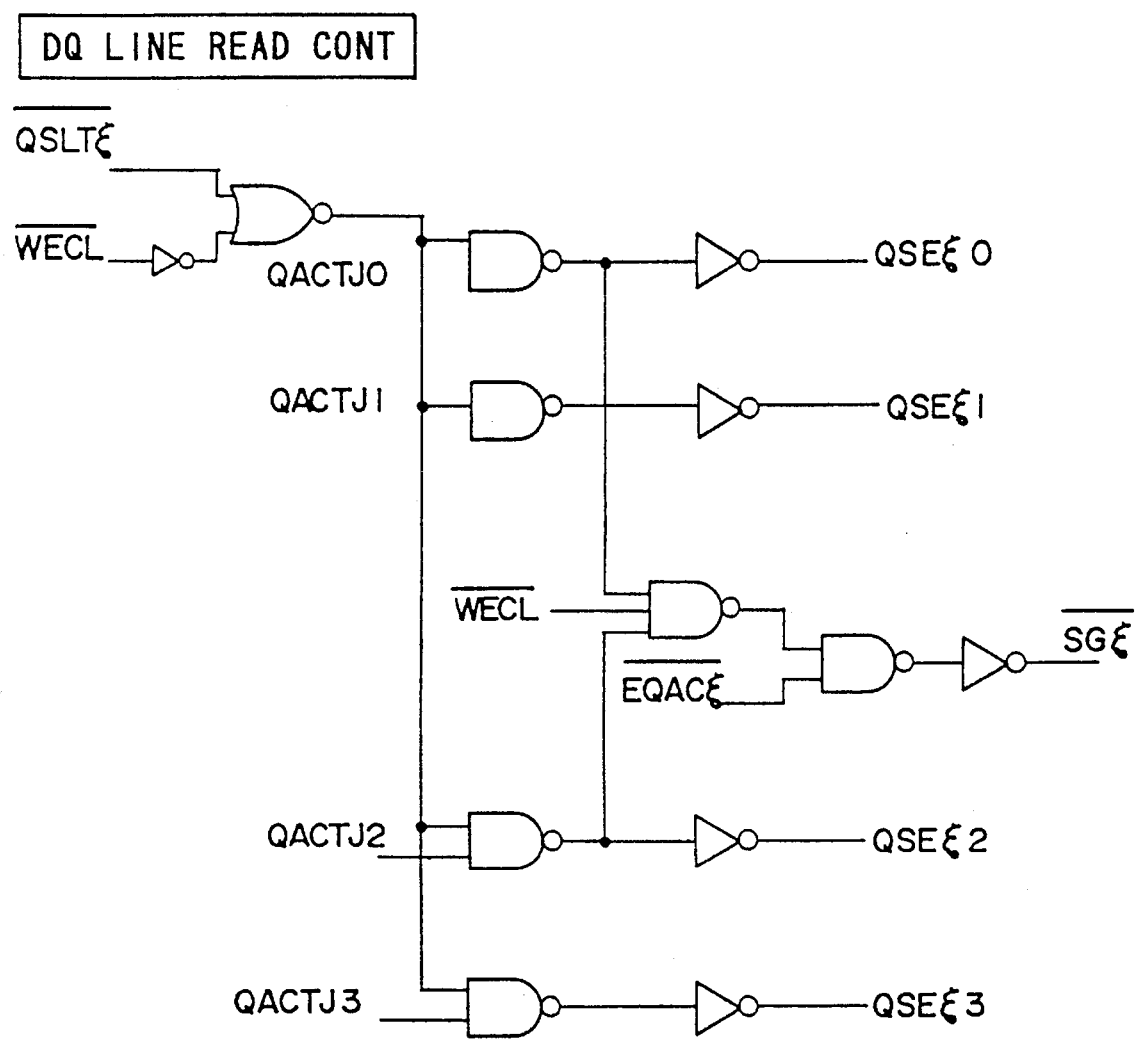
FIG. 85 (A)  (ξ : FOR S/A REGIONS) (BOTH FOR I/II)
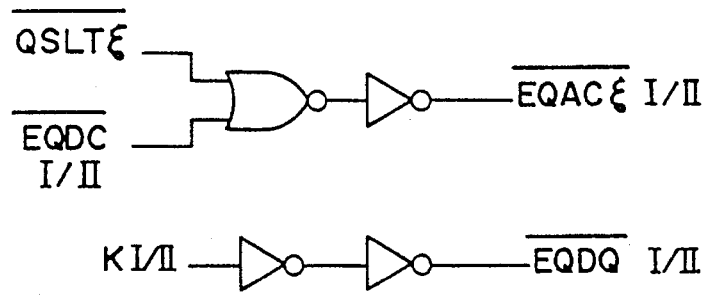
FIG. 85 (B)

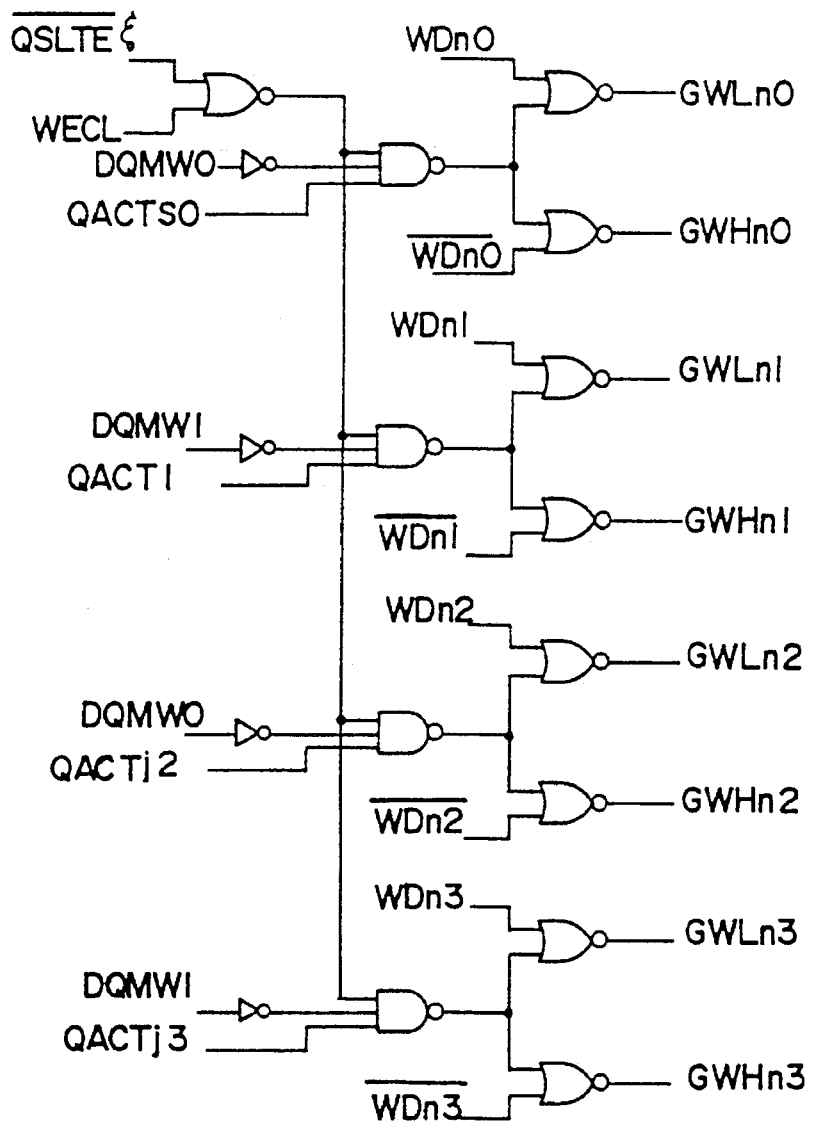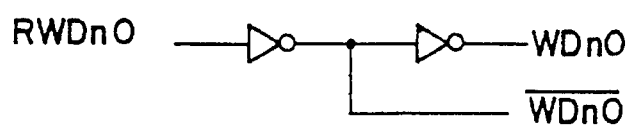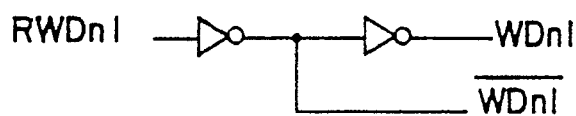
FIG. 86

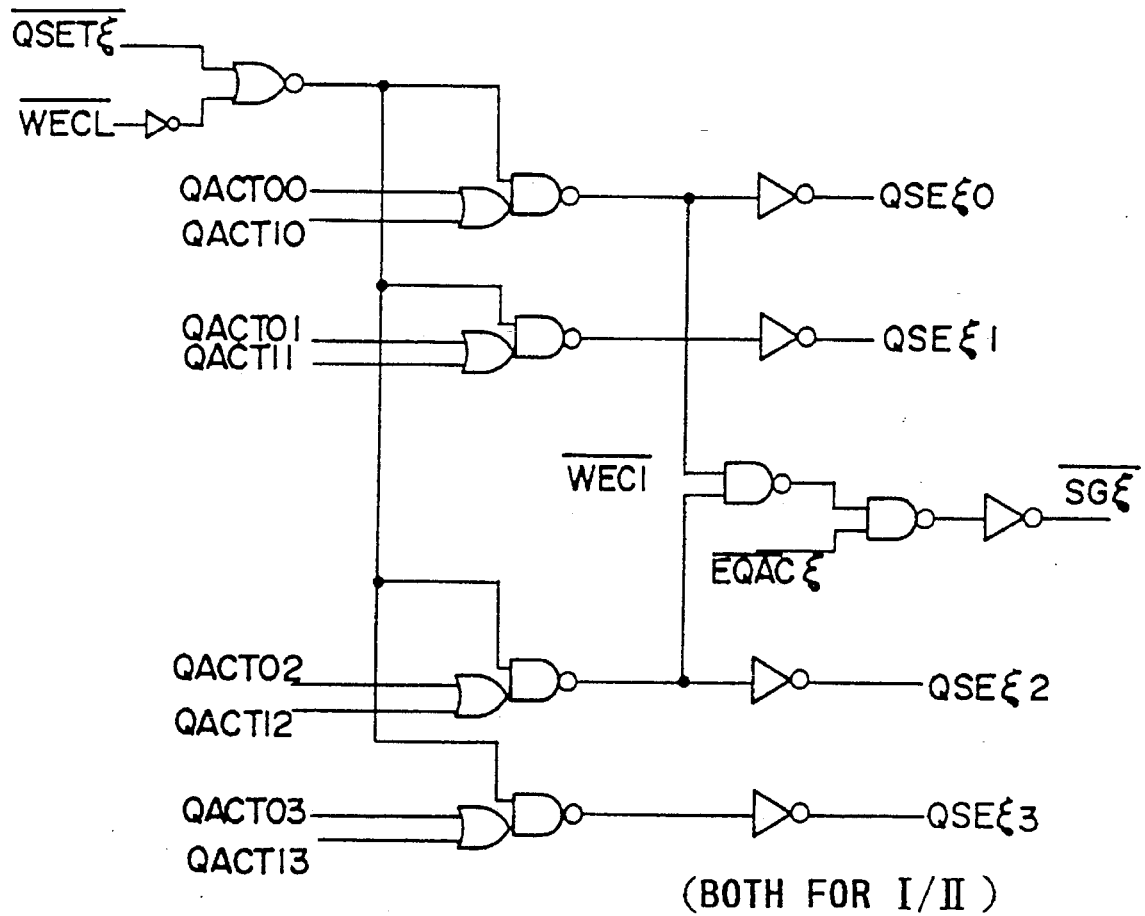
FIG. 87 (A)
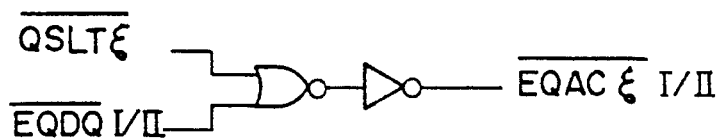
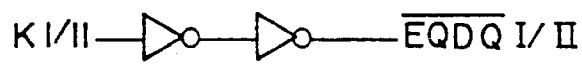
FIG. 87 (B)

SYNCHRONOUS LSI MEMORY DEVICE

FIELD OF THE INVENTION

The present invention relates to a synchronous LSI (large scale integrated circuit) device, and more specifically to a synchronous LSI memory device suitable for use with a high speed CPU.

BACKGROUND OF THE INVENTION

In general, in the case of a DRAM (Dynamic RAM) used as a main memory device of a computer, for instance, various control signals such as RAS (row access) signal, CAS (column access) signal, etc. are required. Conventionally, these control signals have been so far formed by processing a clock signal supplied as a signal for operating to the computer or CPU.

On the other hand, recently, the operating speed of the CPU has been improved to such an extent as to exceed that of the DRAM. Therefore, in a mini-computer or a work station composed of the CPU and the DRAM, the problem caused by the difference in operating speed between the two has been so far solved by use of the main memory constructed in the form of a plurality of banks (blocks) composed of DRAMs or in accordance with interleave operation of the memory. In this method of using the memory, however, the memory control procedure is complicated and thereby the cost of the memory increases inevitably.

On the other hand, another construction such that the memory is controlled internally in accordance with pipeline operation has been proposed. Where the memory is controlled in accordance with the simple pipeline operation, however, since the memory speed is determined by the data read speed from a core section, the pipeline method does not necessarily contribute to an improvement of the operating speed, so that a specific countermeasure must be taken for the memory control system to increase the memory speed to such an extent as to correspond to the CPU speed.

As described above, in the conventional synchronous LSI memory device, when the above-mentioned conventional memory operating methods such as interleave or bank switching, etc. are applied to a relatively small scale system such as a mini-computer or a work station, there exist problems in that the system cost is increased or down sizing is not attained. In addition, when the operating speed of the CPU is increased more and more as beyond 50 or 100 MHz, since the memory hierarchical structure must be constructed more ingeniously so as to use the CPU properly, with the result that the system is further complicated. For the reason as described above, there exists so far a strong need of memory structure and/or the memory control system which can match the operating speed of the CPU with that of the memory device.

SUMMARY OF THE INVENTION

With these problems in mind therefore, it is the object of the present invention to provide a synchronous LSI memory device which can correspond to a high speed CPU system, without complicating the system.

To achieve the above-mentioned object, the present invention provides a synchronous LSI memory device, comprising: memory cell array means (BK1, BK2) each having a plurality of memory cells; timing generating means (CLOCK MASKED SECT) for generating a first basic signal (CPOR) synchronous with a clock signal (CLK) and masked according to status of a control signal (CKE); signal generating means (SERIAL SYS CONTROL) for generating a second signal (CP) in synchronism with the first basic signal (CPOR) and stopping generating the second signal after a predetermined number of accesses OF in response to a stop signal (MRRST, MWSTP, LADA, BSTP); and control means (SHIFT REGISTER) for controlling said cell array means (BK1, BK2) on the basis of outputs of said timing signal generating means and said signal generating means.

Further, the present invention provides a synchronous LSI memory device, comprising: cell block means (CB) each having a plurality of memory cells; and data register means (WRITE REGISTER) for acquiring externally input data applied to first terminals (DQ) in synchronism with a clock signal (CLK), said data register means being provided with inputting registers (WRITE REGISTER) having a plurality of bits and connected to the respective first terminals; and when data are inputted, the inputting registers being controlled so that the respective plural bits are switched in sequence or not controlled so that the respective plural bits are set alternately to data input status.

Further, the present invention provides a synchronous LSI memory device, comprising: memory cell array means (BK1, BK2) each having a plurality of memory cells; timing generating means (TG) for generating a first basic signal (CPOR) synchronous with a clock signal (CLK) and masked according to status of a control signal (CKE); signal generating means (SERIAL SYS CONTROL) for generating a second signal (CP) in synchronism with the first basic signal (CPOR) and stopping generating the second signal (CP) after a predetermined number of accesses or in response to a stop signal (MRRST, MWSTP LADA, BSTP); control means for controlling said cell array means (BK1, BK2) on the basis of outputs of said timing signal generating means and said signal generating means (SERIAL SYS CONTROL); and mask control means (DQMR) for acquiring statuses of second terminals (DQM) in sequence into register means having the number of bits even-number times larger than that obtained during a cycle interval during which a column address is inputted, outputting the acquired data in sequence, inputting the outputted data, respectively to specific registers each having the number of bits even-number times larger than that obtained during the cycle interval during which the column address is inputted, and when data inputted through the second terminals (DQM) are in a first status, outputting signals for setting output circuits of the register means to a high impedance status in synchronism with the second signal (CP).

In the synchronous LSI memory device according to the present invention, when a plurality of the cell array means (each having a plurality of memory cells) for a plurality of banks are accessed, the timing generating means generates the basic signal, and the signal generating means generates the second signals on the basis of the basic signal. The cell array means are controlled by the control means on the basis of the second signals.

Further, when data are inputted to a plurality of the cell array means (each having a plurality of memory cells) for a plurality of banks, the data register means acquire externally inputted data through the input register means connected to the DQ terminals of the data register means in synchronism with the clock signal CLK. In this case, the register means are so controlled as to input the external inputted data in sequence and further a plurality of bits of the register means are set alternately to the data input enable status when the data input sequence is not changed.

Further, when a plurality of the cell array means (each having a plurality of memory cells) for a plurality of banks are accessed, the statuses of the DQM terminals of the register means having the number of bits half of that of a word length are acquired in sequence, and the acquired data are outputted in sequence. The outputted data are inputted to the registers whose number of bits is half of that of a specific word, respectively. Further, when the data inputted through the DQM terminals are in the first status, the impedance control means outputs a signal for setting the output circuits of the register means to a high impedance status, on the basis of the basic signal outputted by the timing generating means and in synchronism with the second signals outputted by the signal generating means.

Accordingly, in the synchronous LSI memory device according to the present invention, it is possible to operate the memory device whose access speed is lower than the CPU on the basis of a single high speed clock signal suitable for the CPU, so that the it is possible to simplify the clock control so as to be correspond to the higher speed CPU without complicating the system configuration.

BRIEF DESCRIPTION OF THE DRAWINGS

FIG. 4 is a circuit diagram showing another example of a configuration of the serial-system control section;

FIG. 13 is a circuit diagram showing a tap address mode acquisition control circuit;

FIGS. 23(A) and 23(B) are a circuit diagram showing a read data transferring circuit;

FIGS. 30(A) to 30(D) are a circuit diagrams showing an address buffer circuit;

FIG. 33 is a circuit diagram showing a read operation enabling circuit;

FIG. 34 is a circuit diagram showing a DQMR gating circuit;

FIG. 35 is a circuit diagram showing a high impedance control circuit;

FIGS. 39(A) to 39(C) are a circuit diagram showing a DQM write register circuit;

FIG. 40 is a circuit diagram showing a DQM option circuit corresponding to the write latency;

FIGS. 43(A) to 43(D) are a circuit diagram showing a partial configuration for a module-length detection procedure selecting circuit;

FIGS. 44(A) and 44(B) are a circuit diagram showing another partial configuration for the module-length detection procedure selecting circuit;

FIG. 49 is a circuit diagram showing a module-number counting circuit;

FIG. 52 is a circuit diagram showing a column-system selecting circuit;

FIG. 53 is a circuit diagram showing the column-system selecting circuit required when KI and KII signals are used as opposite phase signals /KI and /KII;

FIGS. 64(A) to 64(C) are a circuit diagram showing a spare select signal generating circuit;

FIG. 66 is a circuit diagram showing a first part of an address counter circuit;

FIG. 71 is a circuit diagram showing a sixth part of the address counter circuit;

FIG. 72 is a circuit diagram showing a seventh part of the address counter circuit;

FIG. 75 is a circuit diagram showing an (A1c="0")-side S/N discriminating circuit;

FIGS. 85(A) and 85(B) are a circuit diagram showing a DQ line read control circuit;

FIG. 86 is a circuit diagram showing a DQ line write control circuit;

FIGS. 87(A) and 87(B) are a circuit diagram showing a DQ line read control circuit in an A9c and /A9c coexistent section;

DETAILED DESCRIPTION OF THE PREFERRED EMBODIMENTS

The embodiment of the synchronous LSI memory device according to the present invention will be described hereinbelow with reference to the attached drawings.

Here, the terminology "latency" used in the specification and the drawings implies the number of clocks between when a command is inputted and when data are transferred in a synchronous device, which is widely employed in the field of the synchronous device.

Prior to the detailed description, the present invention will be summarized as follows: the synchronous LSI memory device of the present invention comprises: memory cell array means (BK1, BK2) each having a plurality of memory cells; timing generating means (CLOCK MASKED SECT) for generating a first basic signal (CPOR) synchronous with a clock signal (CLK) and masked according to status of a control signal (CKE); signal generating means (SERIAL SYS CONTROL) for generating a second signal (CP) in synchronism with the first basic signal (CPOR) and stopping generating the second signal after a predetermined number of accesses or in response to a stop signal (MRRST, MWSTP, LADA, BSTP); and control means (SHIFT REGISTER) for controlling said cell array means (BK1, BK2) on the basis of outputs of said timing signal generating means and said signal generating means (FIG. 4).

Further, the synchronous LSI memory device further comprises first means (SHIFT REGISTER) operative in response to the second signal (CP) to control access to said memory cell array means (BK1, BK2). The first means (SHIFT REGISTER) has the number of bits even-number times larger than that obtained during a cycle interval during which a column address is inputted, for activating column systems (COL SYS) of said memory cell array means (BK1, BK2) on the basis of specific output signals (K) of said first means (SHIFT REGISTER). Alternately, the first means (SHIFT REGISTER) comprises two-set independent shift registers (SHIFT 1, 2). Alternately, the first means (SHIFT REGISTER) changes an initial condition according to read latency.

Figure 61:
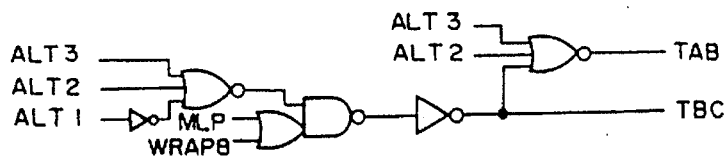
FIGS. 61(A) to 61(E) are a circuit diagram showing a CLS select tap selection signal generating circuit.
Figure 61:
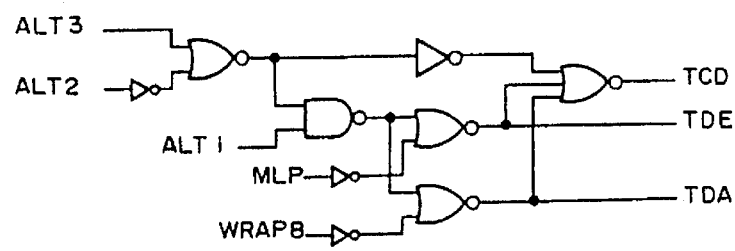
Figure 61:
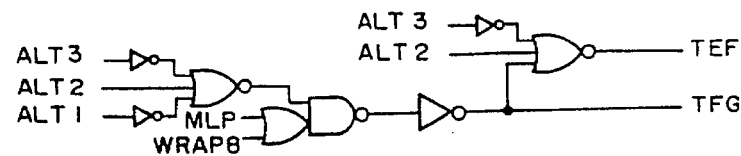
Figure 61:
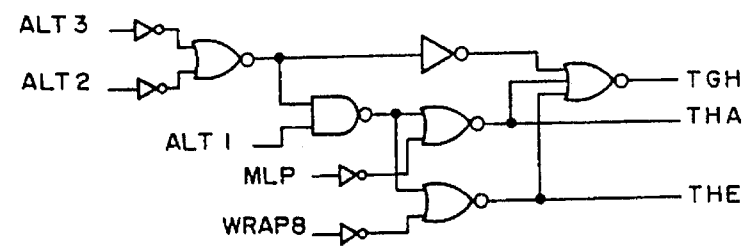
Figure 61:
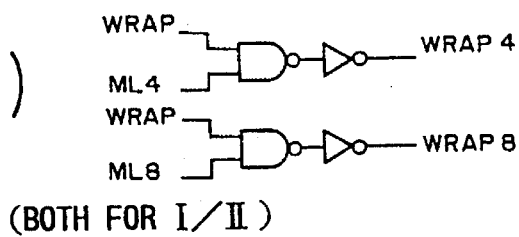

Further, the synchronous LSI memory device of the present invention comprises: cell block means (CB) each having a plurality of memory cells; and data register means (WRITE REGISTER) for acquiring externally input data applied to first terminals (DQ) in synchronism with a clock signal (CLK), said data register means being provided with inputting registers (WRITE REGISTER) having a plurality of bits and connected to the respective first terminals; and when data are inputted, the inputting registers being controlled so that the respective plural bits are switched in sequence or not controlled so that the respective plural bits are set alternately to data input status (FIG. 61).

Further, a synchronous LSI memory device of the present invention comprises: memory cell array means (BK1, BK2) each having a plurality of memory cells; timing generating means (TG) for generating a first basic signal (CPOR) synchronous with a clock signal (CLK) and masked according to status of a control signal (CKE); signal generating means (SERIAL SYS CONTROL) for generating a second signal (CP) in synchronism with the first basic signal (CPOR) and stopping generating the second signal (CP) after a predetermined number of accesses or in response to a stop signal (MRRST, MWSTP LADA, BSTP); control means for controlling said cell array means (BK1, BK2) on the basis of outputs of said timing signal generating means and said signal generating means (SERIAL SYS CONTROL); and mask control means (DQMR) for acquiring statuses of second terminals (DQM) in sequence into register means having the number of bits even-number times larger than that obtained during a cycle interval during which a column address is inputted, outputting the acquired data in sequence, inputting the outputted data, respectively to specific registers each having the number of bits even-number times larger than that obtained during the cycle interval during which the column address is inputted, and when data inputted through the second terminals (DQM) are in a first status, outputting signals for setting output circuits of the register means to a high impedance status in synchronism with the second signal (CP).

Further, the synchronous LSI memory device further comprises: data holding means (DQM WRITE REGISTER) for, in only write mode, acquiring the statuses of the second terminals (DQM) in synchronism with the second signal into registers having a plurality of bits in sequence and scrambling the acquired data on first data lines (DQMW) plural bits by plural bits every plural cycles; and precharge means (EQDQM) for precharging the first data lines into write disable status every predetermined cycle interval.

Here, when the predetermined access length is "1", even-number registers of said data holding means (DQM WRITE REGISTER) are fixed to status the same as when masked data are acquired.

Figure 37:
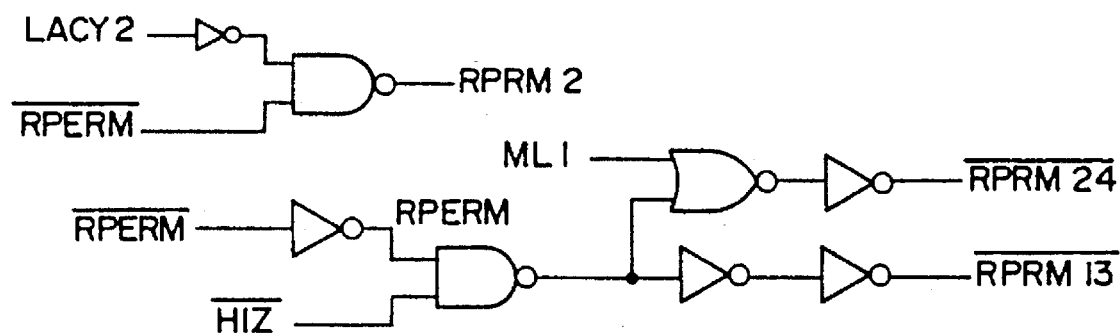
FIG. 37 is a circuit diagram showing a RPRM generating circuit.

Further, the synchronous LSI memory device of the present invention further comprises: read mask registers (DQM READ REGISTER) for acquiring, in read mode, the statuses of the second terminals (DQM) into a plurality of registers in sequence in synchronism with the second signal, and outputting the acquired data to the data lines (DQMR) in sequence; and potential fixing means (/RPRM13, /RPRM24, HIZ) for fixing, in write mode, potentials of the data lines (DQMR) to set the output circuits connected to the data lines (DQMR) to a high impedance status (FIGS. 35 and 37).

Further, when the predetermined access length is "1", even-number registers of said read mask registers having a bit number length half of a word length are fixed to a mask data output status. The stop signal (CLADA) is outputted subsequent to a predetermined number of accesses after all banks (BK1, BK2) have been precharged. Further, when the write latency is "1", the stop signal (WRLA) is outputted in a first cycle immediately after write disable mode has been changed to write enable mode.

Figure 3:
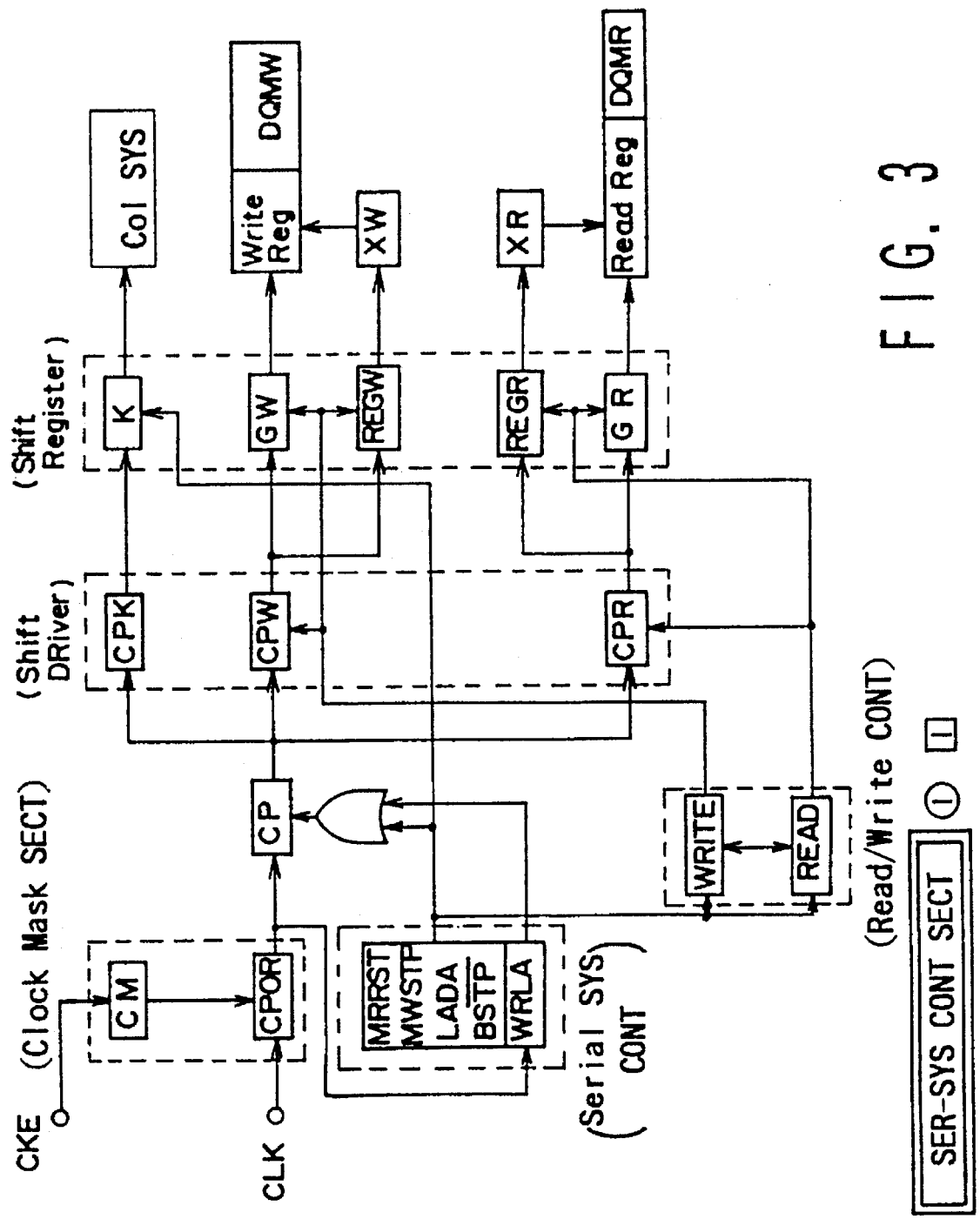
FIG. 3 is a circuit diagram showing an example of a configuration of a serial-system control section.
Figure 17:
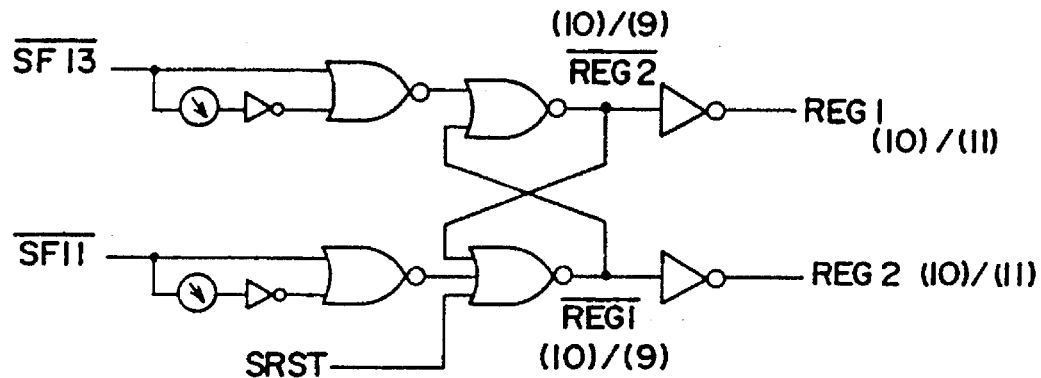
FIG. 17 is a circuit diagram showing a register group selecting circuit.
Figure 78:
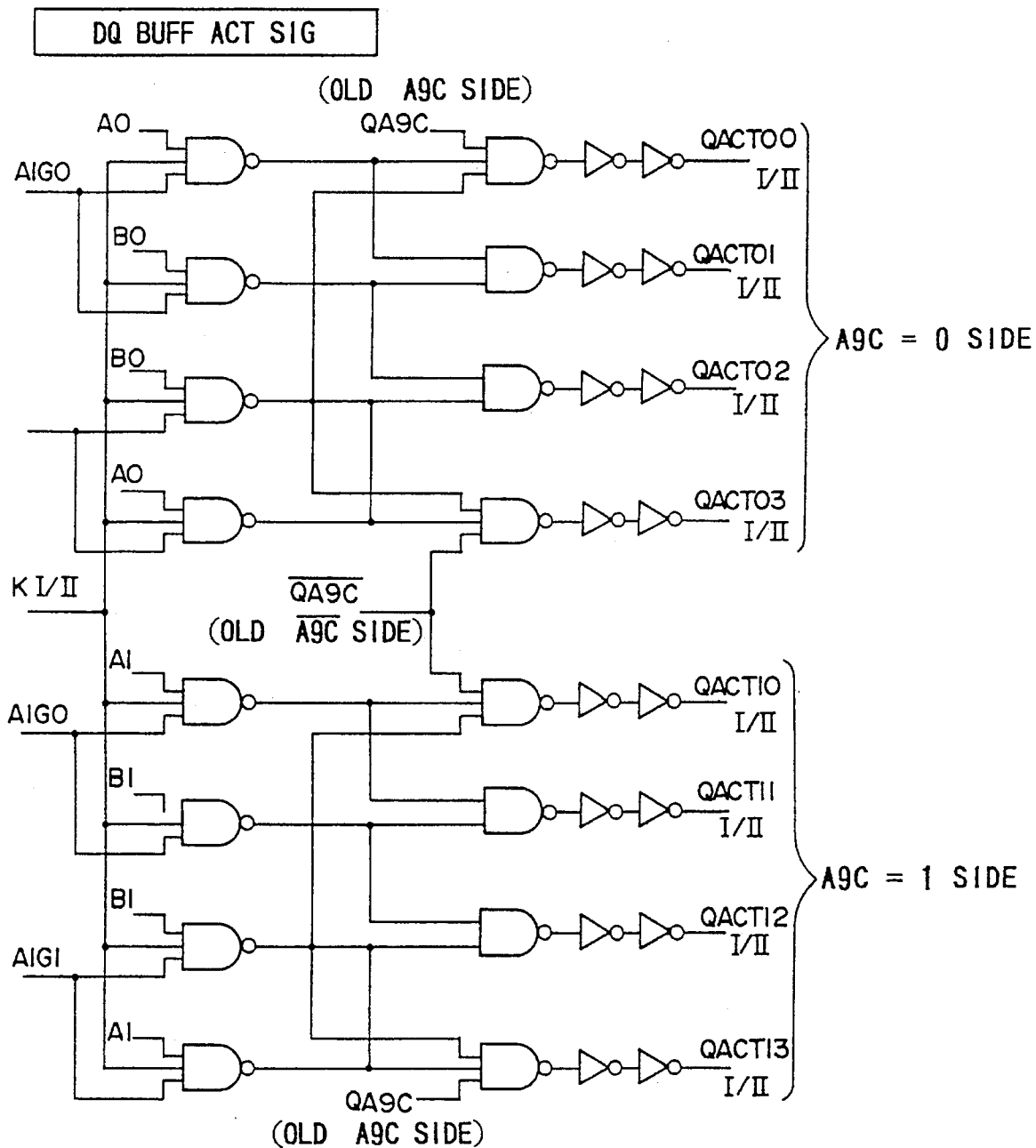
FIG. 78 is a circuit diagram showing a DQ buffer activation signal detecting circuit.

The number of predetermined accesses is counted on the basis of a signal (REG1, REG2) for selecting bits n-bits by n-bits by interleaving an m(=n+n)-bit register having two sets of n-bit registers (FIG. 17). Further, when a plurality of said cell block (CB) are accessed in series, a plurality of serially accessed cell blocks can be accessed simultaneously (FIG. 78). Further, when a plurality of said cell array means are accessed simultaneously, data buffers whose number is a half of that required when a single cell array is accessed are activated in the respective cell arrays means. Further, the second signal (CP) is divided into a plurality of signals (CPK, CPW, CPR) according to use so as to be controlled individually (FIG. 3).

Figure 1:
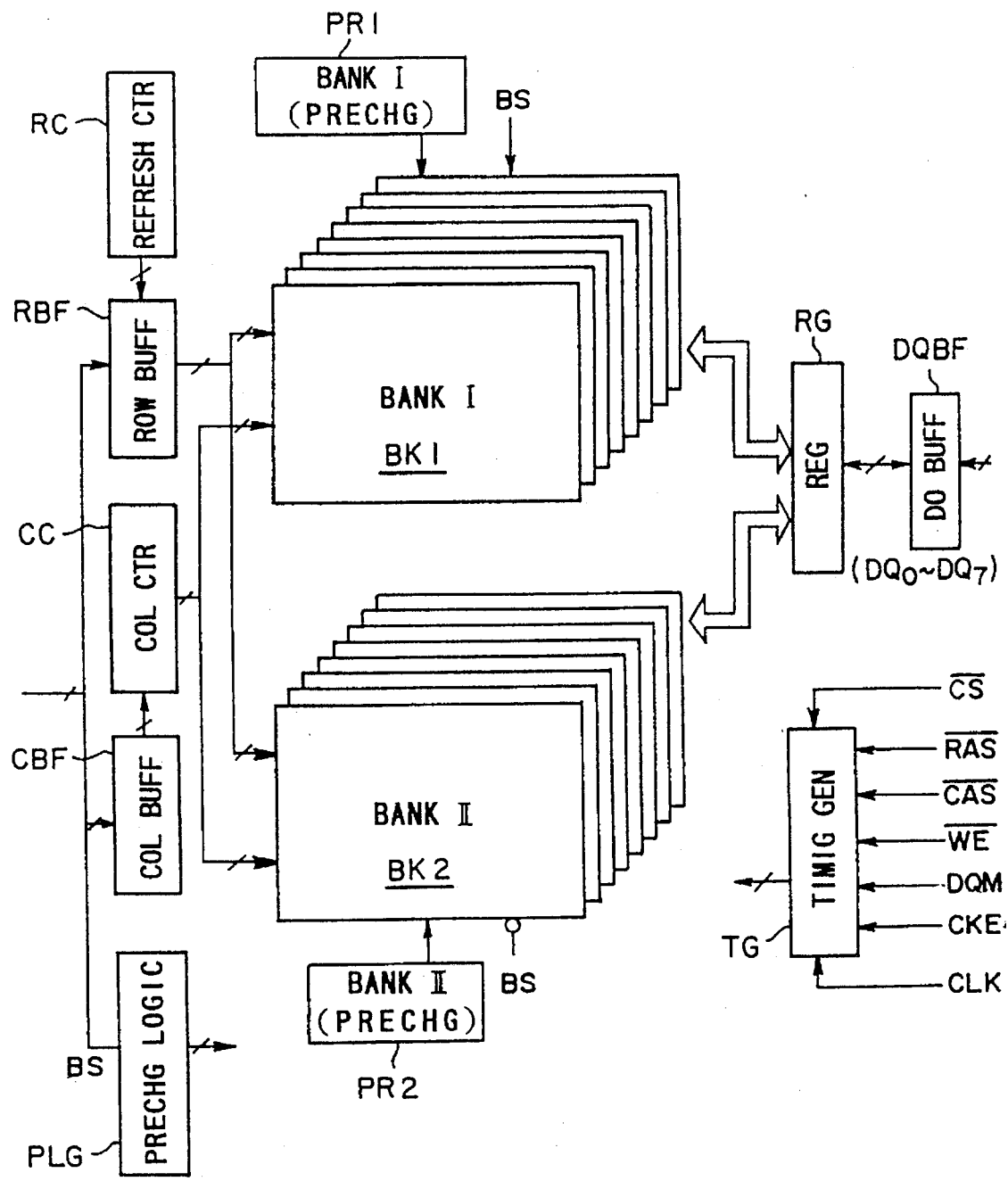
FIG. 1 is a block diagram showing one embodiment of the memory device according to the present invention.

FIG. 1 is a block diagram showing one embodiment of the synchronous LSI memory device, in particular which shows a configuration of a 2MX8 synchronous DRAM. In FIG. 1, a cell array is divided into a bank (I) BK1 and a bank (II) BK2, both of which are connected to a DQ buffer DQBF via a register RG. On the other hand, various signals such as /CS, /RAS, /CAS, /WE, DQM, CKE, CLK, etc. are inputted to a timing generator TG. For address control, a refresh counter RC, a row buffer RBF, a column counter CC, a precharge logic PLG, etc. are arranged. The banks BK1 and BK2 are selected by a bank select signal BS. The banks BK1 and BK2 are precharged by a bank I precharge PR1 and a bank II precharge PR2, respectively.

Figure 88:
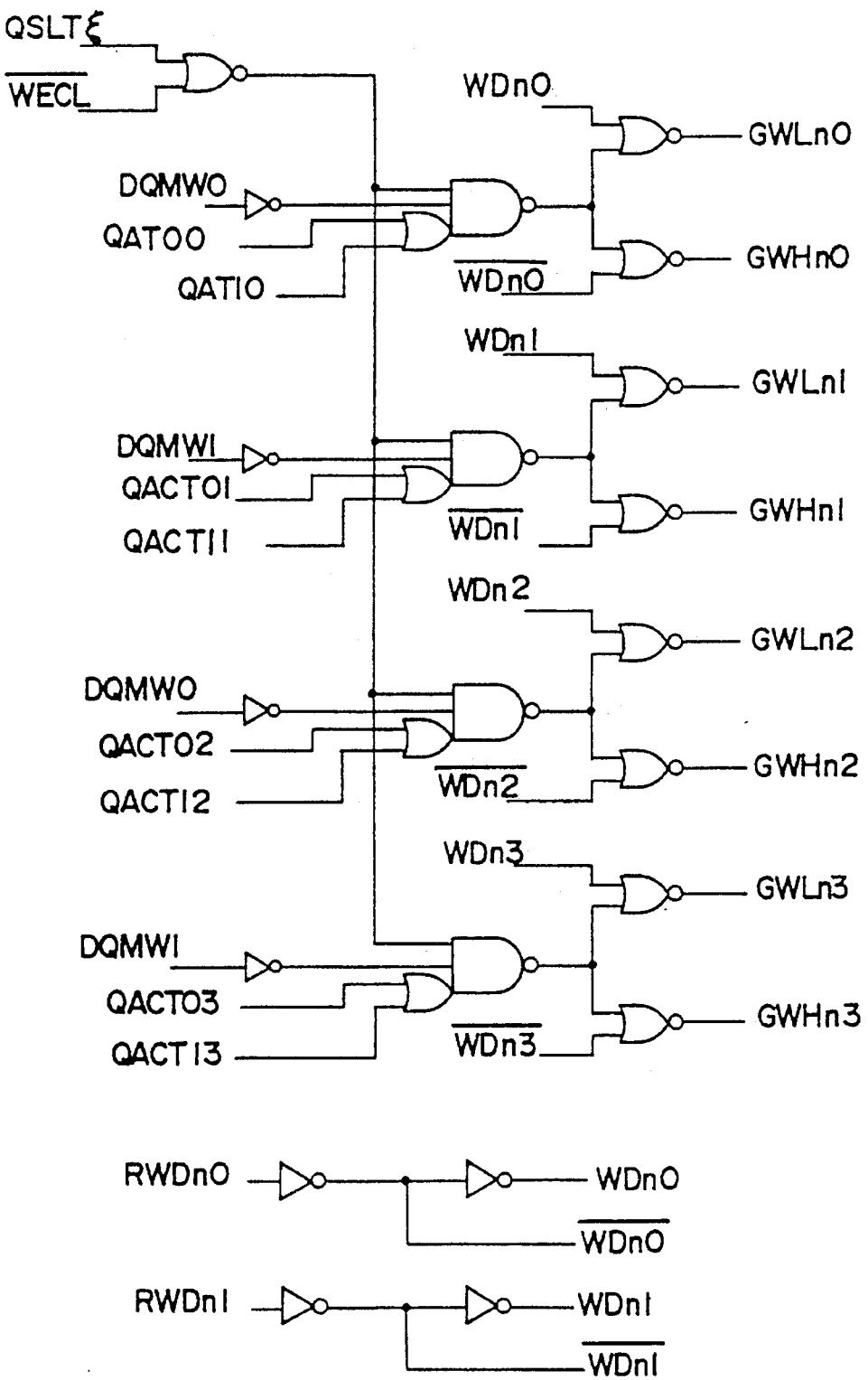
FIG. 88 is a circuit diagram showing the DQ write control section configuration of the memory device shown in FIG. 1.

FIG. 88 shows the configuration of a DQ write control section used with the memory device shown in FIG. 1. In FIG. 88, a coexistent section of an address A9c and an address /A9c (an inverse signal of A9c) is shown.

Figure 89:
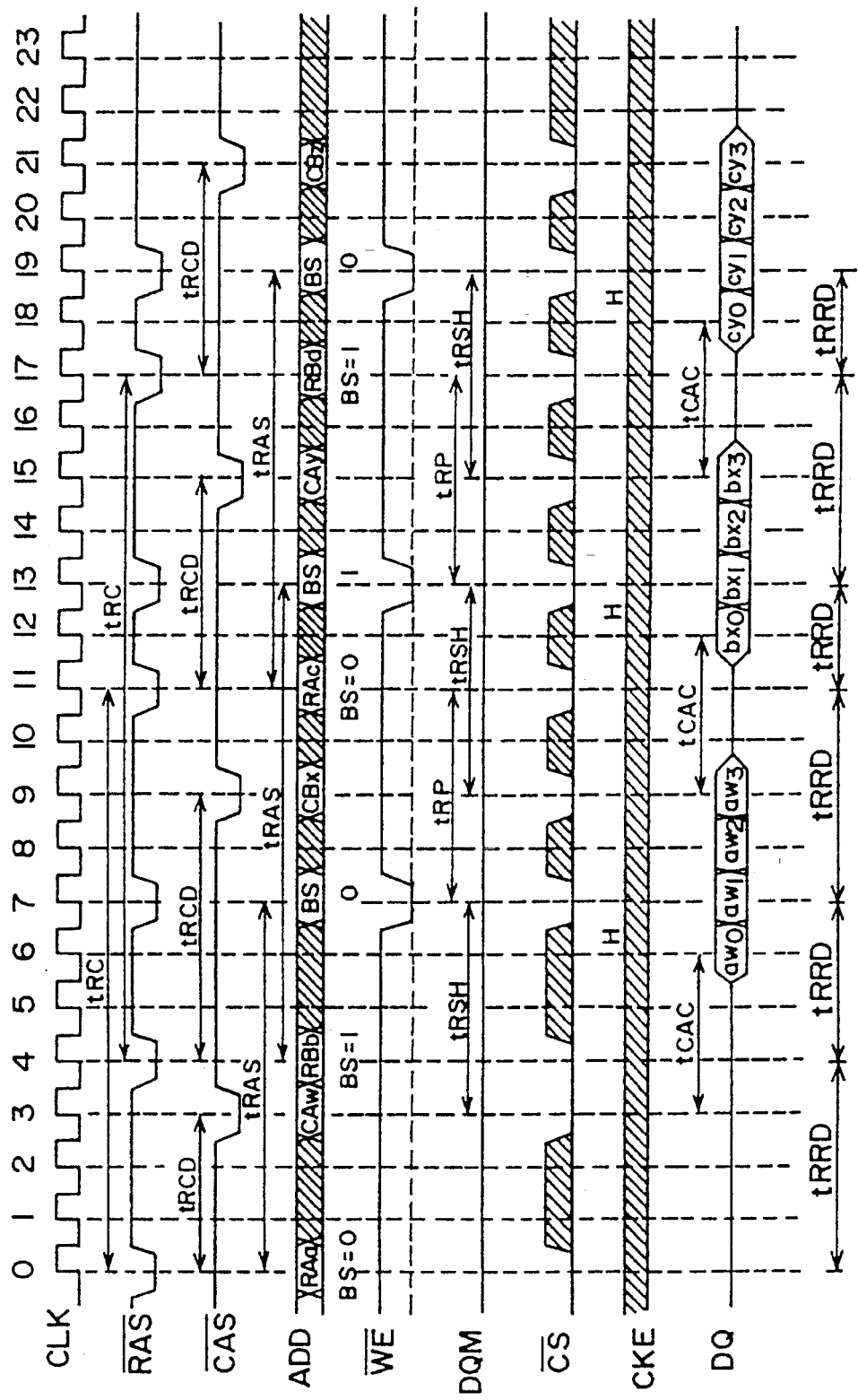
FIG. 89 is a timing chart showing the interleave bank read status in 4-wrap mode.
Figure 90:
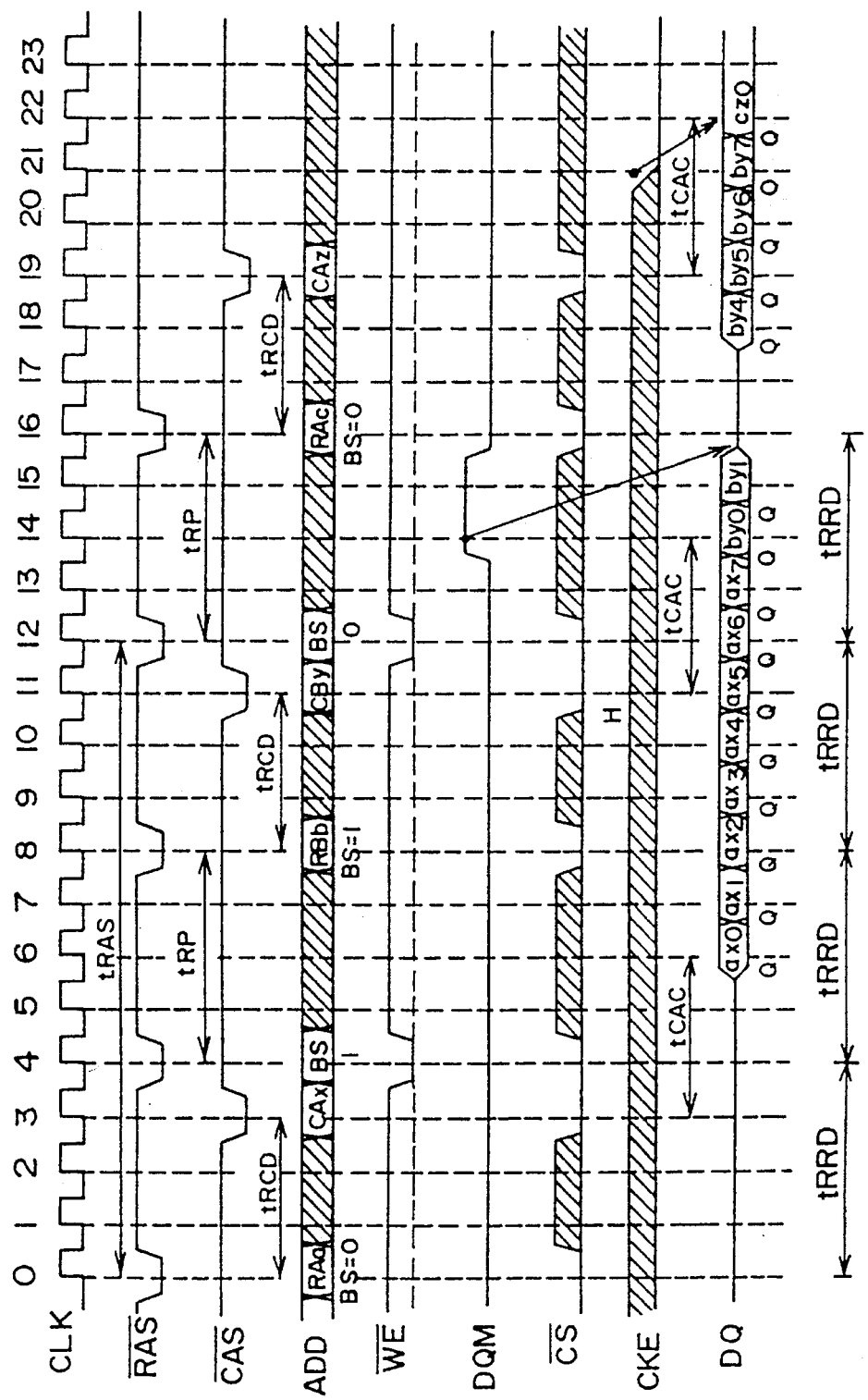
FIG. 90 is a timing chart showing the interleave bank read status in 8-wrap mode.
Figure 91:
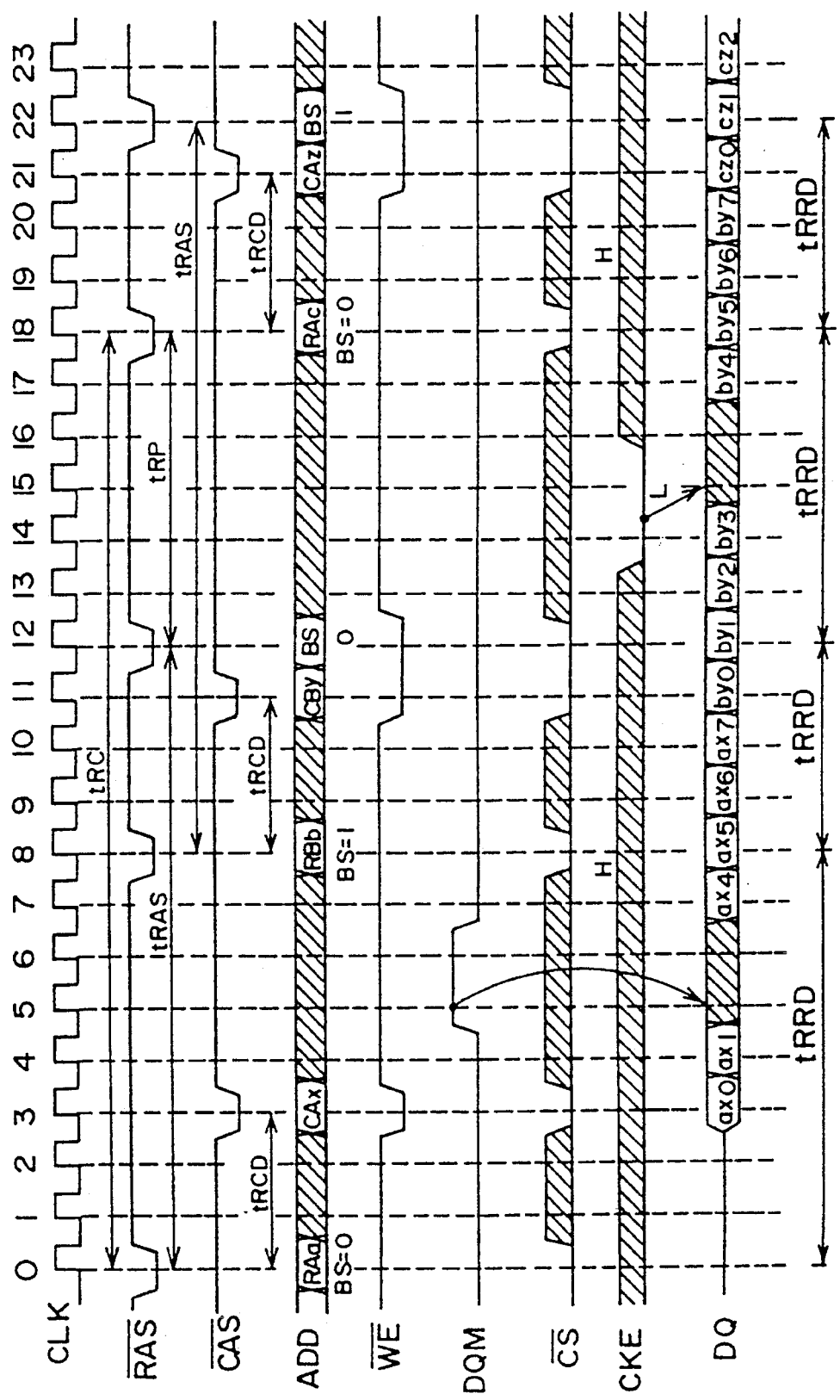
FIG. 91 is a timing chart showing the interleave bank write status in 8-wrap mode.
Figure 92:
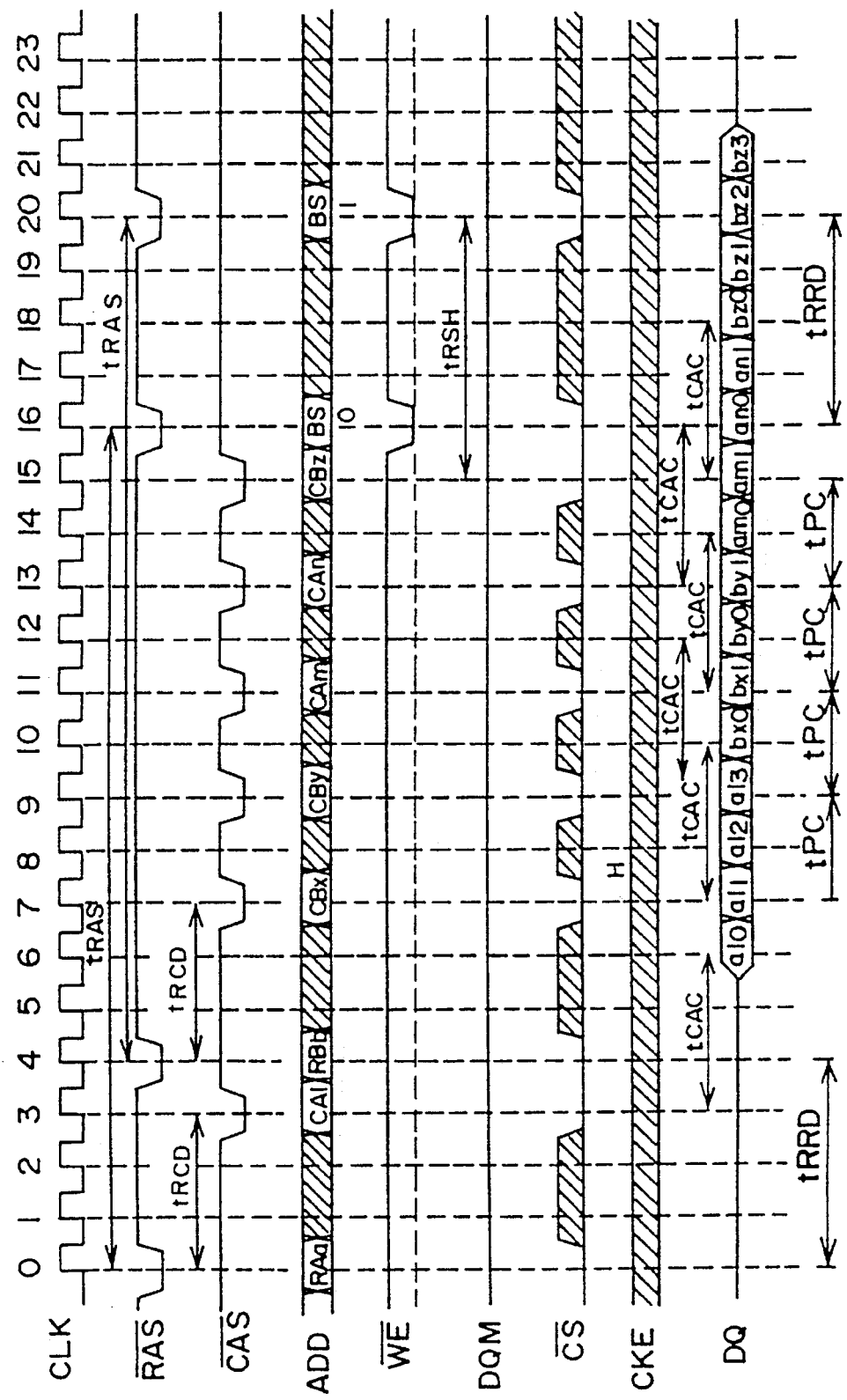
FIG. 92 is a timing chart showing the active page random read status in 4-wrap mode.

The basic operation of the configuration shown in FIG. 88 will be described hereinbelow with reference to the timing charts shown in FIGS. 89, 90, 91 and 92. FIG. 89 is a timing chart showing the interleave bank read status in 4-wrap mode, FIG. 90 is a timing chart showing the interleave bank read status in B-wrap mode, FIG. 91 is a timing chart showing the interleave bank write status in 8-wrap mode, and FIG. 92 is a timing chart showing the active page random read status in 4-wrap mode.

In the synchronous LSI memory device, the array is activated in accordance with the bank active conditions listed in a truth table (See Table 1).

After the array activation, the mode is set to a read or write column active mode to operate the column system.

In the read mode, a series of data are outputted beginning from the cycle during which the column active conditions are designated, after a cycle for latency designated separately. In this case, the data length of a series of data is designated separately as a module length.

On the other hand, in the write mode, a series of data are inputted beginning from the cycle during which the column active conditions are designated. Here, in the read mode, the latencies are "1", "2", "3" and "4", and the module lengths (page lengths) are "1", "2", "4" and "8". Further, in the case of the write operation, there exists the case where a series of data are inputted after the latency of "1" (the succeeding cycle after the cycle during which the column active conditions are designated).

Further, in a series of data, there are different scrambles such as wrap mode or interleave mode. Tables 2 to 6 list the column-system activation sequence corresponding thereto. Table 2 lists the page wrap mode, Table 3 lists the 8-wrap mode, Table 4 lists the 8-interleave mode, Table 5 lists the 4-wrap mode, and Table 6 lists the 4-interleave mode, respectively (See Tables 4 to 6).

Here, when a series of data are being accessed, the column active conditions can be designated for each even number of cycles after the column active conditions have been designated. Further, a part or all of a series of the data can be masked. In the read mode, the DQM is set to a "H" level in response to a rise edge of the cycle clock one cycle before the cycle during which data are required to be masked. In the write mode, on the other hand, the DQM is set to the "H" level in response to a rise edge of the clock of the cycle during which the data required to be masked are acquired.

Further, the memory device is also provided with such a function that the inputted clock signal CLK is pretended to be not inputted by masking the inputted clock signal CLK. This function can be realized by setting the signal CKE to the "L" level in response to a rise edge of the clock signal CLK obtained one signal before the signal CLK required to be masked. Further, after the data of a designated module length have been accessed, it is possible to set the column active cycle to any given cycle.

Figure 2:
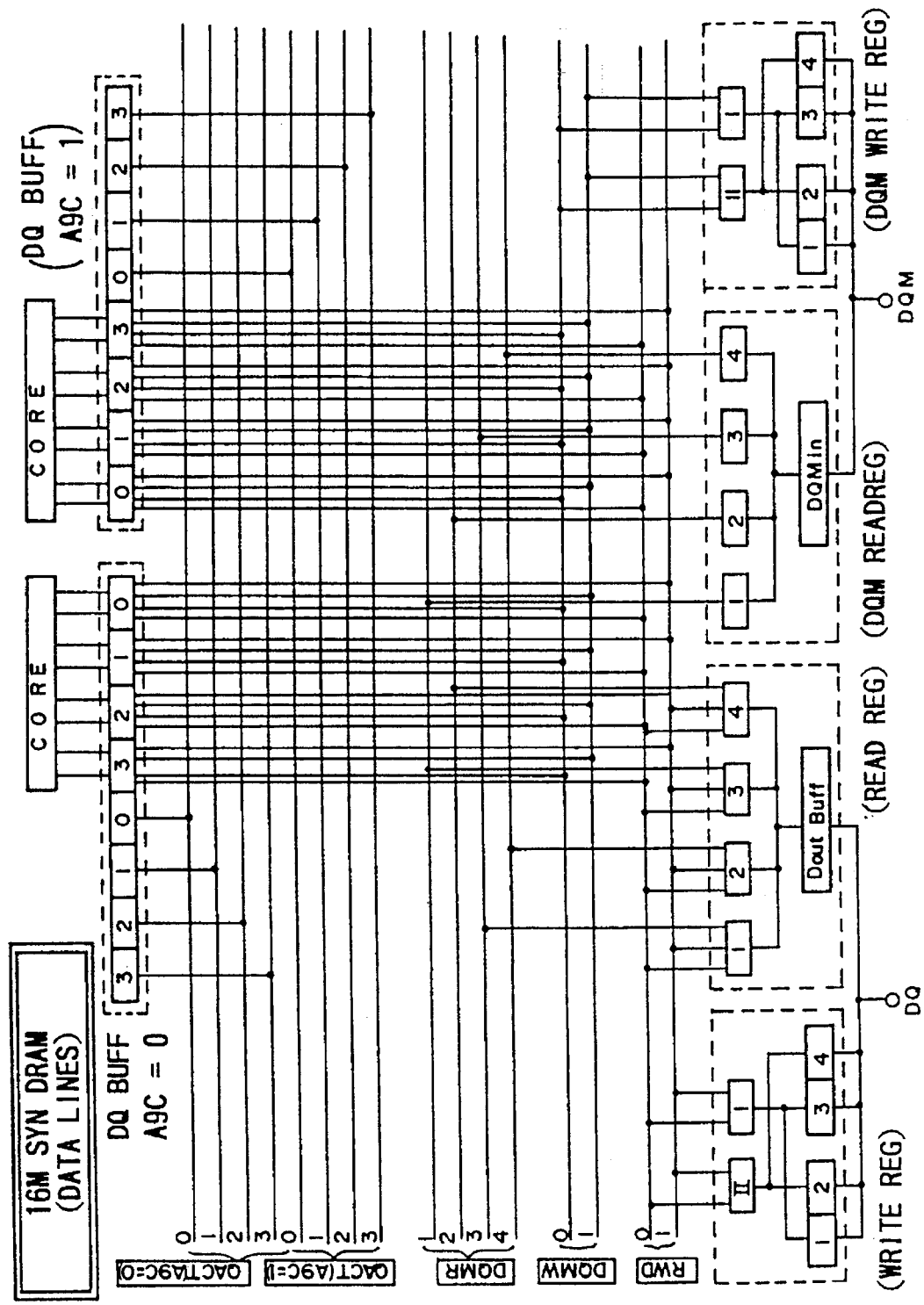
FIG. 2 is a circuit diagram showing a configuration of data lines of a 16M synchronous DRAM.

Here, the operation of the column system and the serial-system will be described hereinbelow with reference to the block diagram shown in FIG. 2. FIG. 2 shows a configuration of one embodiment of the synchronous LSI memory device according to the present invention, in particular in which a configuration of the 16-M synchronous DRAM data lines is shown by way of example. As understood in FIG. 2, 4-bit length wire register and read register are provided for each DQ pin. These registers are connected to the DQ buffer via RWD lines, respectively. The DQ buffer is a circuit for transferring data to the cell array sections through the DQ lines.

Figure 84:
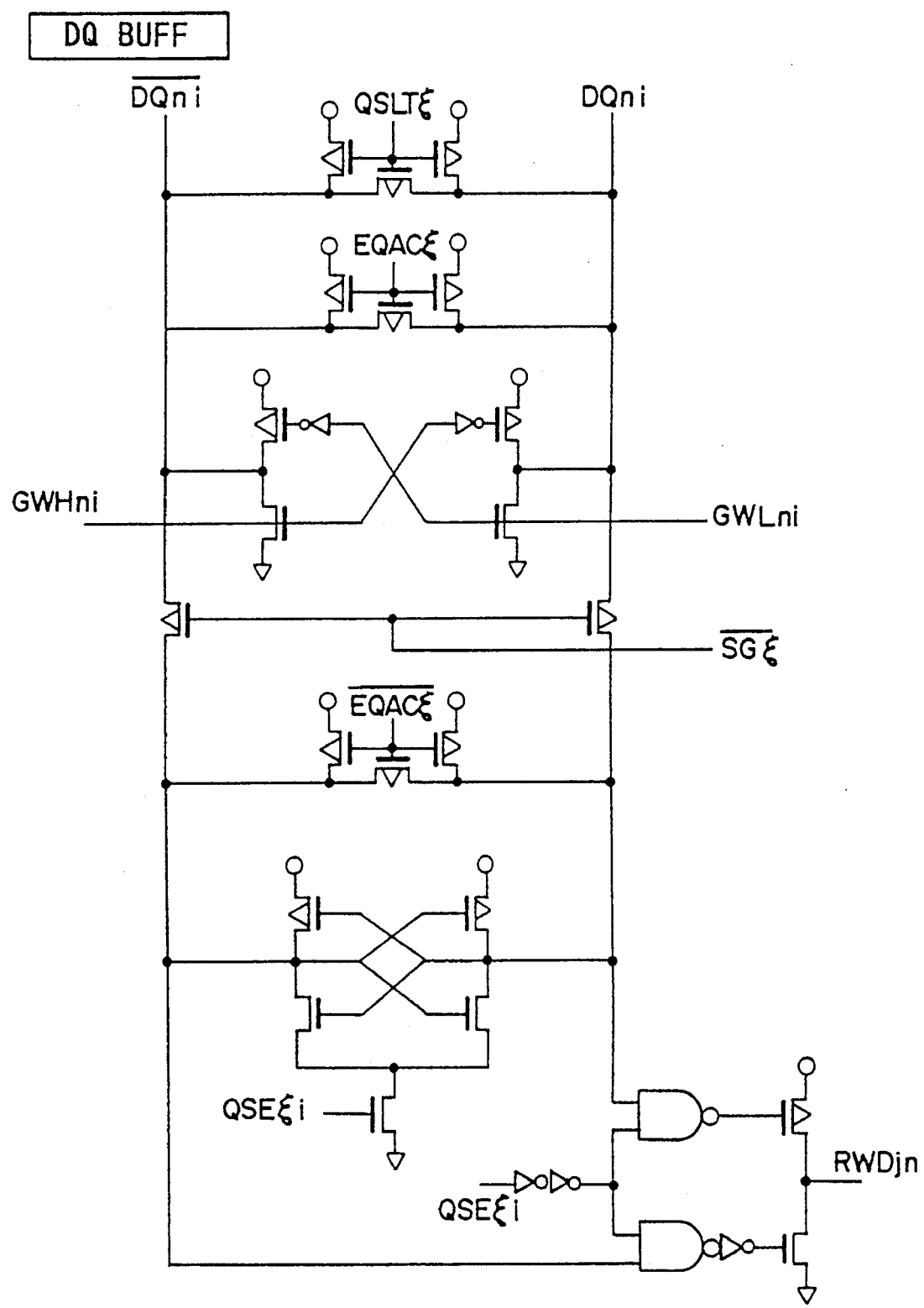
FIG. 84 is a circuit diagram showing an exemplary circuit for transferring data between the DQ buffer and a cell array.

FIG. 84 is a circuit diagram showing an exemplary circuit for transferring data between the DQ buffer and the cell array.

Figure 76:
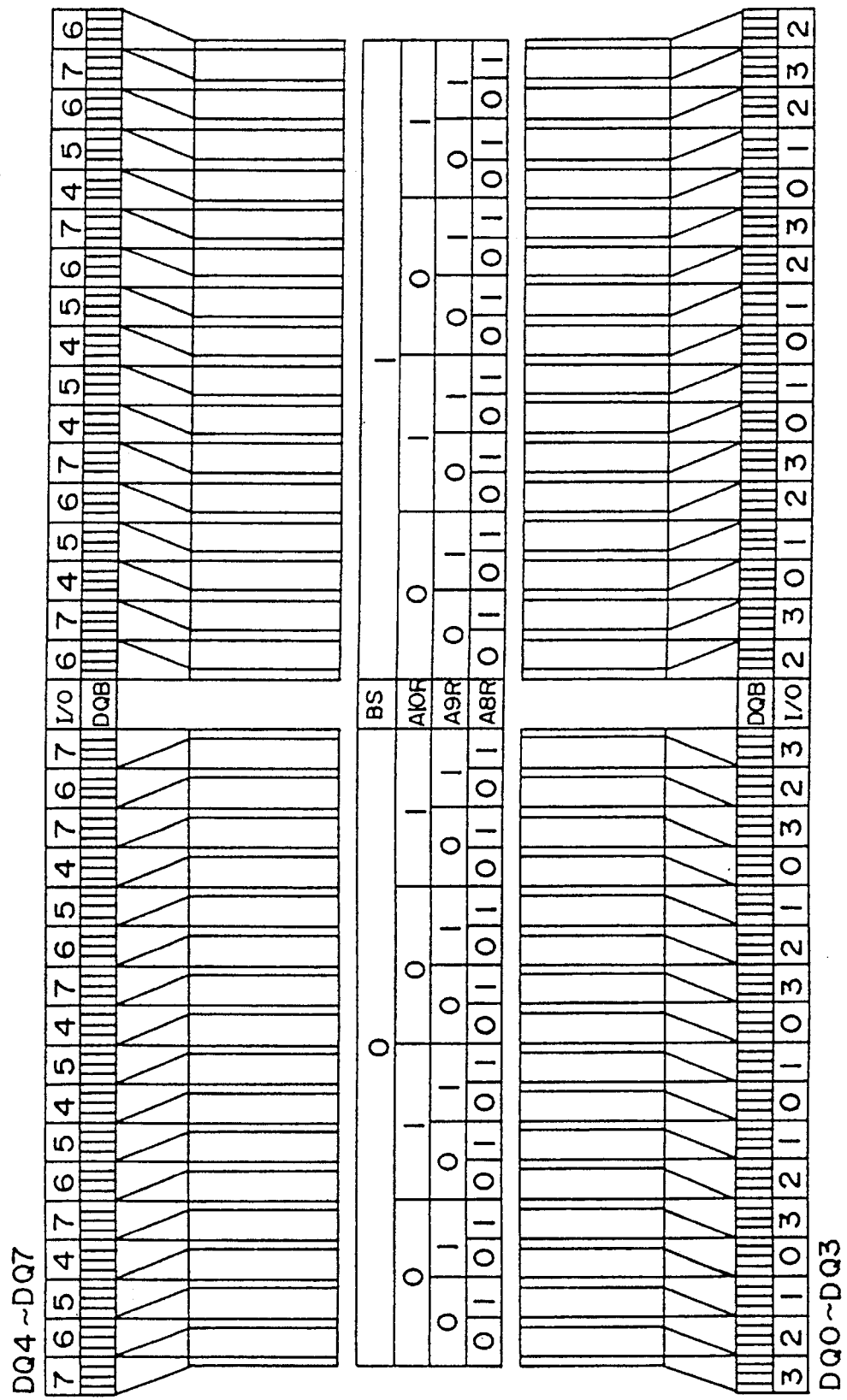
FIG. 76 is an illustration for assistance in explaining the DQ buffer configuration of an 8-bit DRAM with two 1M-word banks.
Figure 77:
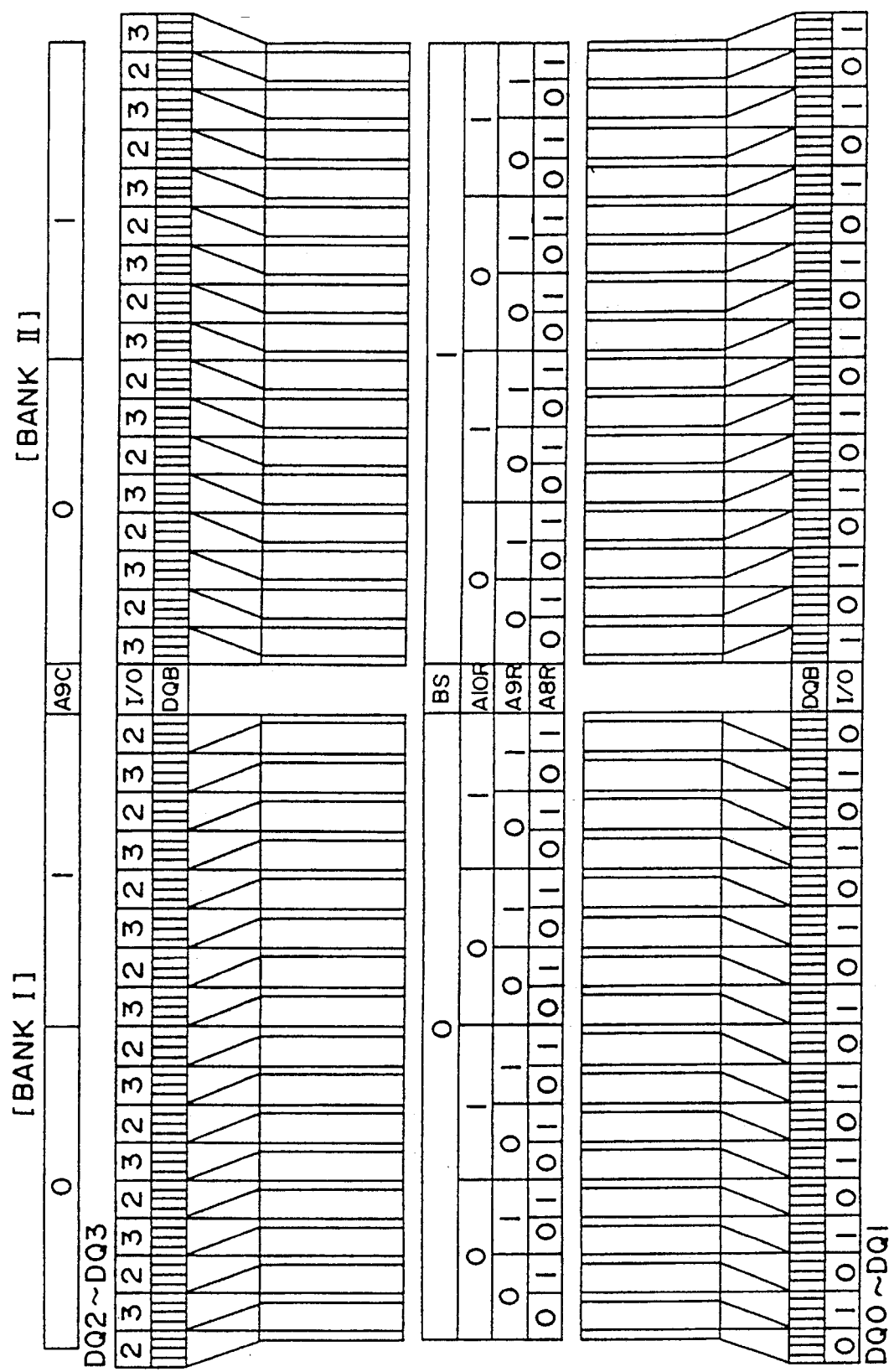
FIG. 77 is an illustration for assistance in explaining the DQ buffer configuration of an 4-bit DRAM with two 2M-word banks.

FIGS. 76 and 77 show the configuration of the DQ buffer, in which FIG. 76 shows the DQ buffer configuration of an 8-bit DRAM with two 1M-word banks and FIG. 77 shows the DQ buffer configuration of an 4-bit DRAM with two 2M-word banks. As shown in FIGS. 76 and 77, there are four DQ buffers on either side of each cell array, in which the DQ buffers arranged on both sides of the activated cell array are activated. The signals for activating the DQ buffers are QACT generated by DQ buffer activation signal generating circuit as shown in FIG. 78.

Figure 54:
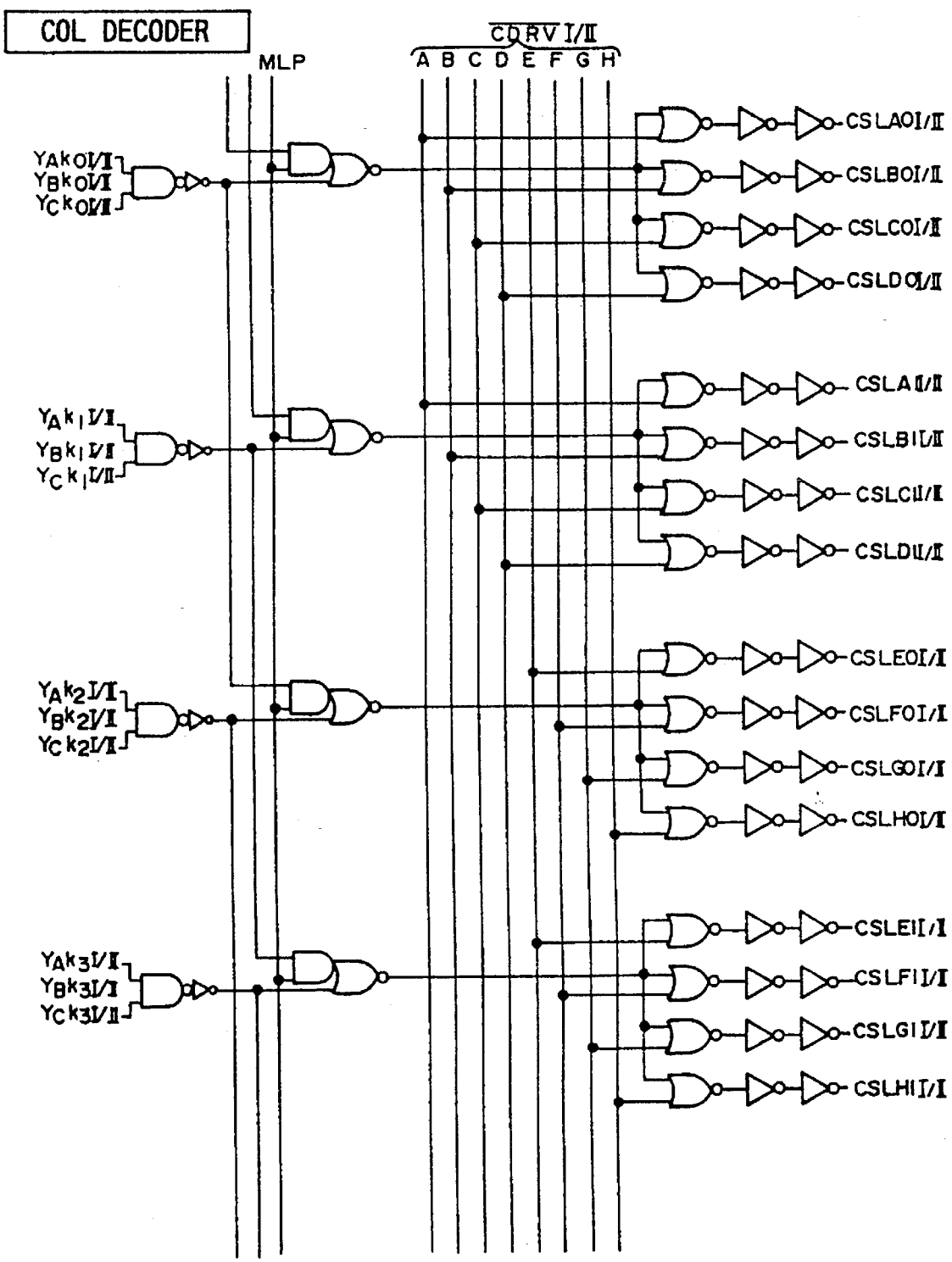
FIG. 54 is a circuit diagram showing a column decoder circuit.
Figure 58:
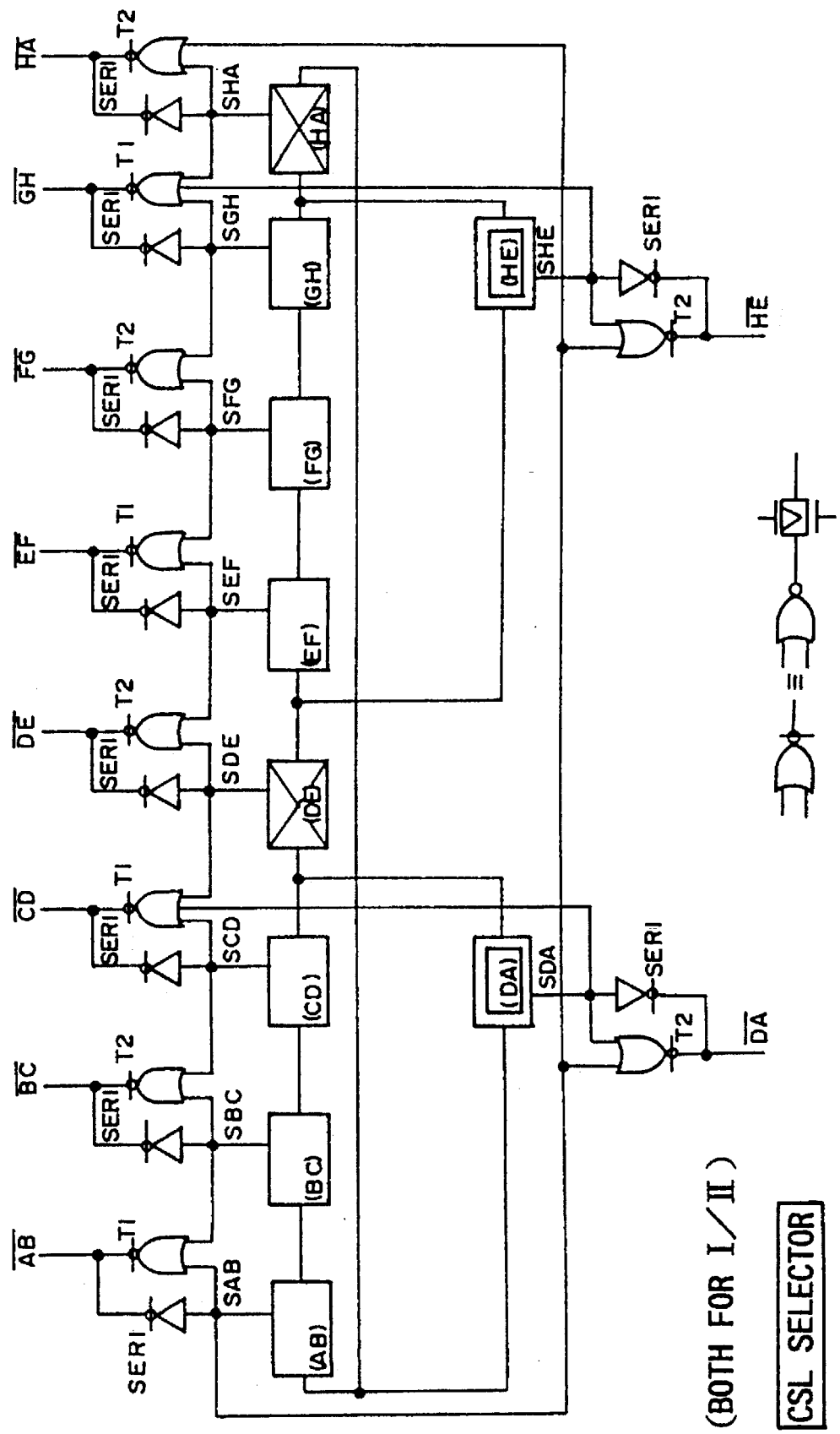
FIG. 58 is a circuit diagram showing a CSL selector.
Figure 59:
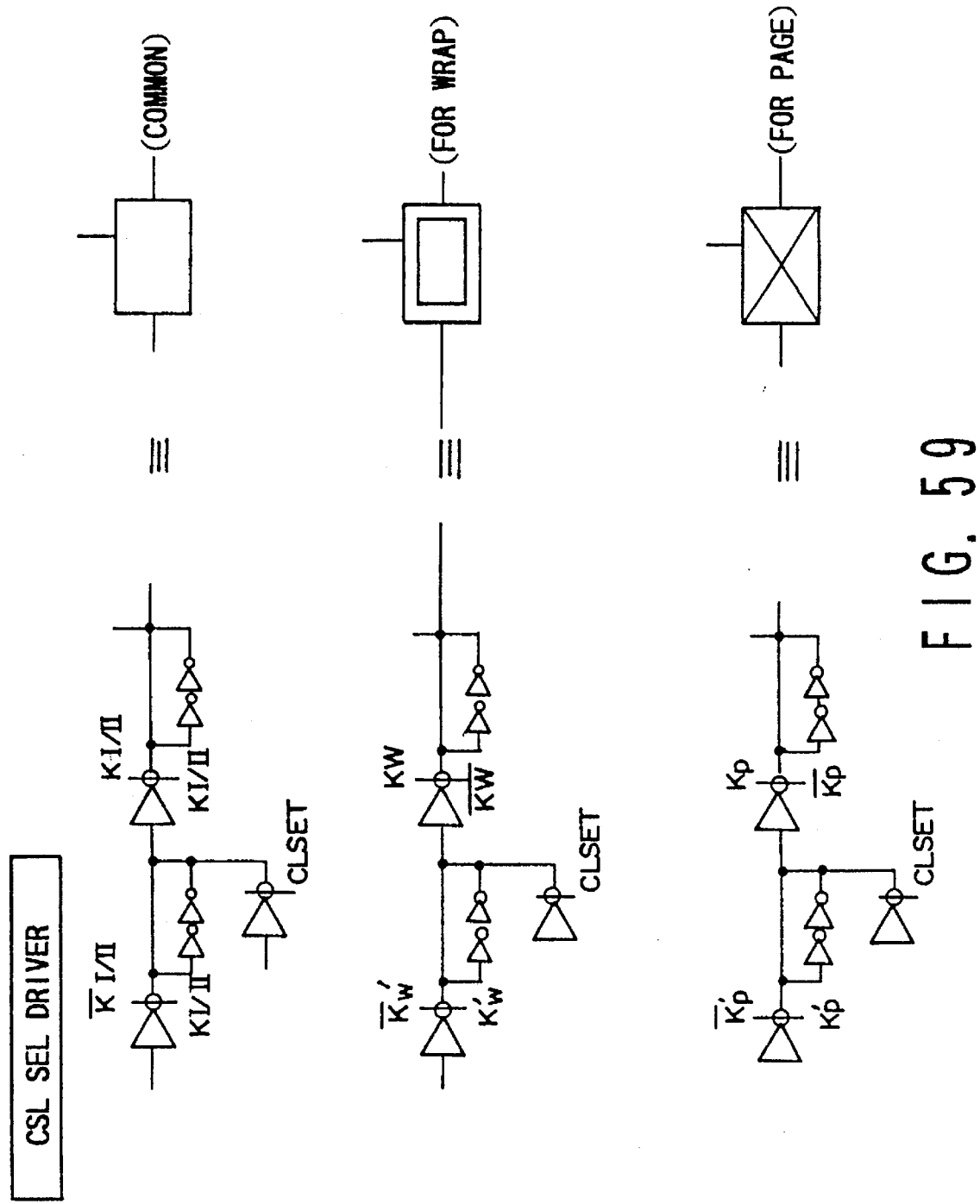
FIG. 59 is a circuit diagram showing a CSL selector driver.
Figure 60:
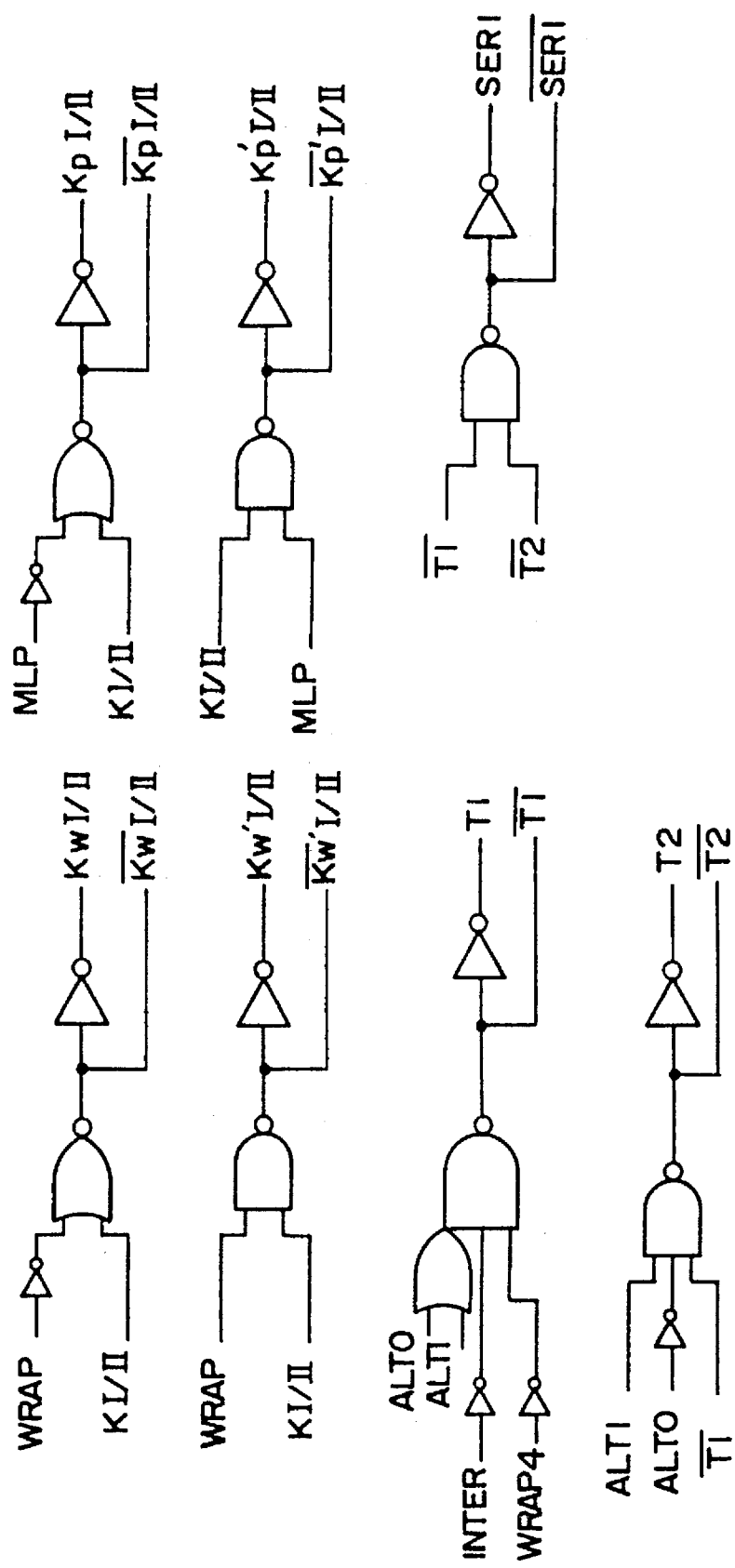
FIG. 60 is a circuit diagram showing a CSL-related logic circuit.

Column data are outputted to the DQ lines selectively from the column selected by the column select lines. With respect to the column select lines, appropriate two of the output signals CSLA to CSLH of the column decoder as shown in FIG. 54 are selected as the column select lines and further activated. In this case, the two selected column select lines are determined by scramble. The selected column select lines are controlled by the CSL selectors as shown in FIG. 58, the SCL selector drivers as shown in FIG. 59, the CSL-related logic circuits as shown in FIG. 60, the CLS select tap signal generating circuits as shown in FIG. 61, etc. Further, Table 7 lists the CSL select tap sets, and Table 8 lists the combination of the CSL selector operations (See Tables 7 and 8).

Figure 5:
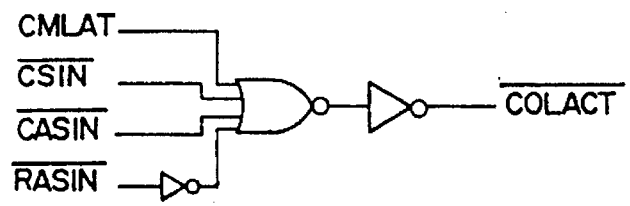
FIG. 5 is a partial circuit diagram showing a column activating detecting circuit.
Figure 6:
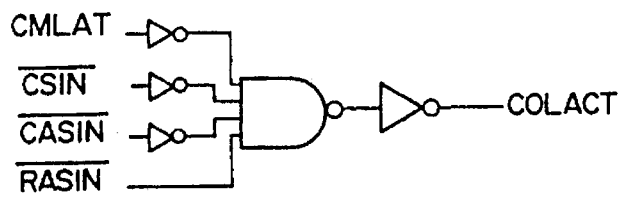
FIG. 6 is a partial circuit diagram showing another column activation detecting circuit.
Figure 7:
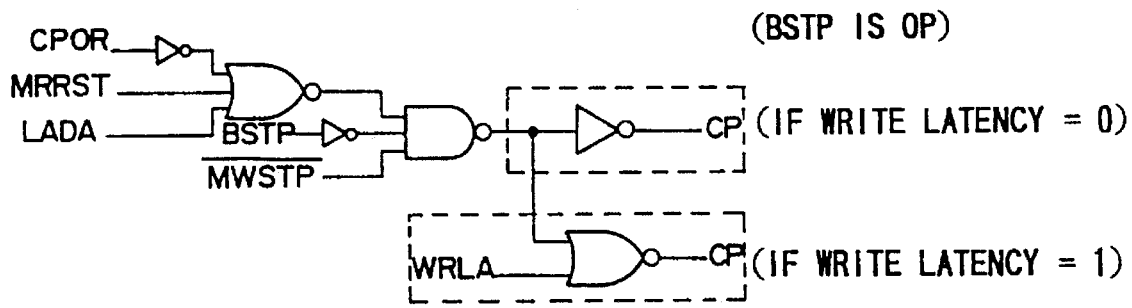
FIG. 7 is a circuit diagram showing a serial-system basic pulse generating circuit.
Figure 8:
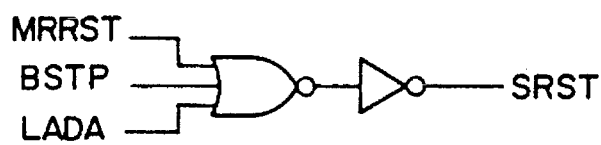
FIG. 8 is a circuit diagram showing a serial-system setting circuit.
Figure 9:
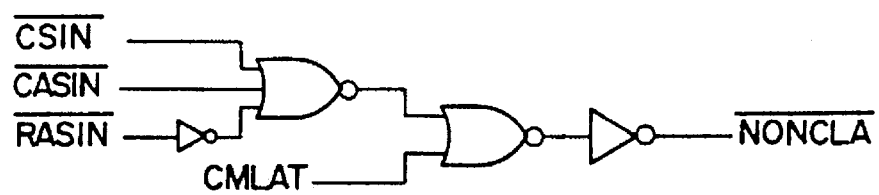
FIG. 9 is a circuit diagram showing a column deactivation detecting circuit.

The serial system is operated by the circuits as shown in FIGS. 5 to 9. FIGS. 5 and 6 show column activation detecting circuits, respectively; FIG. 7 shows a serial-system basic pulse generating circuit; FIG. 8 shows a serial-system setting circuit; and FIG. 9 shows a column deactivation detecting circuit.

Further, DQM read registers and DQM write registers are incorporated to realize the word masking.

The DQM read registers receive the status of DQM in the order of "1"—"2"—"3"—"4"—"1" and latch the data. The latched dada are outputted to the DQMR lines. The DQMR lines are connected to the output buffer. When the DQM is at the "H" level, the output buffer is set to a high impedance status.

The DQM write registers operate in the same way as the write register. The obtained DQM status is outputted to the DQM lines two bits by two bits being scrambled. Before data are outputted from the DQM write registers, the DQMW lines are once precharged to the write disable status. Only when the "L" level DQM status is outputted to the DQMW lines, the data write is enabled.

Figure 36:
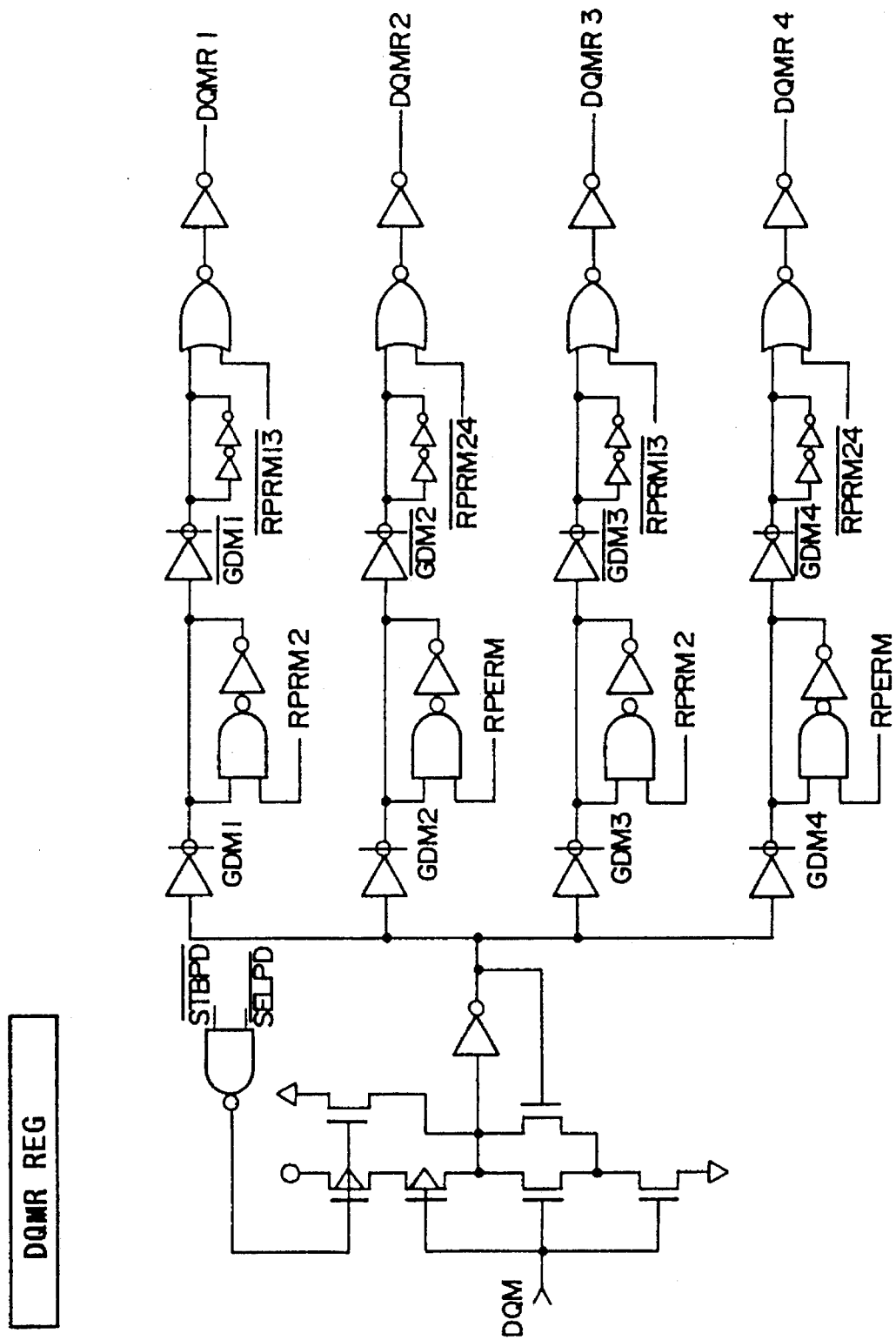
FIG. 36 is a circuit diagram showing a DQMR register circuit.
Figure 38:
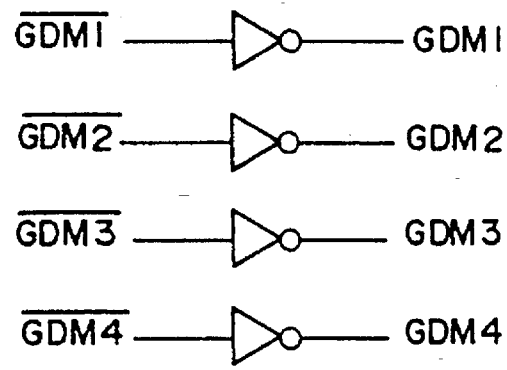
FIG. 38 is a circuit diagram showing a GDM generating circuit.

The above-mentioned operation is controlled by the circuits as shown in FIGS. 33 to 40. FIG. 33 shows a read operation enabling circuit; FIG. 34 shows a DQMR gating circuit; FIG. 35 shows a high impedance control circuit; FIG. 36 shows a DQMR register circuit; FIG. 37 shows a RPRM generating circuit; FIG. 38 shows a GDM generating circuit; FIG. 39 shows a DQM write register circuit; and FIG. 40 shows a DQM option circuit corresponding to the write latency; respectively.

Figure 19:
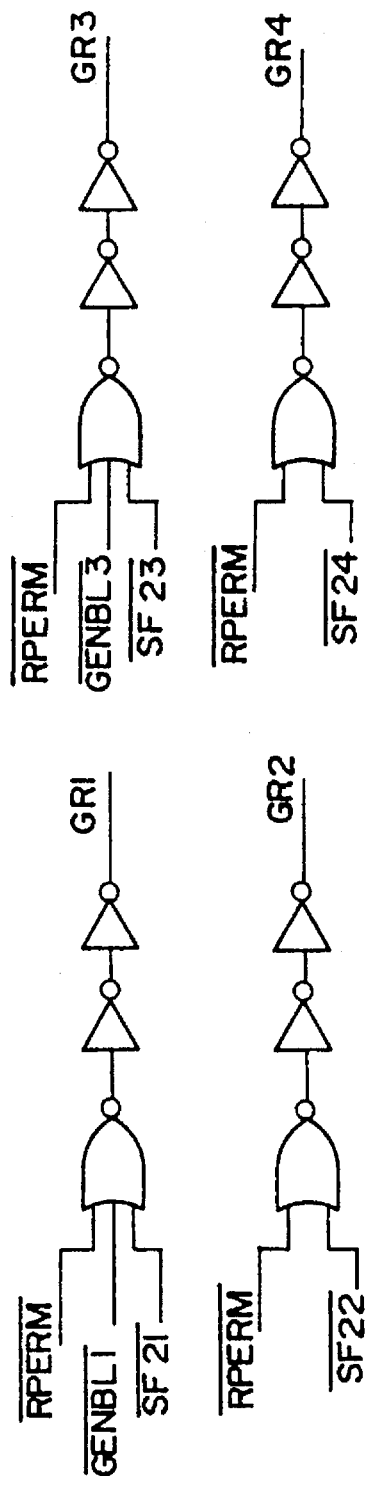
FIG. 19 is a circuit diagram showing a read register gating circuit.
Figure 20:
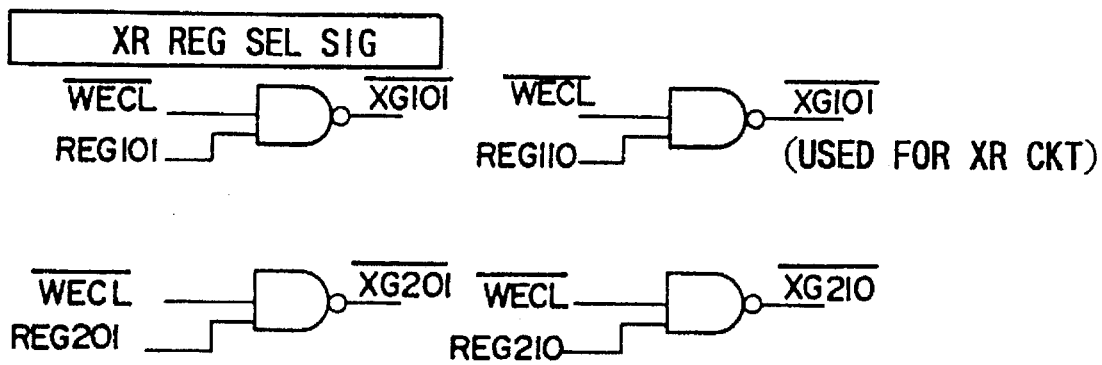
FIG. 20 is a circuit diagram showing an XR register selection signal generating circuit.
Figure 21:
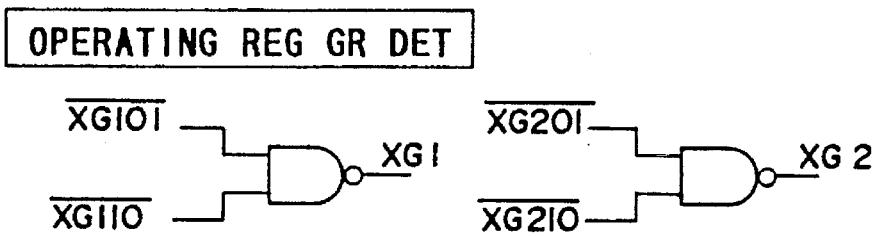
FIG. 21 is a circuit diagram showing a used register group detecting circuit.
Figure 22:
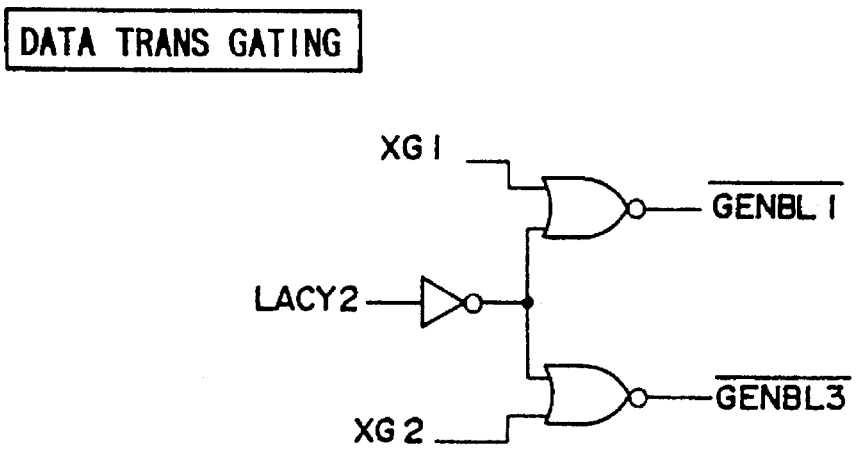
FIG. 22 is a circuit diagram showing a data transfer gating circuit.
Figure 24:
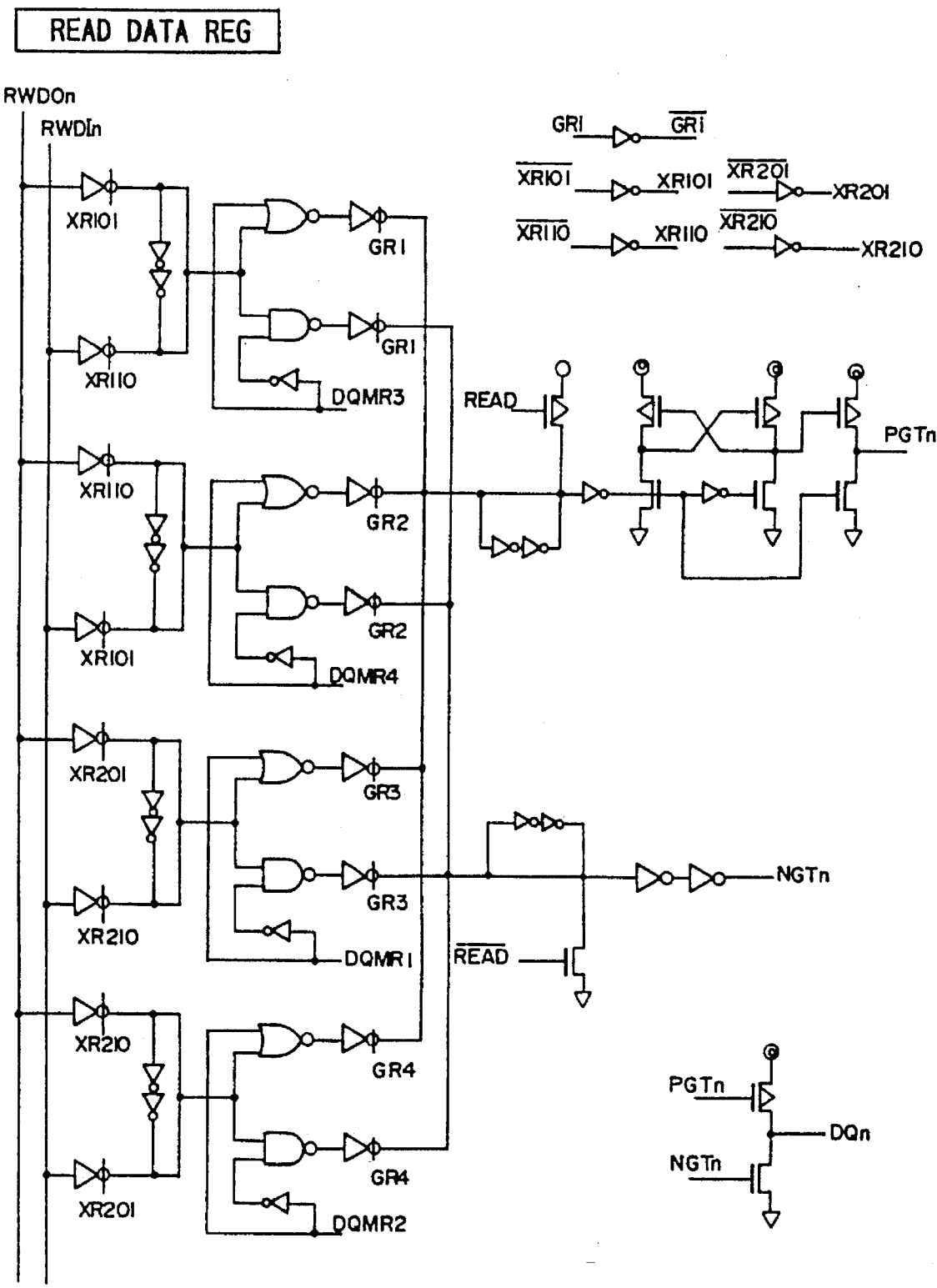
FIG. 24 is a circuit diagram showing a read data register circuit.
Figure 25:
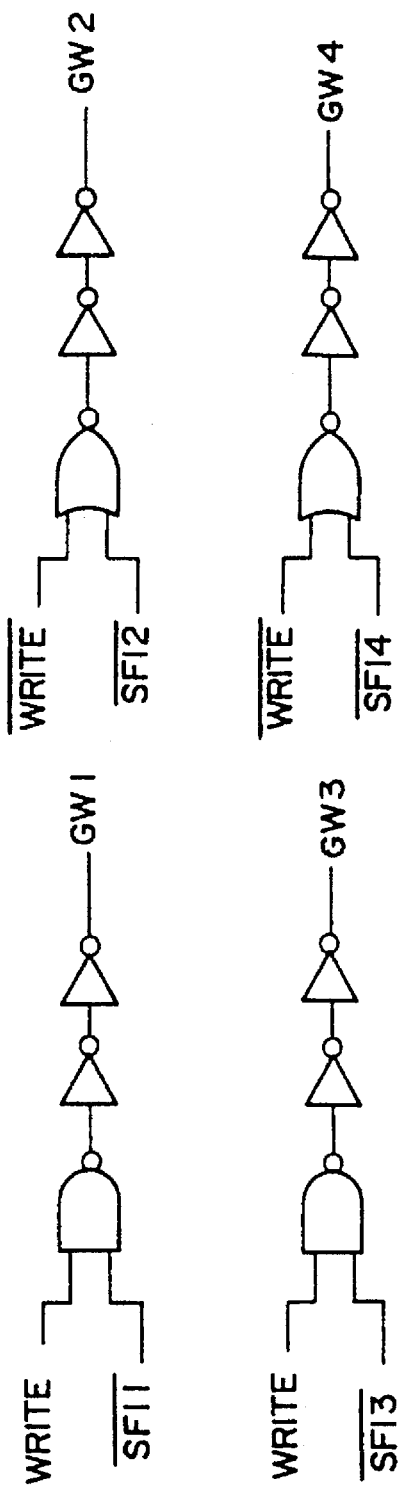
FIG. 25 is a circuit diagram showing a write register gating circuit.
Figure 26:
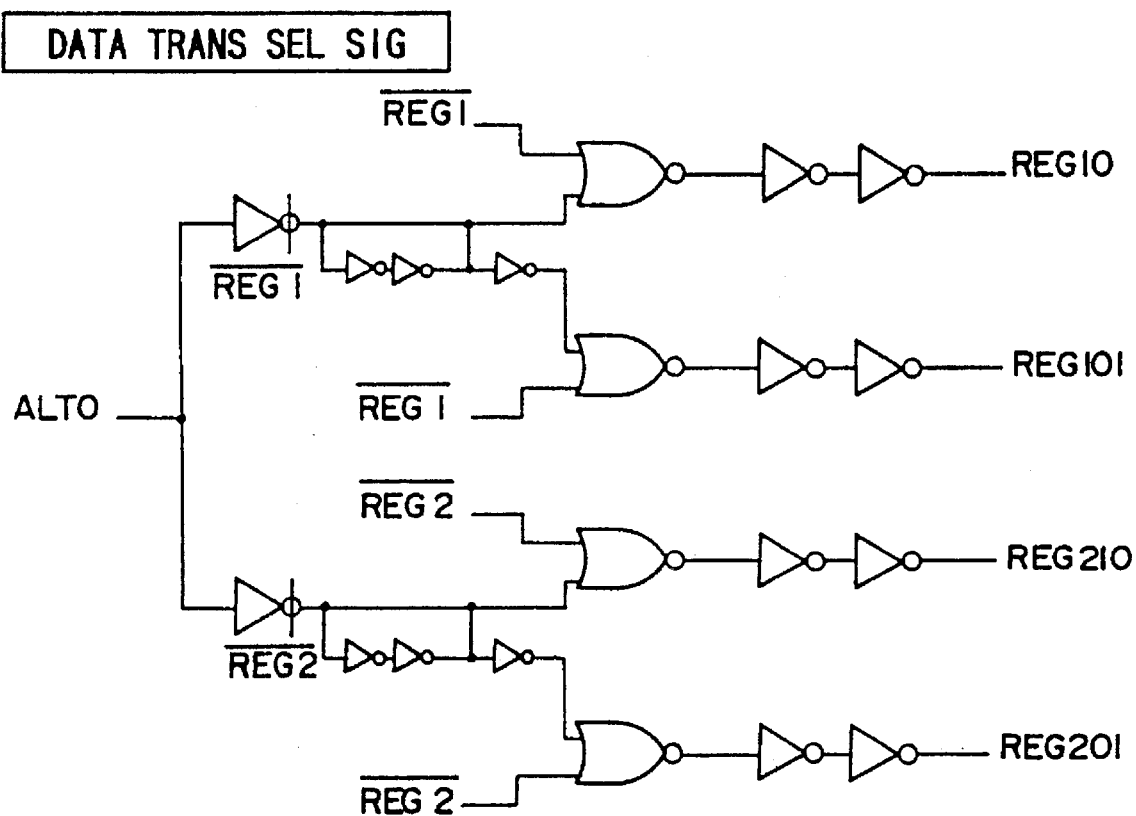
FIG. 26 is a circuit diagram showing a data transfer selection signal generating circuit.
Figure 27:
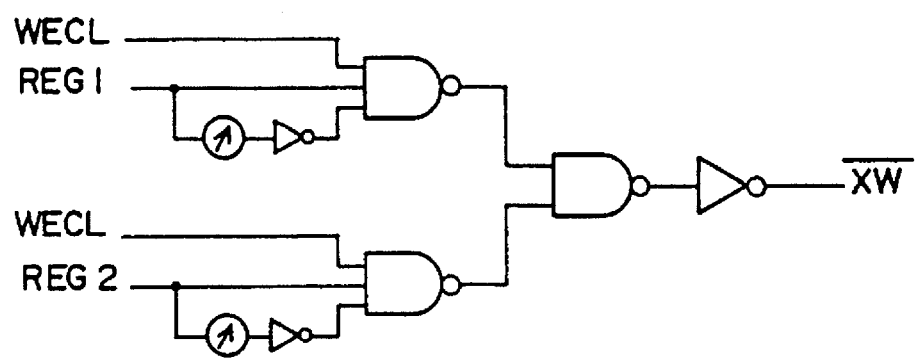
FIG. 27 is a circuit diagram showing a write data transfer signal generating circuit.
Figure 28:
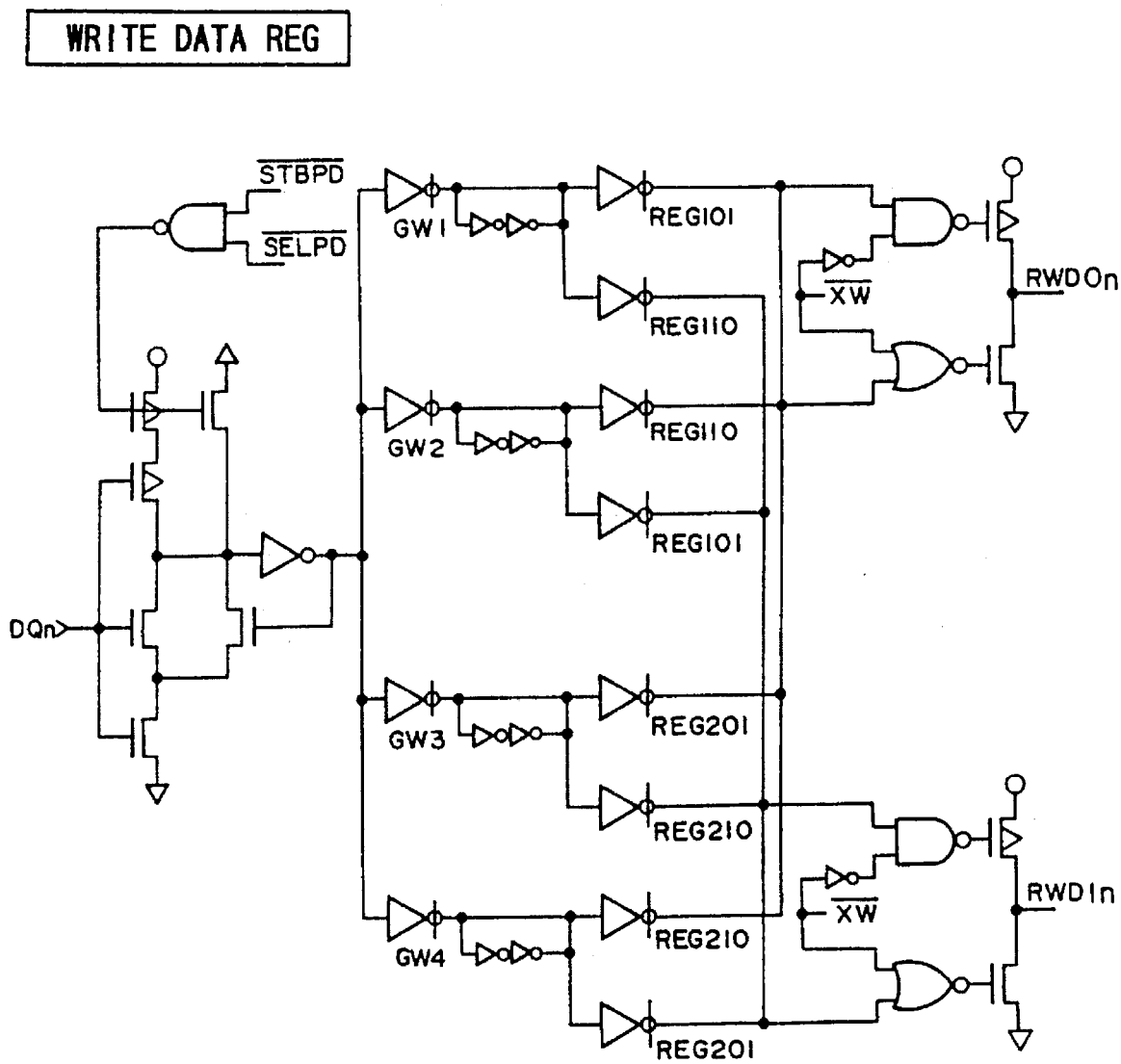
FIG. 28 is a circuit diagram showing a write data register circuit.

Further, the configuration of the read/write registers are shown in FIGS. 19 to 28. FIG. 19 shows a read register gate circuit; FIG. 20 shows an XR register selection signal generating circuit; FIG. 21 shows a used register group detecting circuit; FIG. 22 shows a data transfer gating circuit; FIG. 23 shows a read data transferring circuit; FIG. 24 shows a read data register circuit; FIG. 25 shows a write register gating circuit; FIG. 26 shows a data transfer selection signal generating circuit; FIG. 27 shows a write data transfer signal generating circuit; and FIG. 28 shows a write data register circuit, respectively.

The architecture, the serial operation, the word mask, the clock mask, the module length-related operation, the burst stop, the column system, the column-system address, the column-system data access of the present embodiment will be described herein below in sequence.

As shown in the serial operation explanation of Table 14, the functions required for the serial system of the SDRAM are such that: the serial system can correspond to the clock masking; column addresses can be inputted for each two cycles at minimum; the words can be masked; and the serial system is operated at 100 MHz.

To achieve the above-mentioned operation, it is necessary to access to the core section within a time of two cycles. In this case, a register is required to temporarily store the data read from the core section under consideration of the latency. To cope with the latency of "4", the register requires 4 bit length at its minimum. By doing this, it is possible to prevent the interference between the present data and the new data read by the core section during the data outputting operation.

Further, since the column address can be changed for each two cycles, only 2-bit data of the 4-bit data can be a serial data at the same column address. Accordingly, it is necessary to handle a 4-bit register as two 2-bit registers; that is, data registers of 2+2 bit configuration are required.

As shown in the read mode and write mode operation explanation of Table 15, in the read mode, two system lines between the CLK signal and the RWD lines and between the RWD lines and the data registers are operated in pipeline mode to cope with a high speed operation. Therefore, it is necessary that the read-mode register interleaves the register group two bits by two bits to transfer data from the RWD lines to the registers for each two cycles. The data are outputted from the first register in sequence.

In contrast with this, in the write mode, it is necessary that the write-mode register interleaves the register group two bits by two bits to transfer data from the registers to the RWD lines for each two cycles. To execute the write operation at high speed, DQM lines are used. That is, before the write data are outputted to the RWD lines, the DQM lines are write-disabled. However, immediately when the write dada are outputted, the DQM lines are write-enabled, so that it is possible to execute the write operation at high speed without delaying the write operation.

FIG. 2 shows the circuit for realizing the above-mentioned operation at high speed.

Table 11 lists the architecture explanation of the serial-system configuration, which is adopted in accordance with the above-mentioned circuit configuration.

A basic signal CP is prepared to operate the serial system. This basic signal CP can be stopped in correspondence to the serial-system resetting and the write latency. Further, the basis signal CP is used to select shift registers for activating the data registers.

Further, it is necessary to operate the signal K for controlling the main access pass from the outputs of the shift registers to the core section, signals REG1 and REG2 for selecting a register group of two bit unit, and signal GDM for selecting the DQM registers, etc.

Further, the basis signal CP must cope with the clock masking (one of the functions). For the reason as mentioned above, the signal CP is formed on the basis of the synchronous signal CLK to be masked.

On the basis of the conditions as above, it is possible to adopt the serial-system architectures as shown in FIGS. 3 and 4. Here, FIGS. 3 and 4 show the configuration of the serial-system control lines, respectively. In FIG. 3, the basic signal CP is used for read, write, main pass activation signal K, etc. properly. On the other hand, in FIG. 4, only the shift registers are divided according to the uses, without separating the CP according to the uses. In the architectures shown in FIGS. 3 and 4, although the number of the required registers is different from each other, the number of registers activated simultaneously is the same in both.

The basic operation required for the respective sections will be described with reference to the architecture explanation of Table 12.

In the respective sections shown in FIGS. 3 and 4, the following operation is required.

The main pass activation signal K is enabled for each two cycles in synchronism with the basic signal CP, and further must be stopped when the serial system is stopped. Further, when the serial system is reset, this signal K is initialized so as to be enabled beginning from the first CLK signal. The read data register gate GR proceeds in synchronism with the basic signal CP. The serial system is reset so as to be restarted beginning from the read data register gate GRi corresponding to the read latency. This control corresponds to that the first access starts beginning from the read data register gate GR1. Further, in the write mode, the read data register gates are kept deactivated. The write register gate GW proceeds in synchronism with the basic signal CP. The serial system is reset so as to be restarted beginning from the write register gate GW1. Further, in the modes other than the write mode, the signals GW1 and GW3 are set to the "H" level and the signals GW2 and GW4 are set to the "L" level to read the first data.

The register group selection signal REG operates for each two cycles in synchronism with the basic signal CP, and is so set that when the serial system is reset, the succeeding operation starts beginning from the first register group. The DQM read register gates GDM proceed in synchronism with the basic signal CP, and some of these gates GDM are fixed at "L" or "H" level according to the read latency in modes other than the read mode. On the other hand, in the read mode, the DQM read register gates GDM operate in the same way as with the case of the data register gates GR.

The basic operation of the read corresponding sections will be described hereinbelow with reference to the architecture explanation of Table 13.

When the data are read from the core section, the data must be transferred to the read data registers. Further, after the normal data have been transferred to the read data registers, the read register gates must be so controlled as to be opened. For these operation, the data transfer signal XR is activated by the main pass activation signal K after the data have been read, and the read data register gates GR1 and GR3 are enabled after the data transfer signal XR has been activated.

Under the consideration as above, a serial-system control section as shown in FIG. 4 is adopted.

The basic operation in the read/write mode and the address acquisition will be described hereinbelow with reference to Table 16 to Table 18. Table 16 explains the read/write mode acquisition, the address acquisition, and the counter relationship; Table 17 explains the address signals used for the respective circuits in tap set; and Table 18 explains the write enable signal /WE used for the respective circuits.

The mode and the address are acquired in response to the first CLK signal in the column access cycle, and switched when the main pass activation signal K is deactivated at the "L" level. This is because the mode and the address must be switched only when the column system is being deactivated.

Further, the head address is set to an output prepare section of an address counter only when /R signal is set to the "H" level, except the module length is a page length.

Here, the /R signal is set to the "H" level in the first cycle of the column access cycle, and to the "L" level when the main pass activation signal K changes to the "L" level. On the other hand, when the module length is the page length, the head address is set to the output section of the counter when the main pass activation signal falls.

Here, when the module length is other than the page length, the output section of the counter is opened only when the first main pass activation signal K after the column access cycle is at the "L" level, and kept closed in the other cases. On the other hand, when the module length is the page length, the output of the counter is counted up in response to a count-up signal.

Here, the basic operation of the serial-system setting or stopping operation will be described hereinbelow with reference to Table 19. Table 19 explains the serial-system enable.

In the read mode, the serial system is reset when the column access cycle will not start subsequent to the final data output cycle, after the cycles according to the latency. Further, the serial system is enabled after the succeeding column access cycle starts.

In the write mode, after the cycle in which the final data have been inputted, the serial system is stopped. Further, in the succeeding column access cycle, the serial system is enabled.

Figure 42:
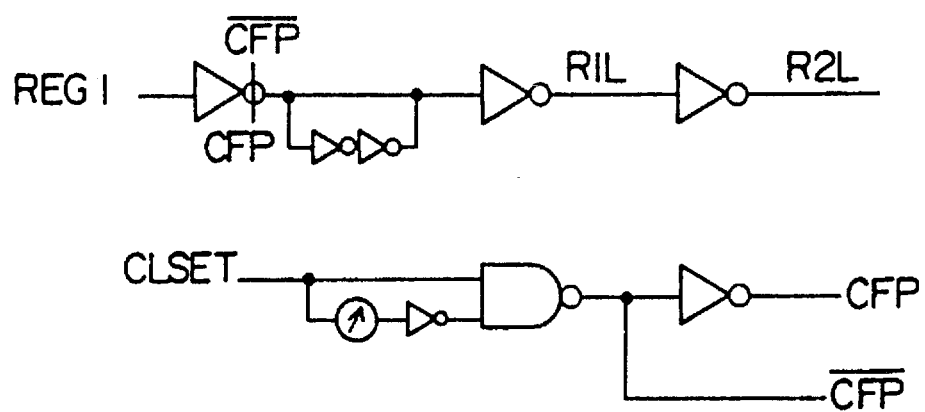
FIG. 42 is a circuit diagram showing a register group detecting circuit.
Figure 45:
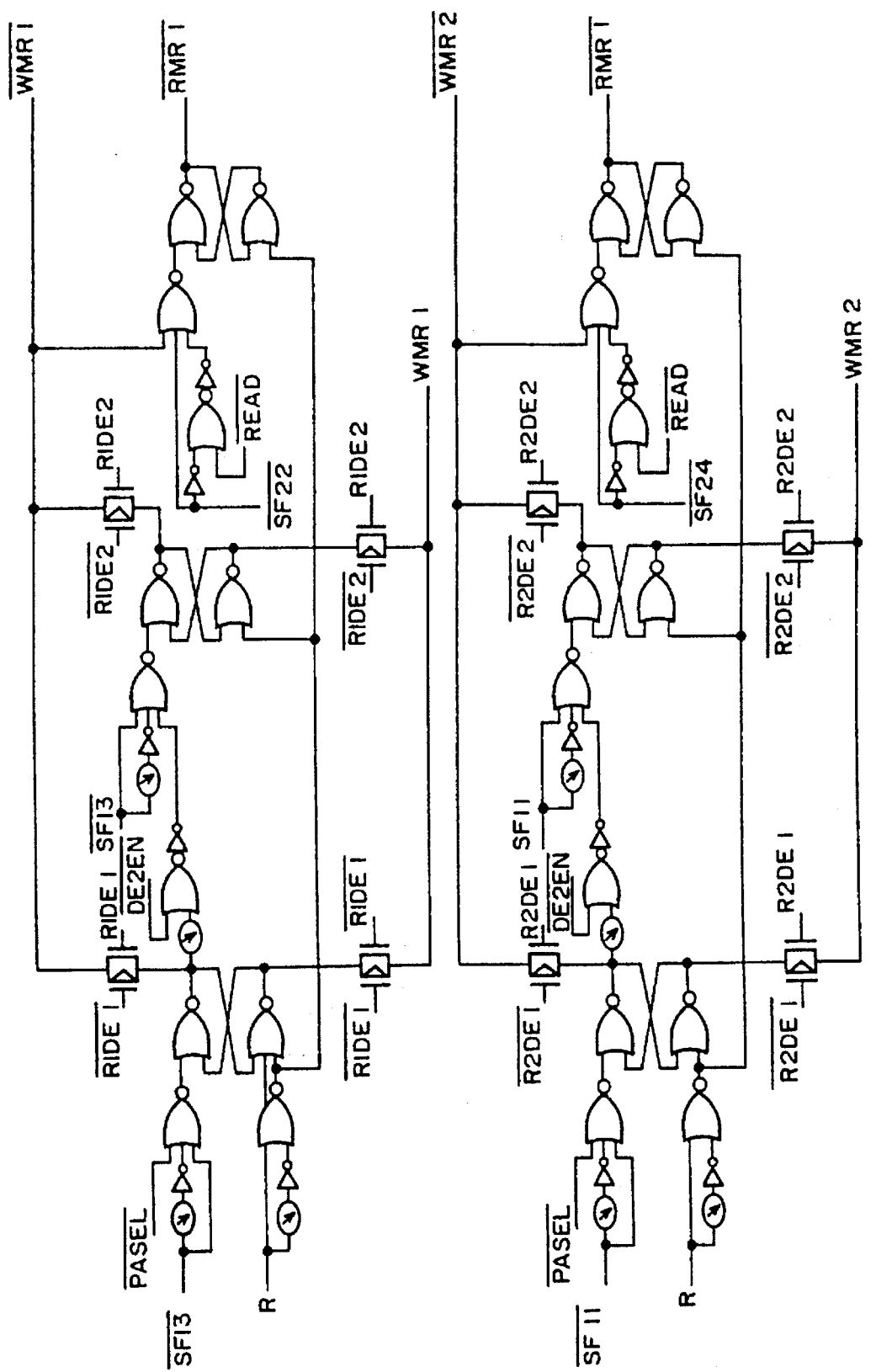
FIG. 45 is a circuit diagram showing a module-length detecting circuit.
Figure 46:
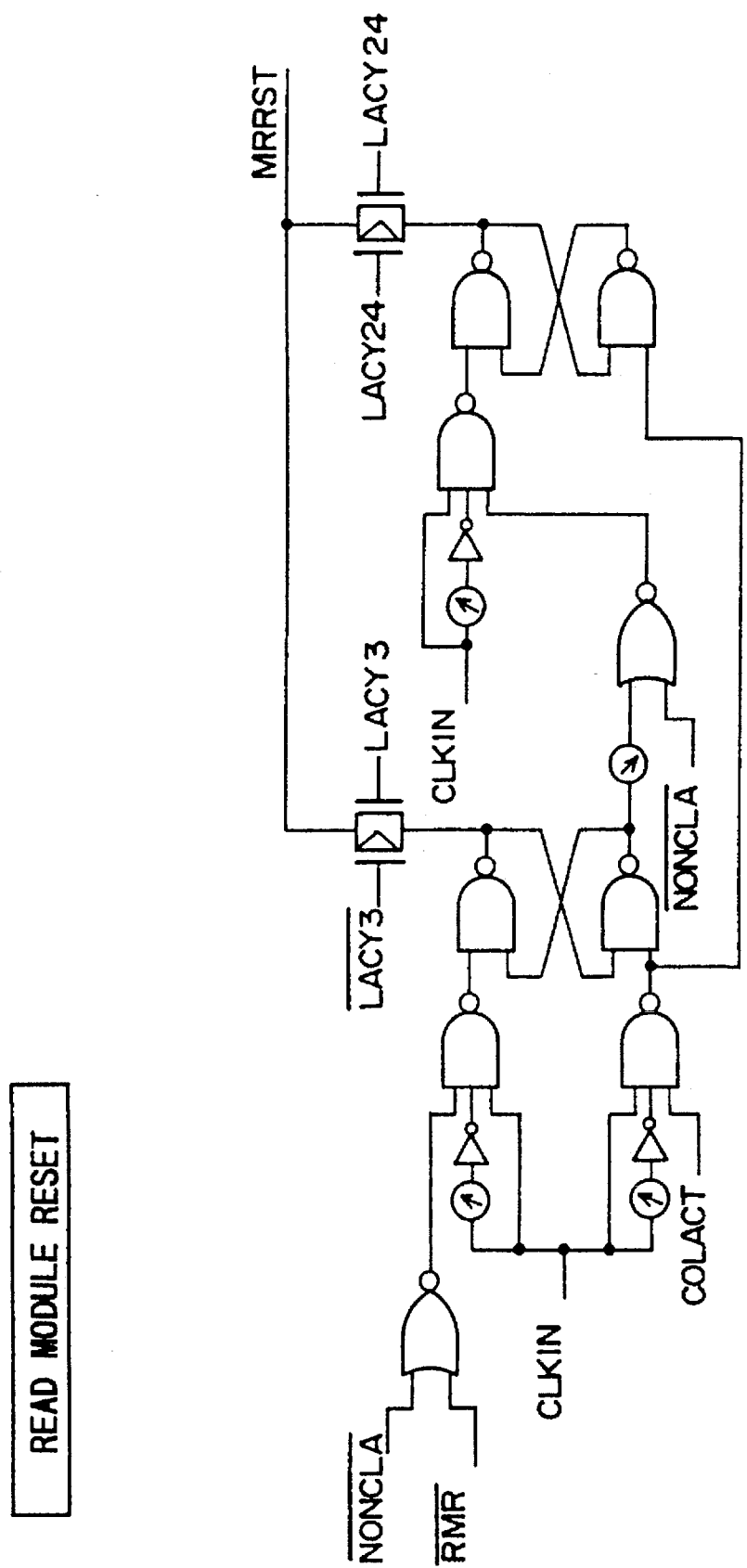
FIG. 46 is a circuit diagram showing a read module resetting circuit.
Figure 47:
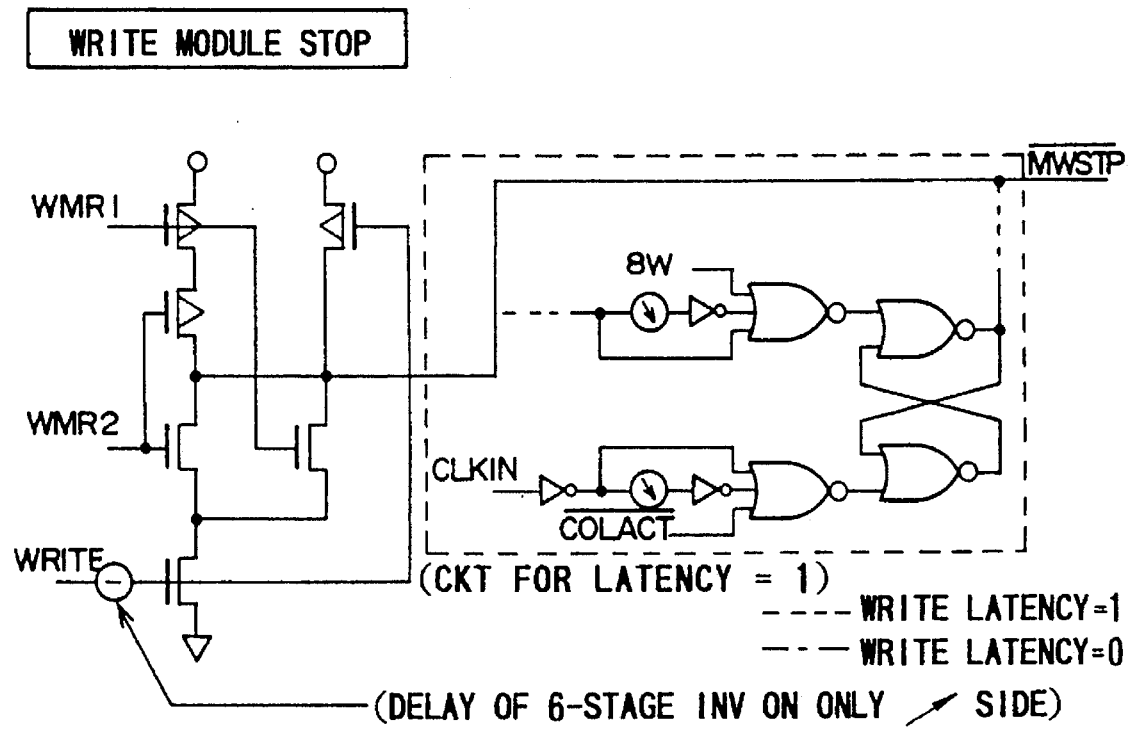
FIG. 47 is a circuit diagram showing a write module stopping circuit.
Figure 48:
FIG. 48 is a circuit diagram showing a module-length detecting circuit.

The above-mentioned operation can be achieved by the circuit configurations as shown in FIGS. 42 to 49. FIG. 42 shows a register group detecting circuit; FIG. 43 shows a partial configuration of a module-length detection procedure selecting circuit; FIG. 44 shows another partial configuration of the module-length detection procedure selecting circuit; FIG. 45 shows a module-length detecting circuit; FIG. 46 shows a read module resetting circuit; FIG. 47 shows a write module stopping circuit; FIG. 48 shows a module-length detecting circuit; and FIG. 49 shows a module-number counting circuit, respectively.

Figure 12:
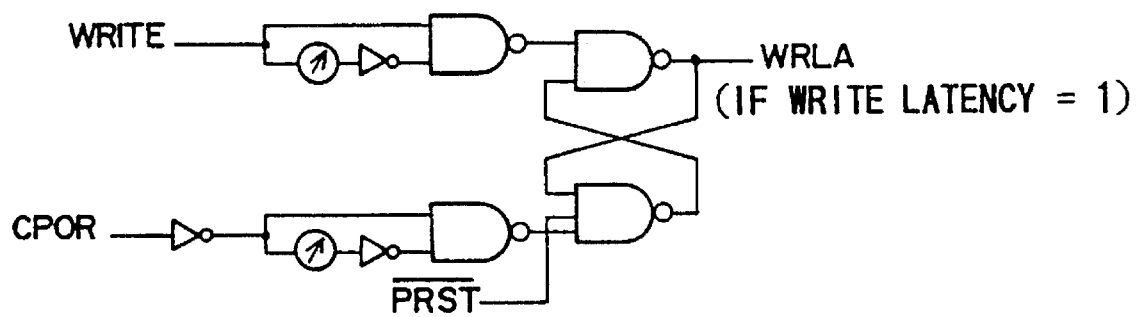
FIG. 12 is a circuit diagram showing a write latency detecting circuit.

Further, when the write latency is "1", the serial system is stopped for only first one cycle after the write mode starts from the mode other than the write mode. The above-mentioned operation can be operated by a write latency detecting circuit as shown in FIG. 12.

The mode detection required for the above-mentioned operation will be described hereinbelow with reference to Table 20.

Figure 10:
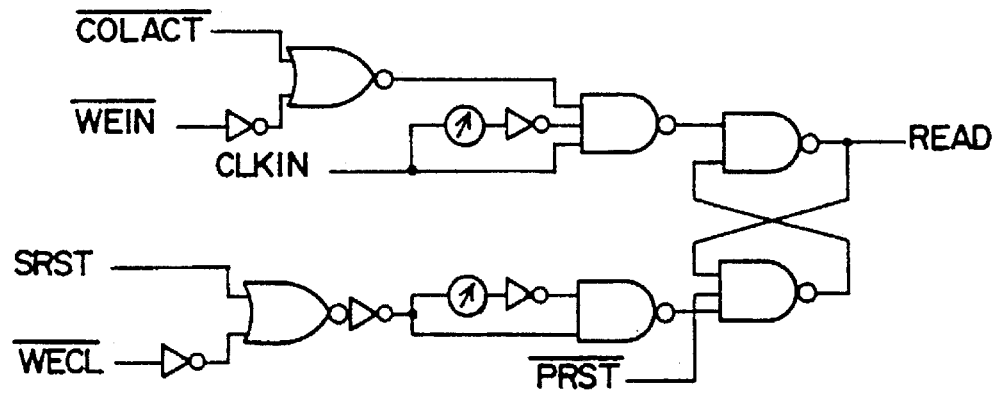
FIG. 10 is a circuit diagram showing a read mode detecting circuit.
Figure 11:
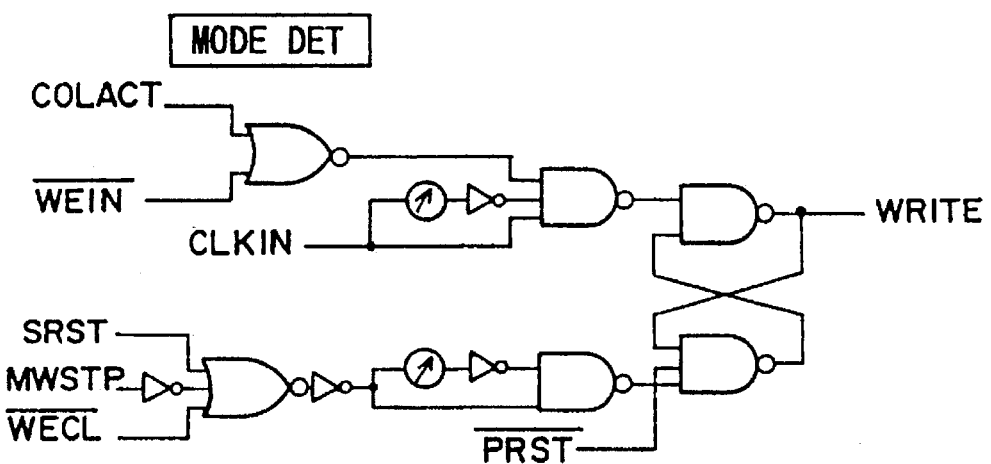
FIG. 11 is a circuit diagram showing a write mode detecting circuit.

The read mode or the write mode is detected in order to operate only the circuits required for the detected mode. Therefore, the mode is detected on the basis of a read detection signal READ or a write detection signal WRITE. These signals are generated by a read mode detecting circuit as shown in FIG. 10 and by a write mode detecting circuit as shown in FIG. 1.

The column cycle detection and the address mode acquisition of when the latency is "1" will be described hereinbelow with reference to Tables 21 and 22.

The detection of the column access cycle start of when the write latency is "1" is different from that of when the write latency is "0". This is because the cycle during which the address mode is inputted is so controlled as to be delayed by one cycle from the cycle in which the address mode is actually used, as already explained. Therefore, when the mode is changed, it is necessary to detect the difference in latency. In this connection, when the latency is "0", the above-mentioned discrimination is unnecessary.

Figure 14:
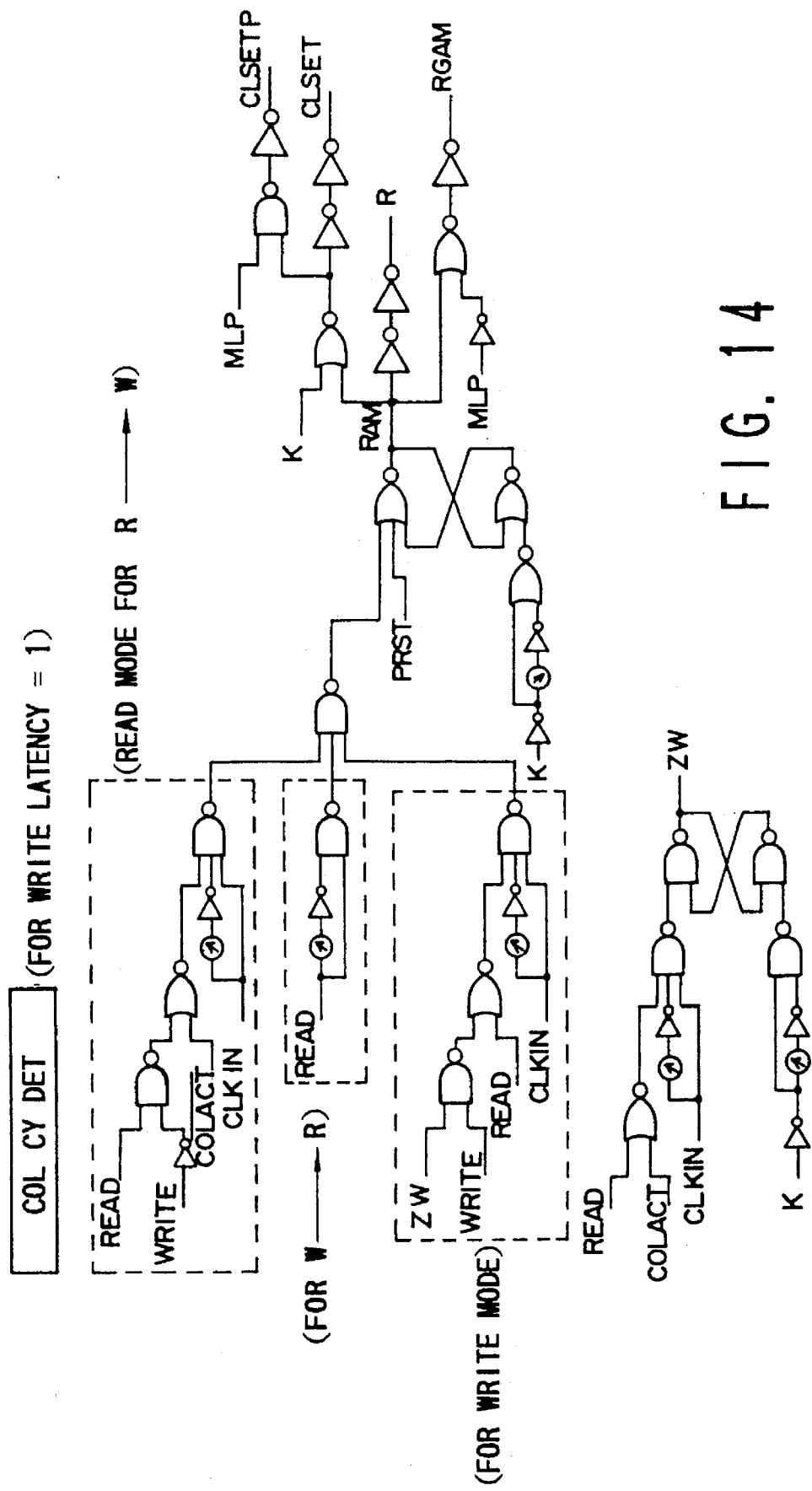
FIG. 14 is a circuit diagram showing a column cycle detecting circuit.

In other words, when the latency is "0", control is executed by a tap address mode acquisition control circuit as shown in FIG. 13. When the latency is "1", on the other hand, control is executed by a column cycle detecting circuit as shown in FIG. 14 under detection of the cycle.

Figure 15:
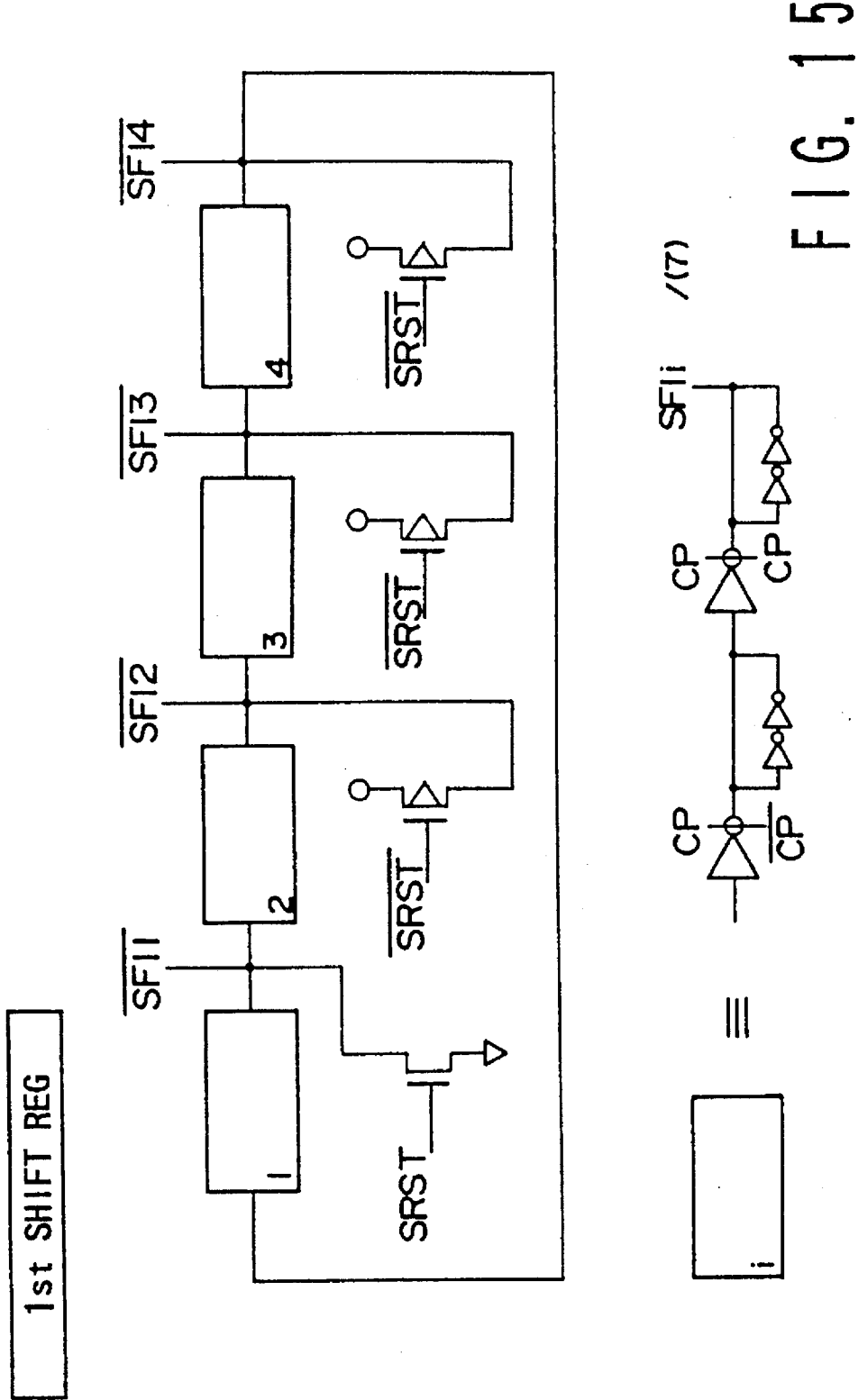
FIG. 15 is a circuit diagram showing a first shift register.
Figure 16:
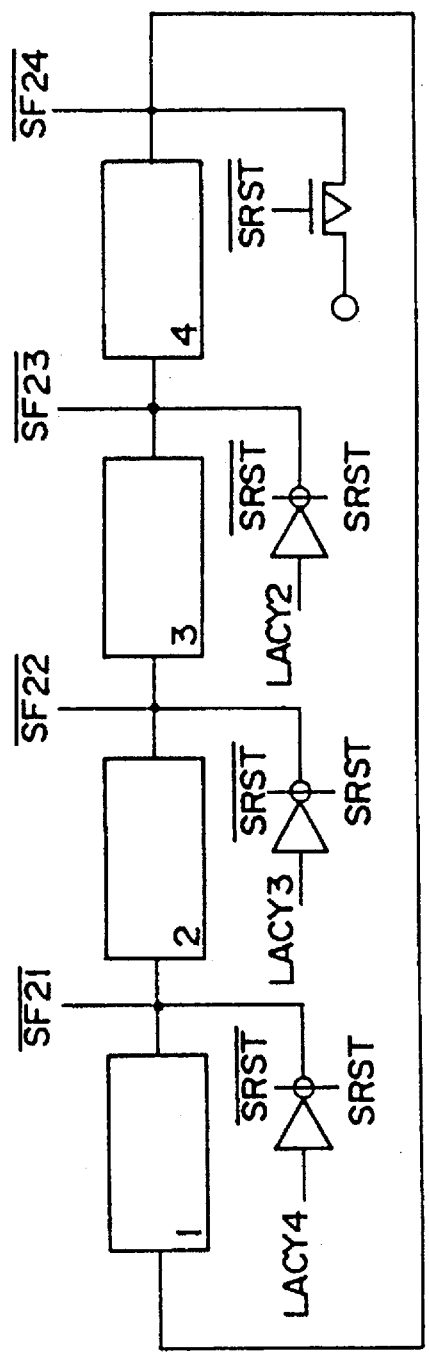
FIG. 16 is a circuit diagram showing a second shift register.
Figure 18:
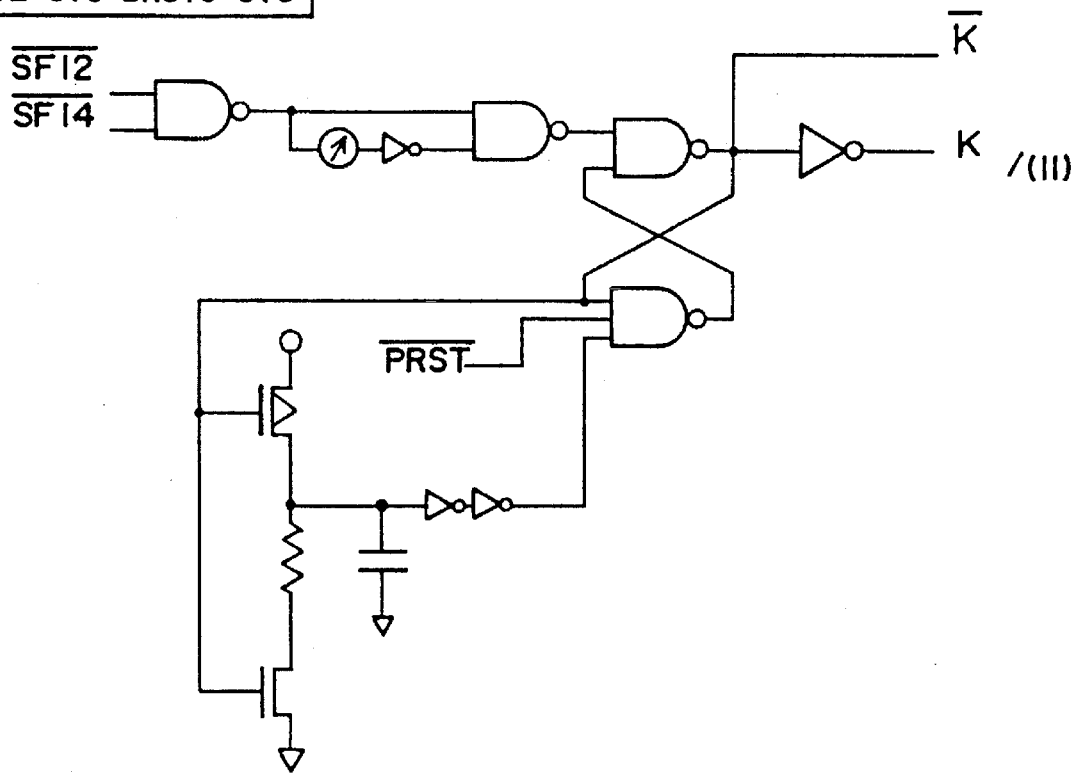
FIG. 18 is a circuit diagram showing a column-system basic signal generating circuit.

Further, a first shift register related to the serial system is configured as shown in FIG. 15, and a second shift register is configured as shown in FIG. 16, respectively. Further, the register group is selected by the configuration as shown in FIG. 17, and the column system basic signal can be generated by the configuration as shown in FIG. 18.

Figure 29:
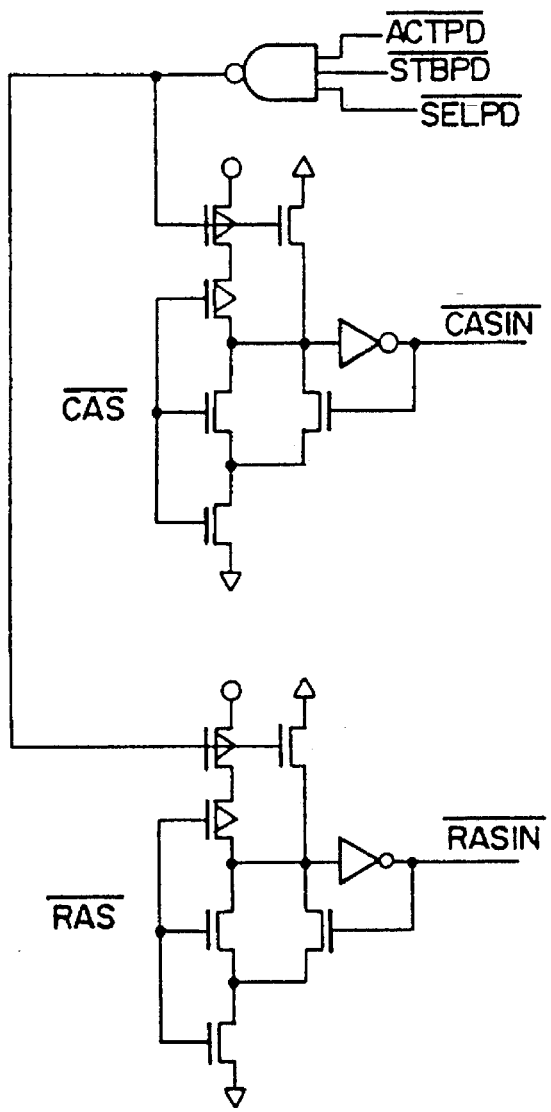
FIGS. 29(A) and 29(B) are a circuit diagram showing a first stage circuit for a serial system.
Figure 29:
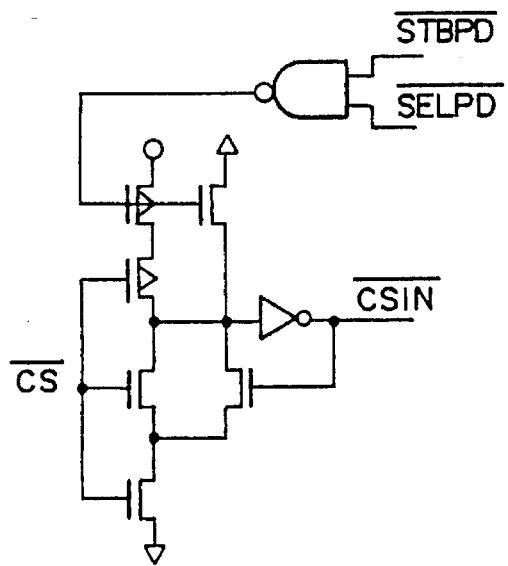
Figure 31:
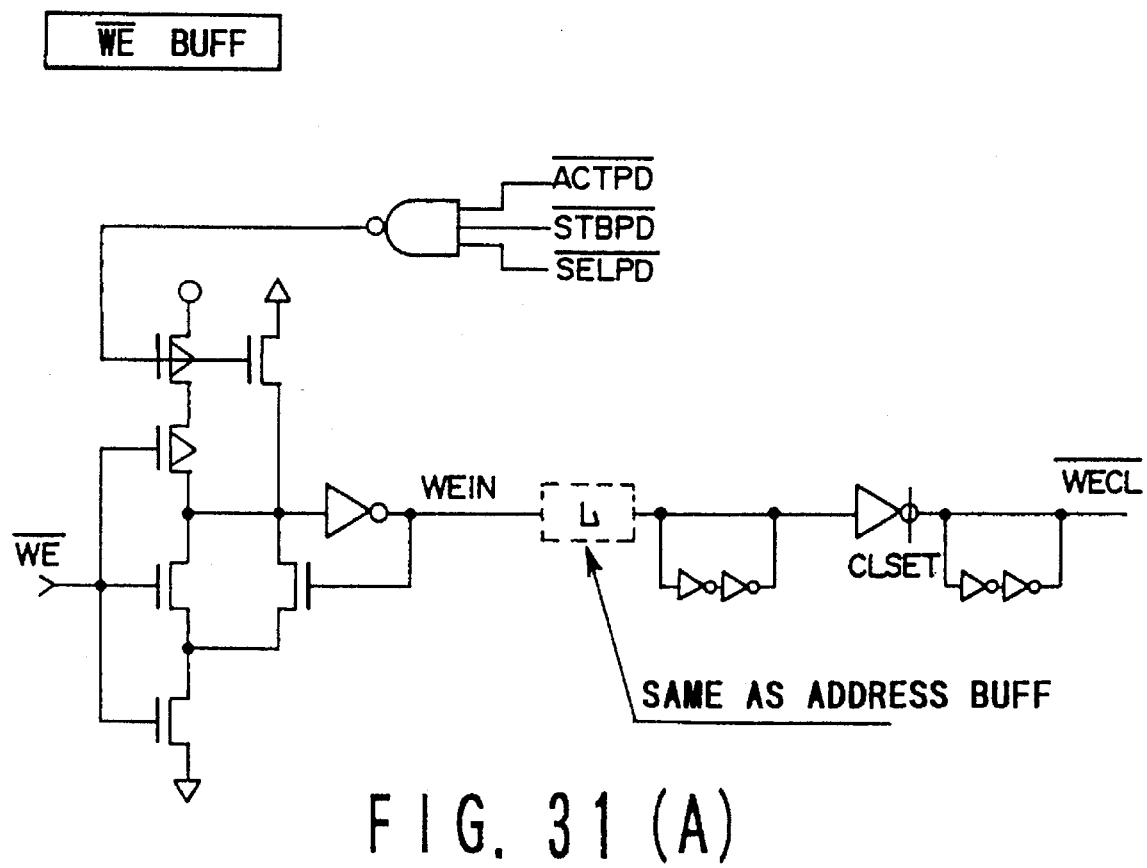
FIGS. 31(A) and 31(B) are a circuit diagram showing a /WE buffer circuit.
Figure 32:
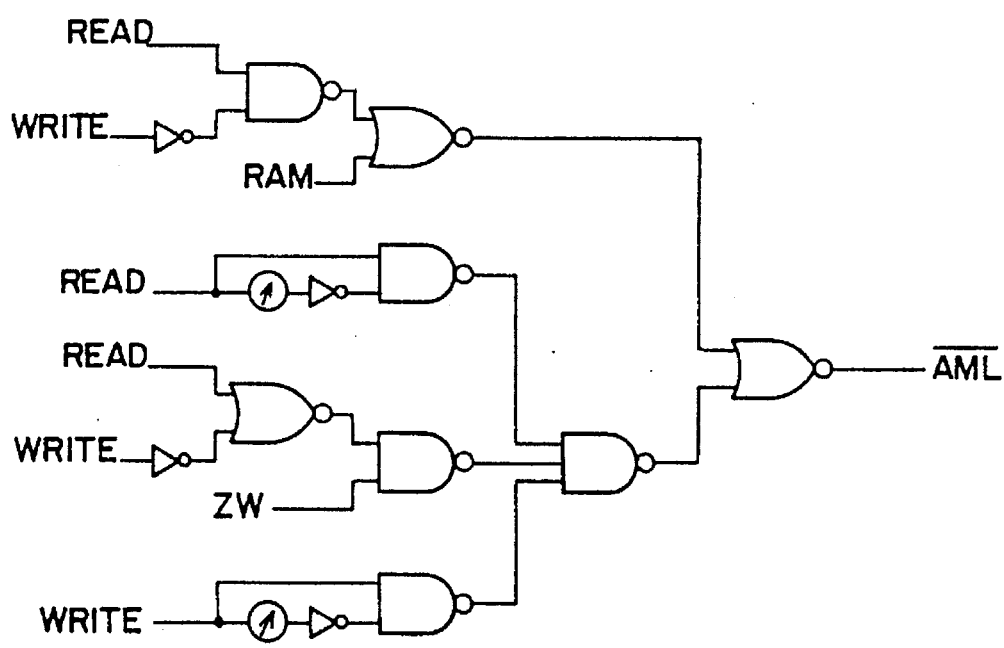
FIG. 32 is a circuit diagram showing an address mode acquisition signal generating circuit.

Further, with respect to the serial system operation, a first stage circuit as shown in FIG. 29, an address buffer circuit as shown in FIG. 30, a /WE buffer circuit as shown in FIG. 31, and an address mode acquisition signal generating circuit as shown in FIG. 32 are used, respectively.

The word masking operation will be explained with reference to Tables 23 and 24. Table 23 explains the word masking for the DQM read of when the latency is "4" and "3"; and Table 24 explains the work masking for the DQM high impedance of when the latency is "2".

First, in the read mode, the latency of the word mask is "1", and the read latency is not present. Further, for masking, it is regarded that the optimum way is to output high impedance data to the output buffers attached to the read data registers. The read data register can be configured by the circuit as shown in FIG. 24.

For this purpose, the respective outputs DQMRi of the DQM read registers as shown in FIGS. 35 and 36 are inputted to respective registers as shown in FIG. 24.

The outputs of the DQM read registers are signals for controlling the impedance (high or low) conditions of the outputs. Therefore, the DQM read registers must be controlled according to the read latency thereof, respectively. This is because the outputs thereof must be high impedance till the first access. The above-mentioned control is executed by the circuit configurations as shown in FIGS. 33 to 38.

The high impedance after the module will be described hereinbelow with reference to Table 25.

When the succeeding column cycle does not start for a time over the module length after the column activation cycle, the outputs are in high impedance state. However, since the serial system must be kept activated, high impedance conditions must be formed irrespective of the DQM values. Therefore, the high impedance must be kept for period of the module length+the latency CLK signal. The high impedance is released in dependence upon the latency by circuits as shown in FIGS. 35 and 36, respectively.

The DQM write will be described with reference to the explanation of Table 26.

The word masking in the write mode is executed in accordance with the method as already explained by circuits as shown in FIGS. 39 and 40. On the other hand, in the case where the write latency is "1", the word masking is executed by circuits as shown in FIG. 40.

The clock masking will be described hereinbelow with reference to the explanation of Table 27.

Figure 41:
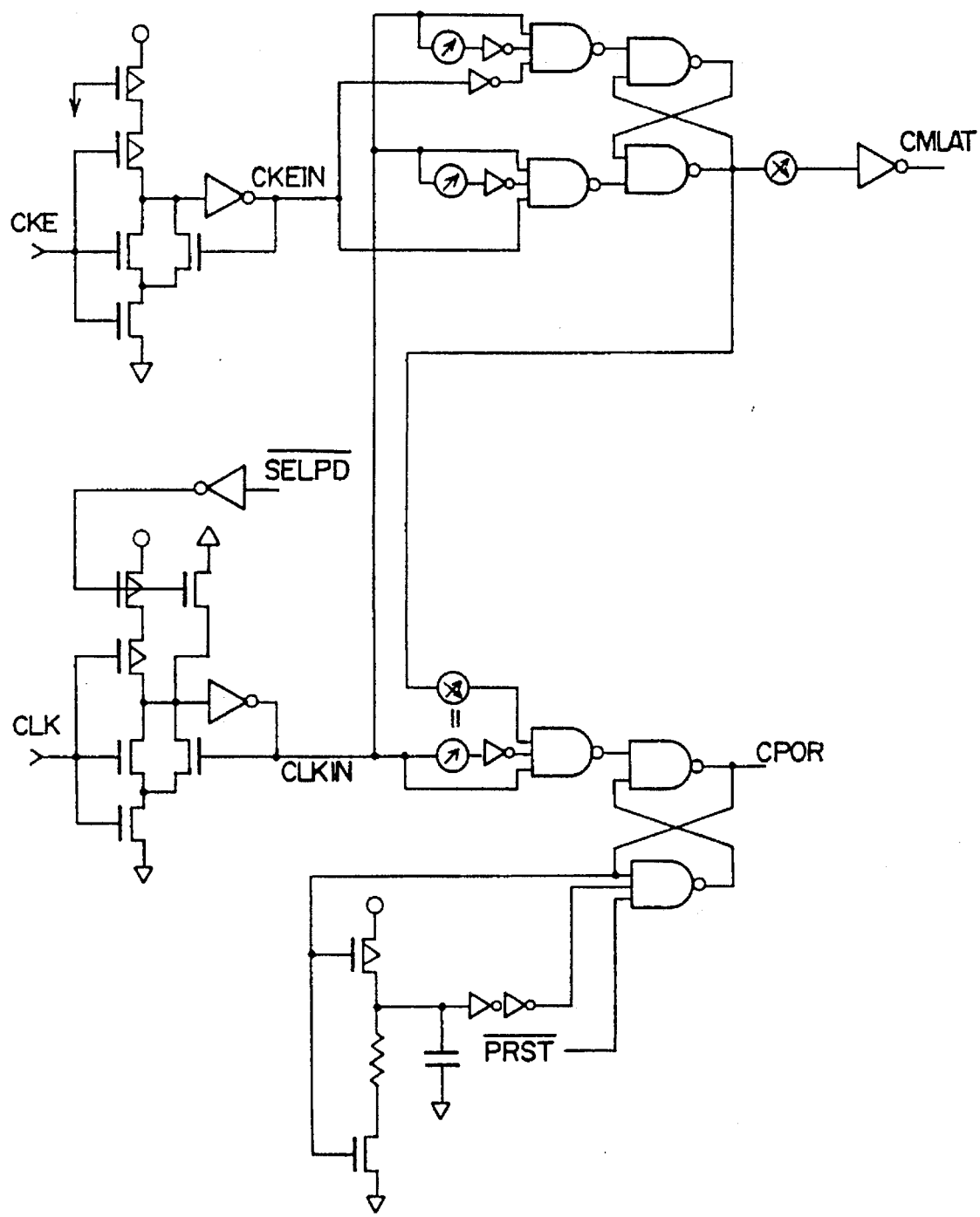
FIG. 41 is a circuit diagram showing a short-period basic signal generating circuit.

In the clock masking, the operation is stopped in a cycle after the cycle in which the signal CKE is at the "L" level. To achieve this operation, the formation of a short period basic signal CPOR is controlled so as to be formed or not according to the status of the CKE signal acquired before one cycle. Further, the statuses of the CKE signals acquired before one cycle are inputted to the respective function detecting circuits except for that of the basic signal CP. When masking is required, the function detecting circuits are kept so as to be not set. The signal CPOR can be generated by a short period basic signal generating circuit as shown in FIG. 41.

The module length related operation will be described hereinbelow with reference to Tables 28 to 33. Table 28 explains the module length detecting operation; Table 29 explains the module operation and module reset releasing operation; Table 30 explains the module length detection resetting operation; Table 31 explains the summary of the module operation in the read and write modes; Table 32 explains the module status resetting operation; and Table 33 explains the column active cycle detecting operation and the operation corresponding to the module length of "1", respectively.

In the read mode, the cycle in which the data of the module length are outputted can be set as the end of the module length. In the write mode, the cycle in which the data of the module length are inputted can be set as the end of the module length.

On the assumption as described above, in the read mode, the final data access begins from the read data register gate GR2 or GR4 on the basis of the register configuration. Further, since the register group for outputting the final data controls the read registers as already explained, the final data access is determined by only the module length, irrespective of the read latency.

The same can be applied to the case of the write mode.

In summary, it is possible to discriminate the register for implementing the final data access by detecting which register REG1 or REG2 is at the "L" level in the column access cycle. Since the module length is started to be counted for each column access cycle, the register is reset for each column access cycle. Further, in the case of the module length, when the counter (described later) is operated, the operation is the same as with the case where the module length is "8". For the above-mentioned operation, circuits as shown in FIGS. 42 to 49 are adopted.

The burst stop will be described with reference to Table 34.

Figure 50:
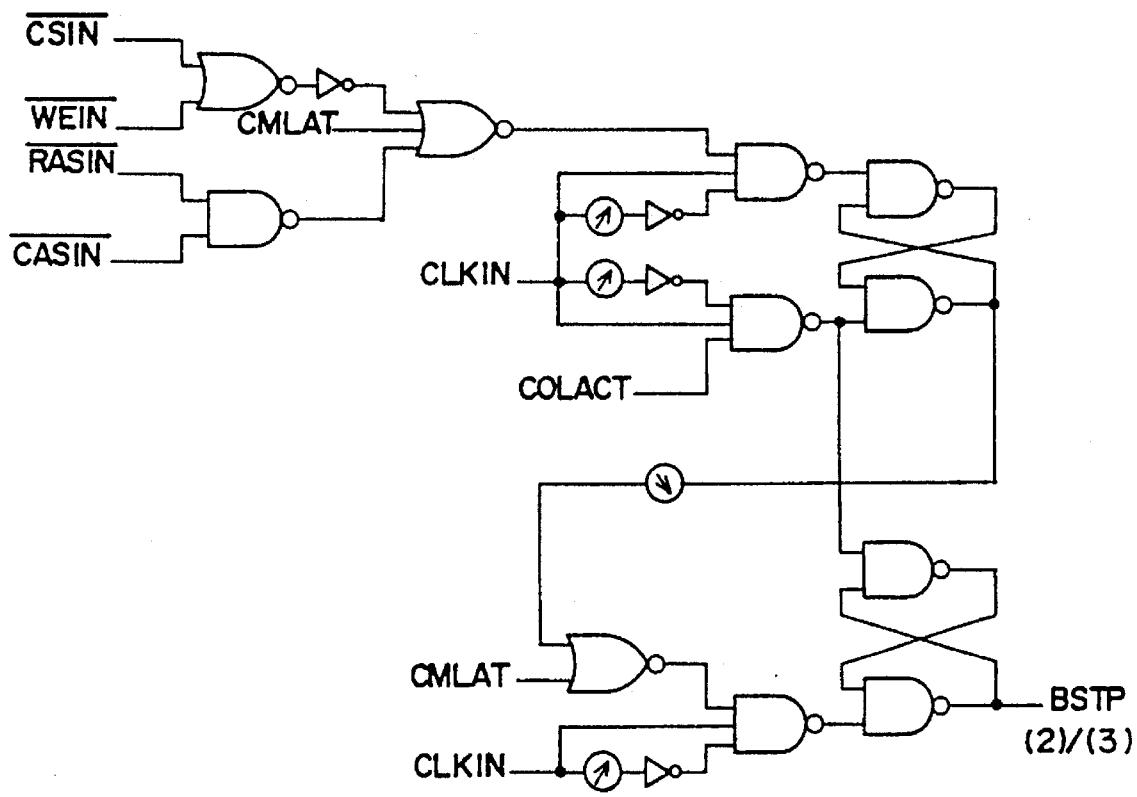
FIG. 50 is a circuit diagram showing a burst stop command detecting circuit.

The burst stop operation is achieved by disabling the serial system in a cycle after the cycle in which a burst stop command is inputted during the burst cycle. In the above-mentioned burst stop operation, in order to stop the burst in any given burst cycle, a burst stop command detecting circuit as shown in FIG. 50 is used.

The operation of the column system will be described hereinbelow with reference to Table 35.

Figure 51:
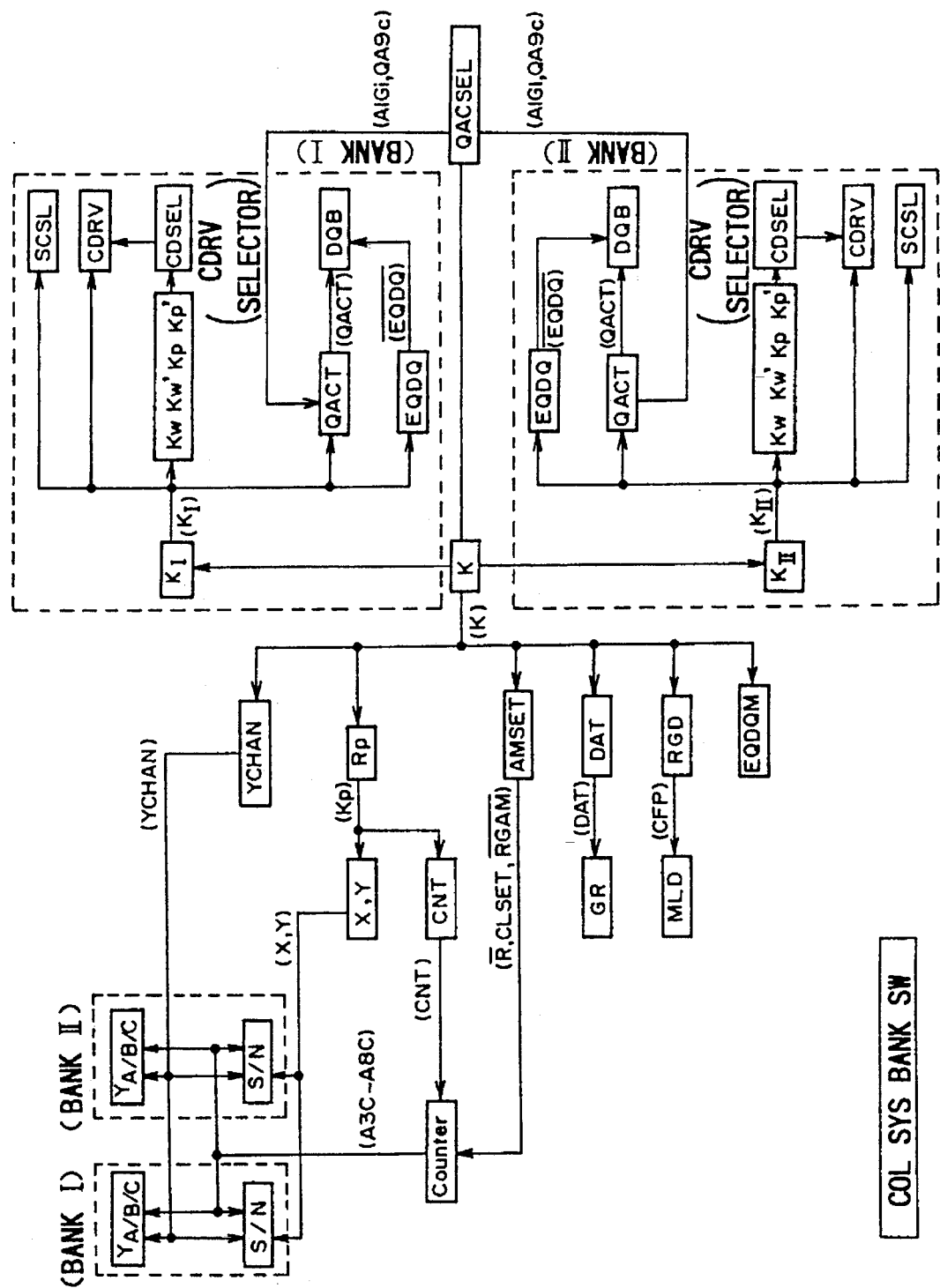
FIG. 51 is a circuit diagram showing a column-system bank switching circuit.

In the column system, a column system bank switching circuit as shown in FIG. 51 is applied. The entire switching circuit is controlled by the main pass activation signal K, and further the main pass activation signal K corresponding to the bank side activated in the column access cycle is also activated.

However, the main pass activation signal K not decoded on the basis of the bank designation signal is used for the other circuits not belonging to the respective banks.

The column system is so configured as to provide the scramble; that is, so as to correspond to an addressing mode, which is one of the features of the SDRAM. Tables 2 to 6 list how to change the lower order significant address bits and how to activate the column select lines, the DQ buffers and the data registers according to the change in the lower order significant address bits in correspondence to the scramble.

Figure 55:
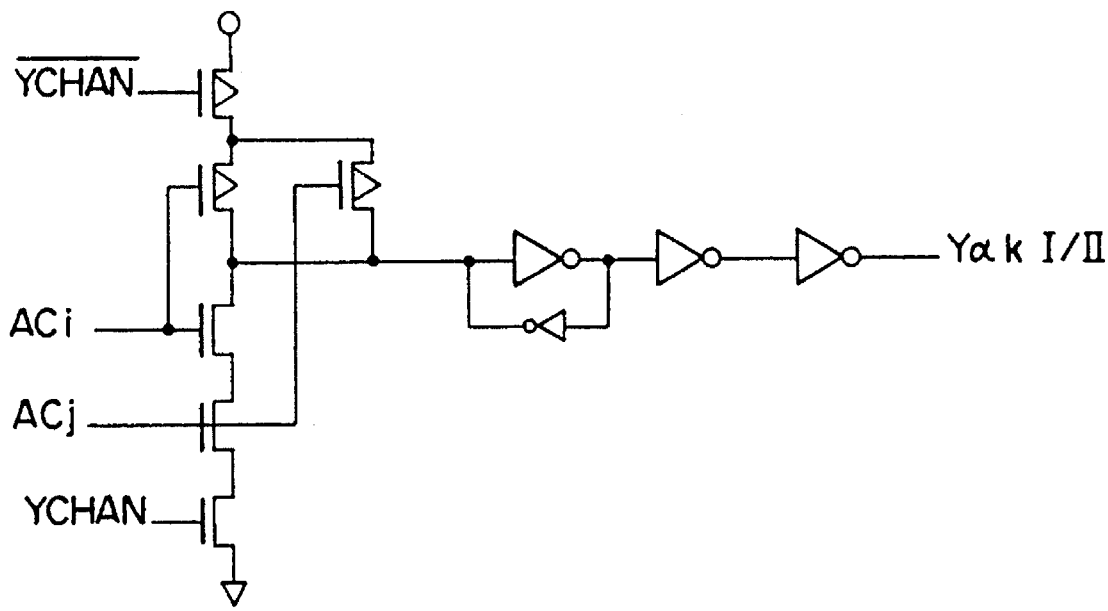
FIG. 55 is a circuit diagram showing a column partial decoder.
Figure 56:
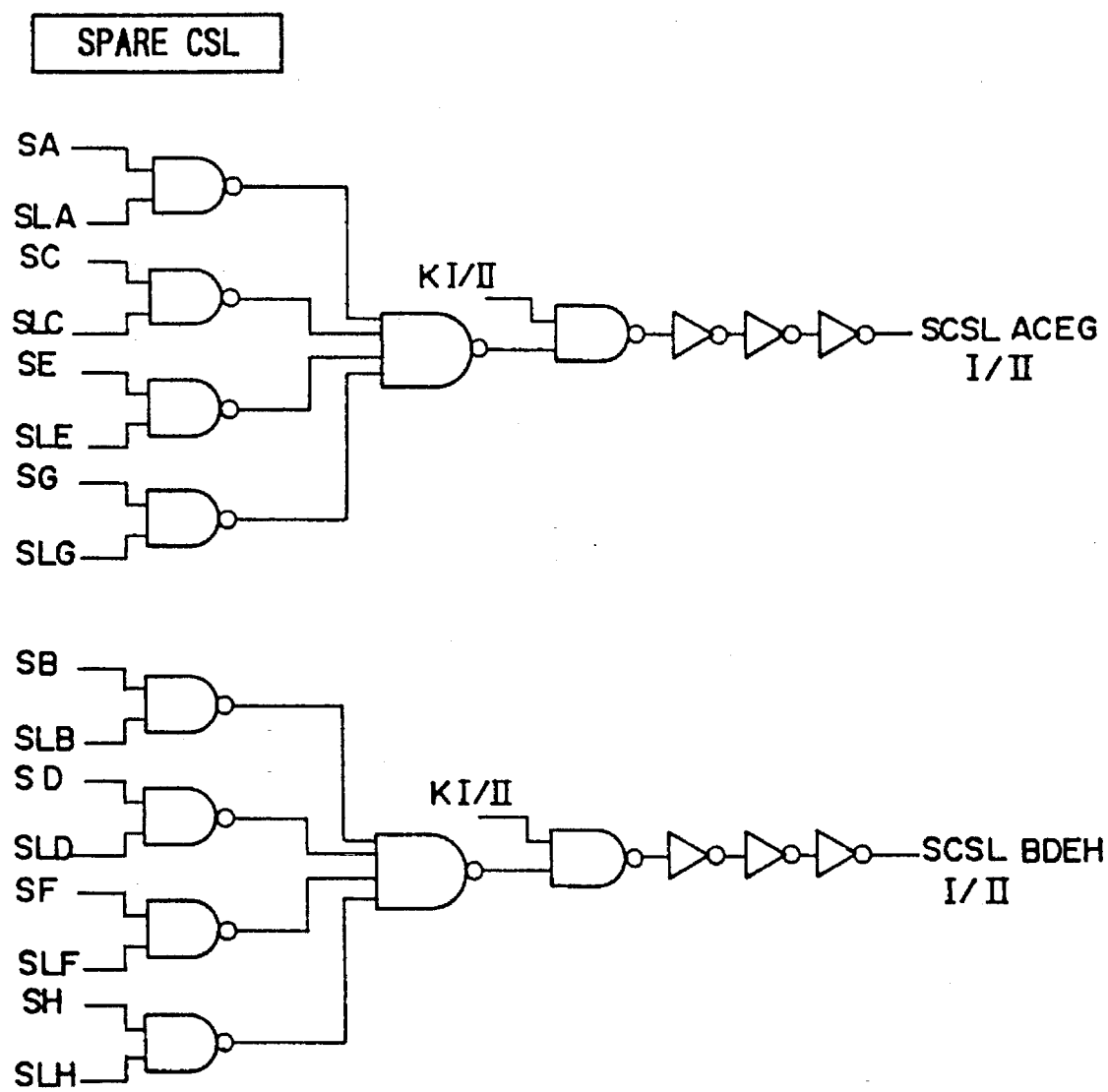
FIG. 56 is a circuit diagram showing a spare CSL.
Figure 57:
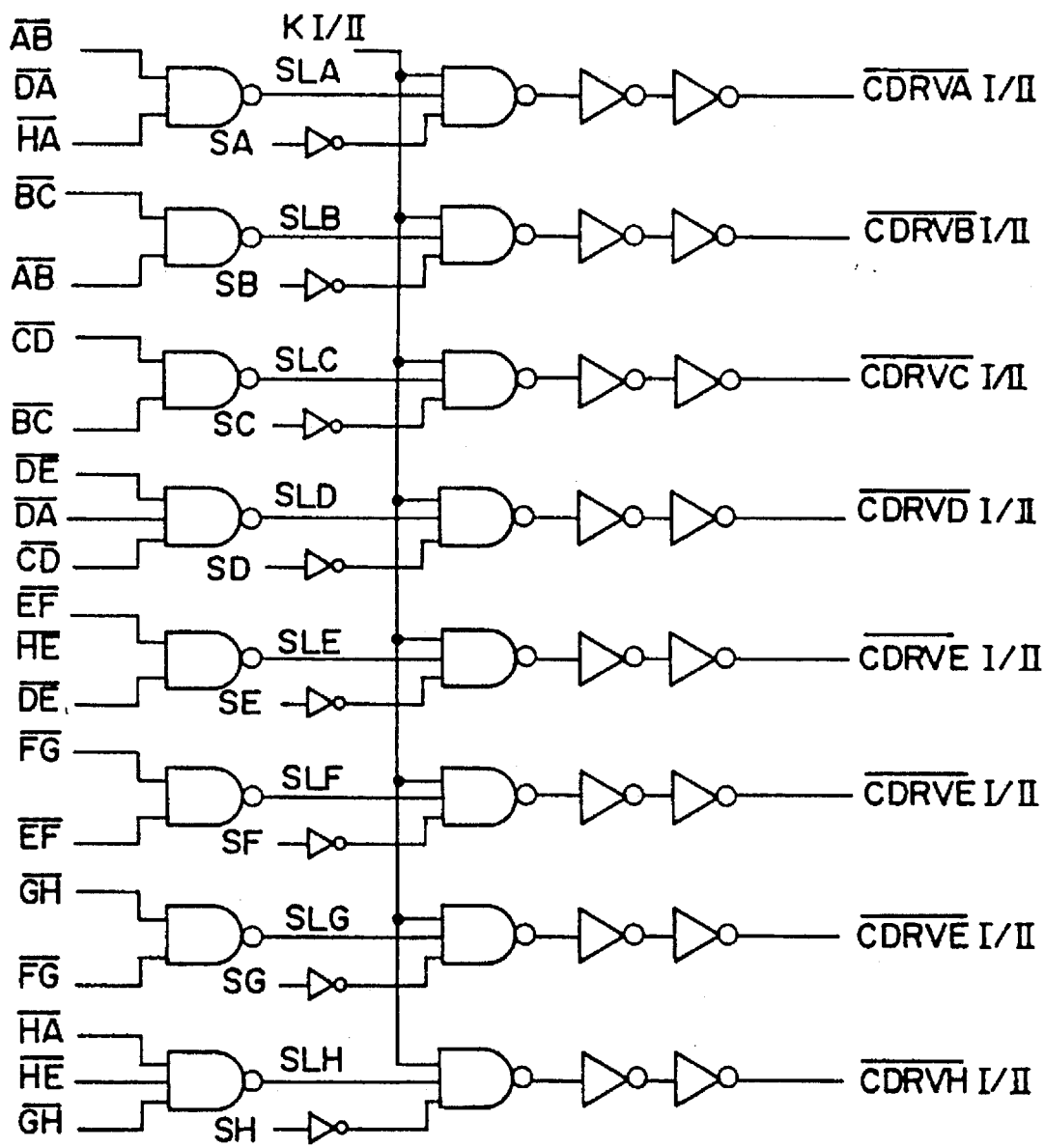
FIG. 57 is a circuit diagram showing a CSL driver.

In the respective tables, the portions divided by arrows, respectively correspond to two clock signals CLK in the one-bit lower cycle K. Further, the register scramble implies the way of selecting the transfer signals when data are transferred to or from the data registers shown in FIGS. 23 or 26. Further, in the respective tables, although the addresses of the lower bits A0, A1 and A2 are explained, the addresses higher than A3 can be decoded by the column address decoder as shown in FIG. 54. This column decoder is decoded by a column partial decoder as shown in FIG. 55. Further, in order to realize the operation of the column select lines as listed in Tables 2 to 6, the circuits as shown in FIGS. 56 to 61 are applied. FIG. 56 shows a spare CSL and FIG. 57 shows a CSL driver, respectively.

The column system address will be described hereinbelow with reference to Table 36.

Figure 62:
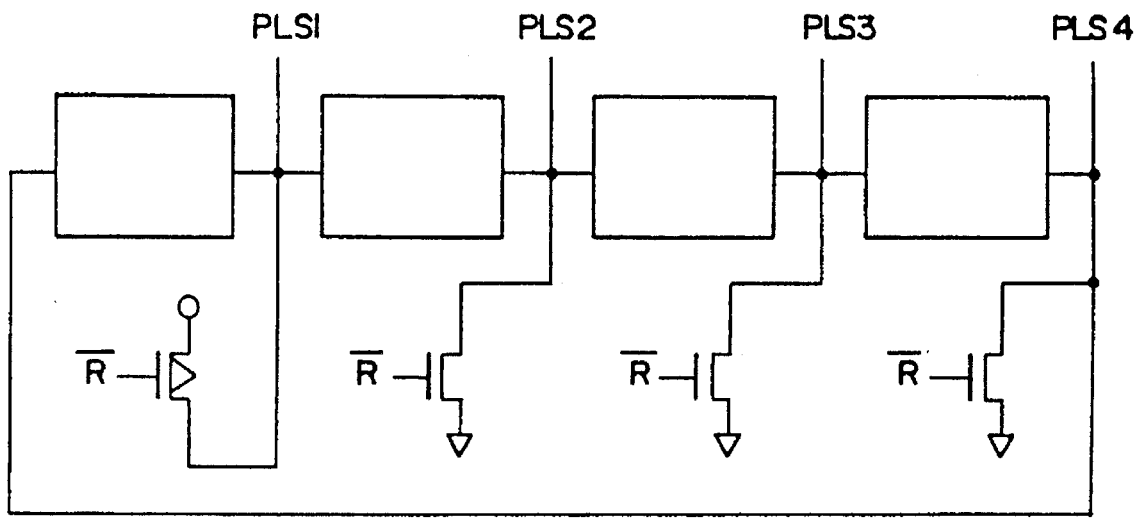
FIGS. 62(A) to 62(C) are a circuit diagram showing an address-change basic pulse generating circuit.
Figure 62:
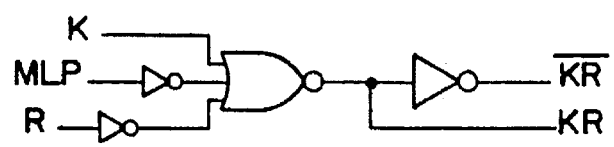
Figure 62:
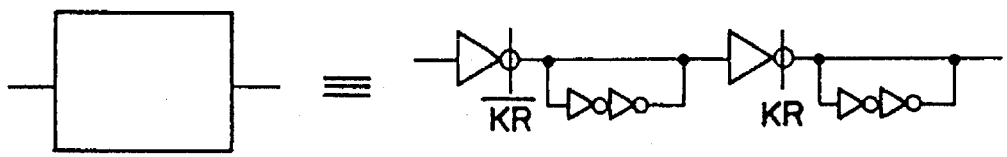
Figure 63:
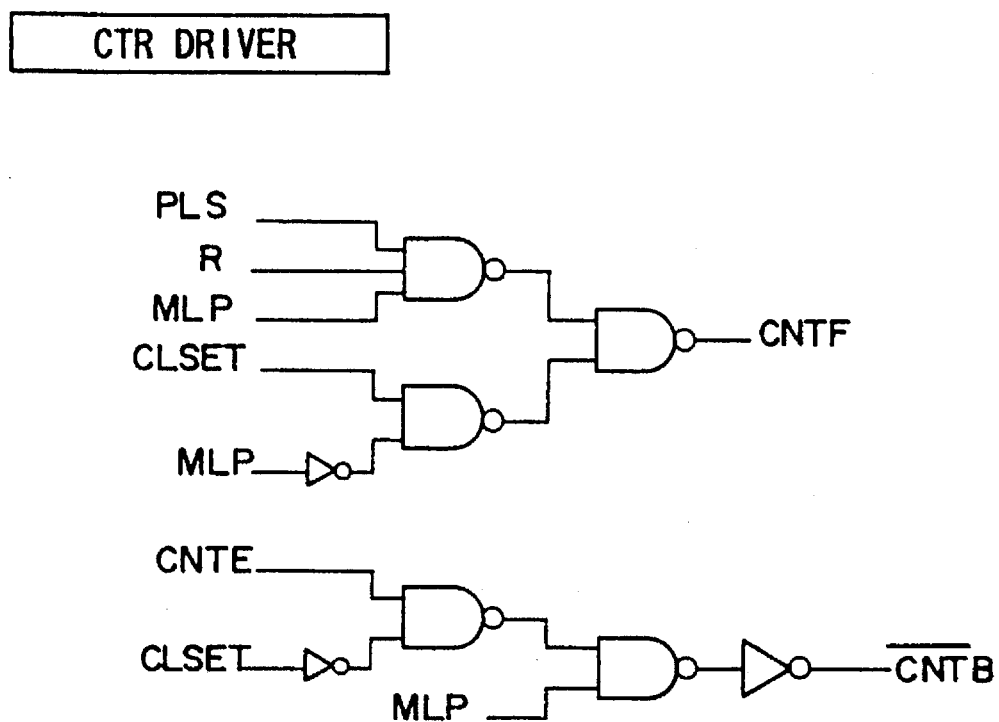
FIG. 63 is a circuit diagram showing a counter driver circuit.
Figure 65:
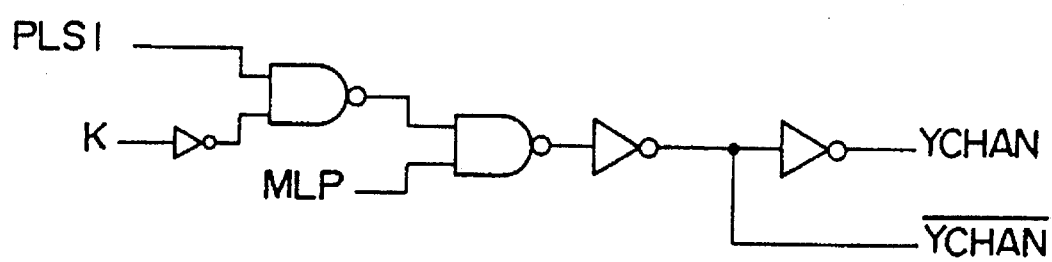
FIG. 65 is a circuit diagram showing a partial decode S/N discriminate result acquisition signal generating circuit.
Figure 67:
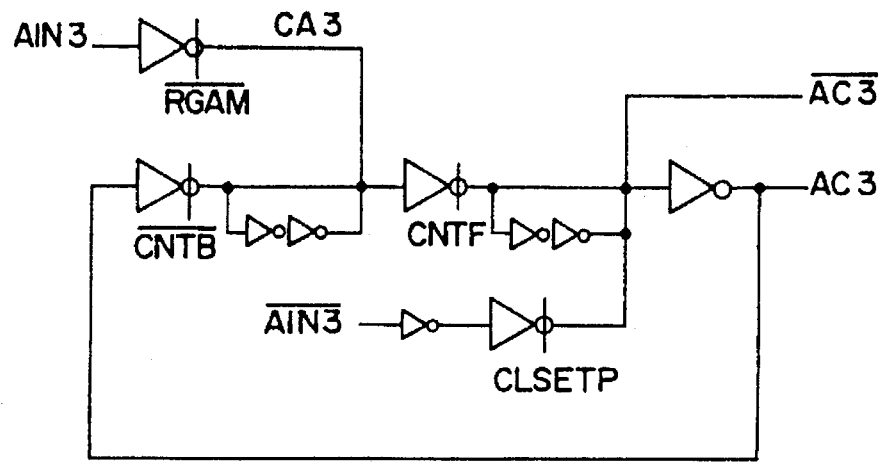
FIG. 67 is a circuit diagram showing a second part of the address counter circuit.
Figure 68:
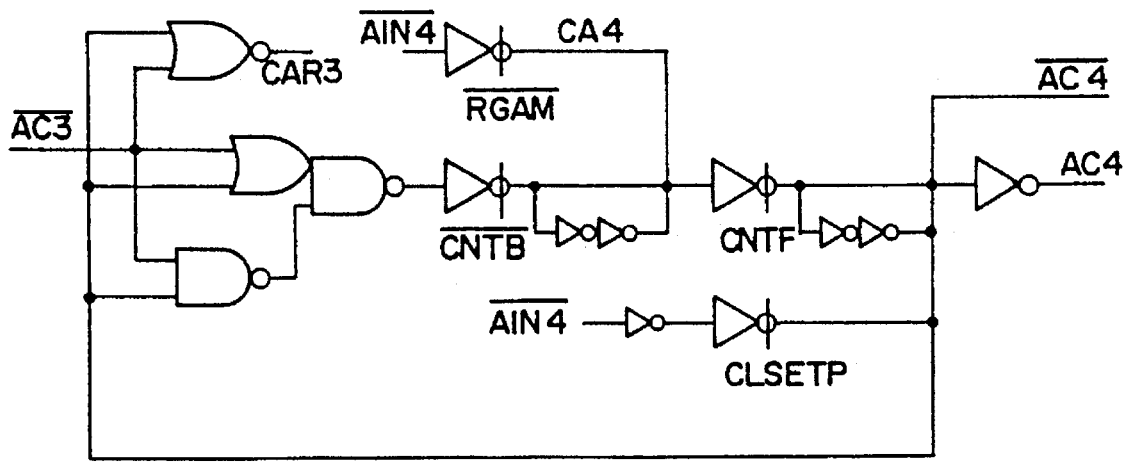
FIG. 68 is a circuit diagram showing a third part of the address counter circuit.
Figure 69:
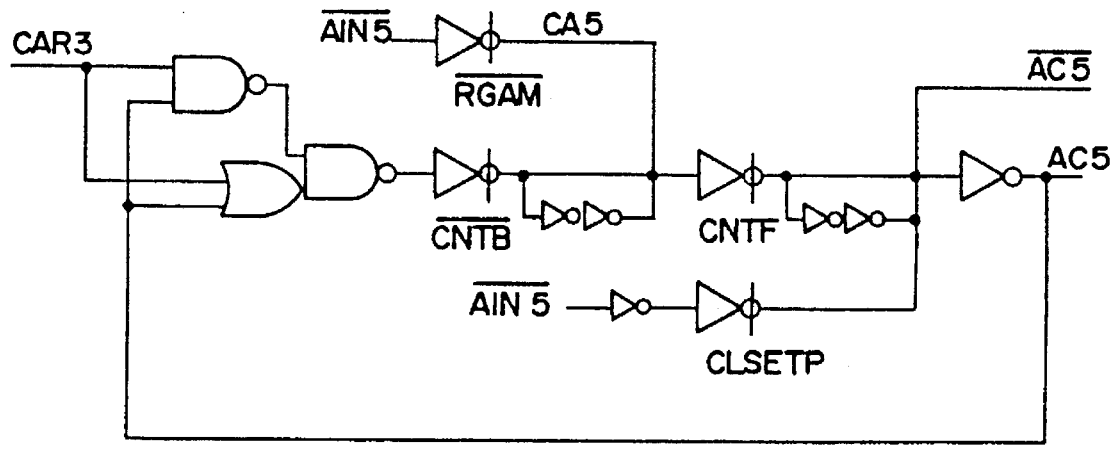
FIG. 69 is a circuit diagram showing a fourth part of the address counter circuit.
Figure 70:
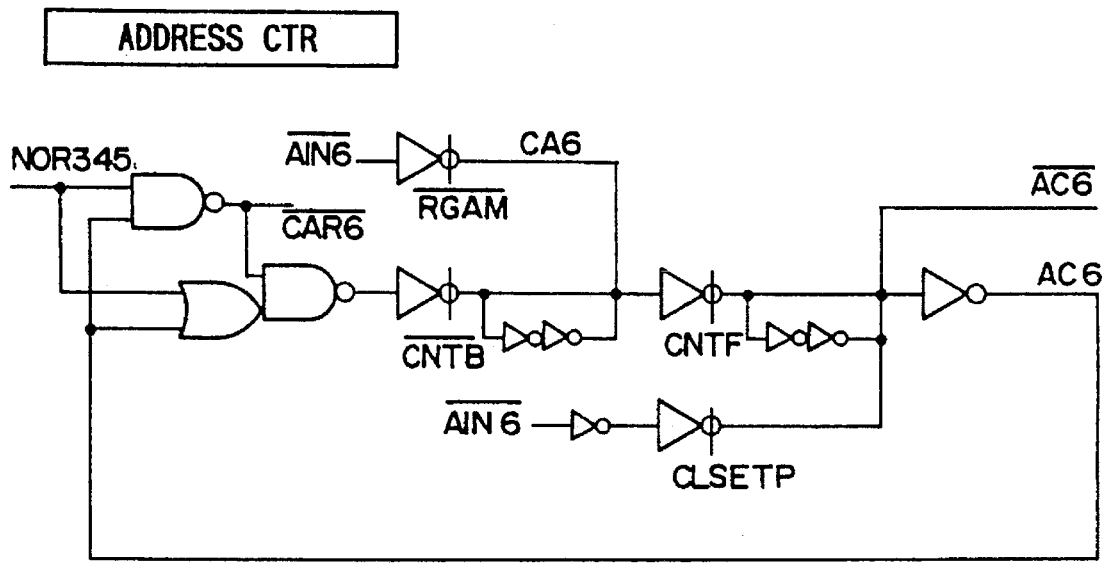
FIG. 70 is a circuit diagram showing a fifth part of the address counter circuit.
Figure 73:
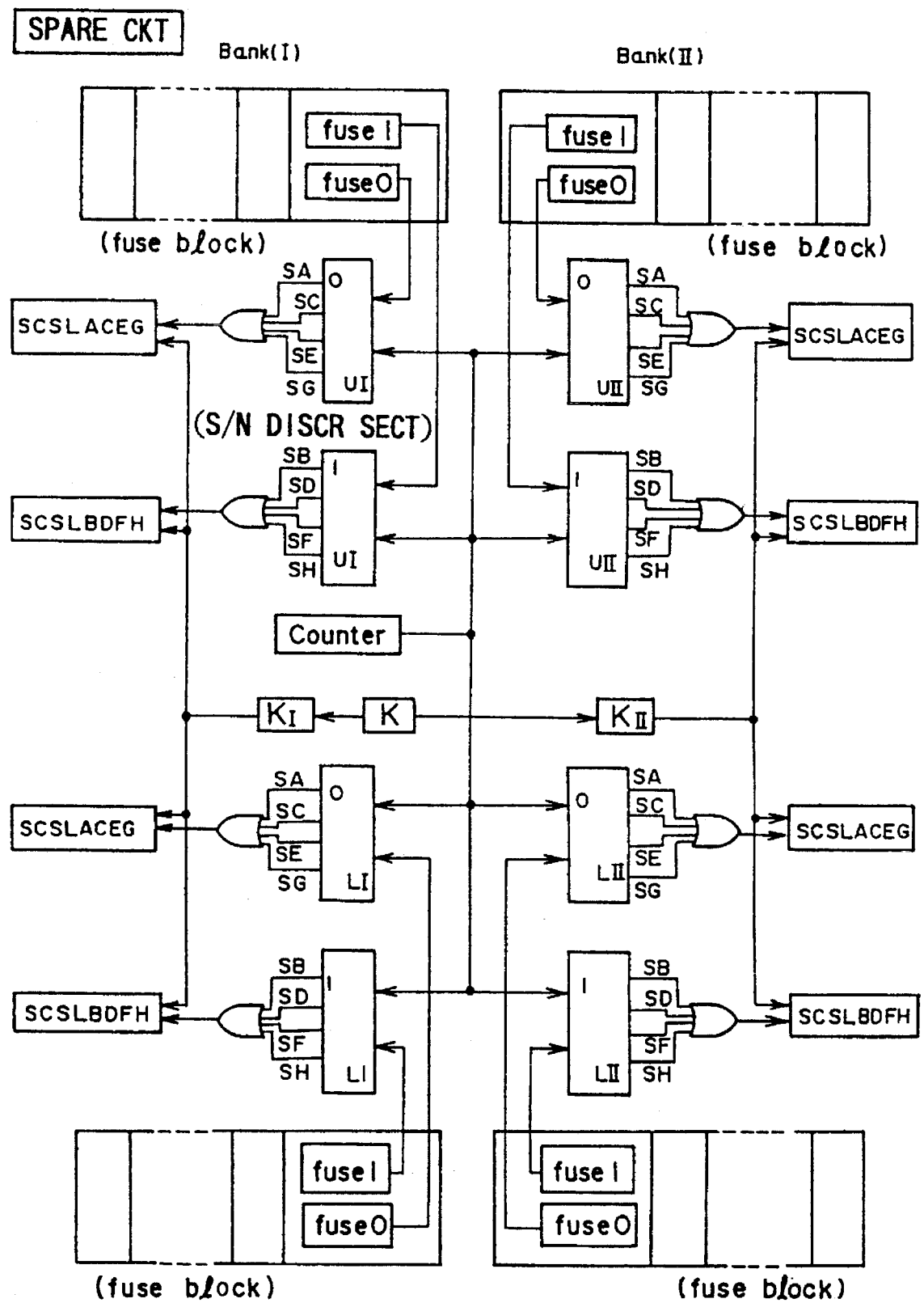
FIG. 73 is a circuit diagram showing a spare circuit.
Figure 74:
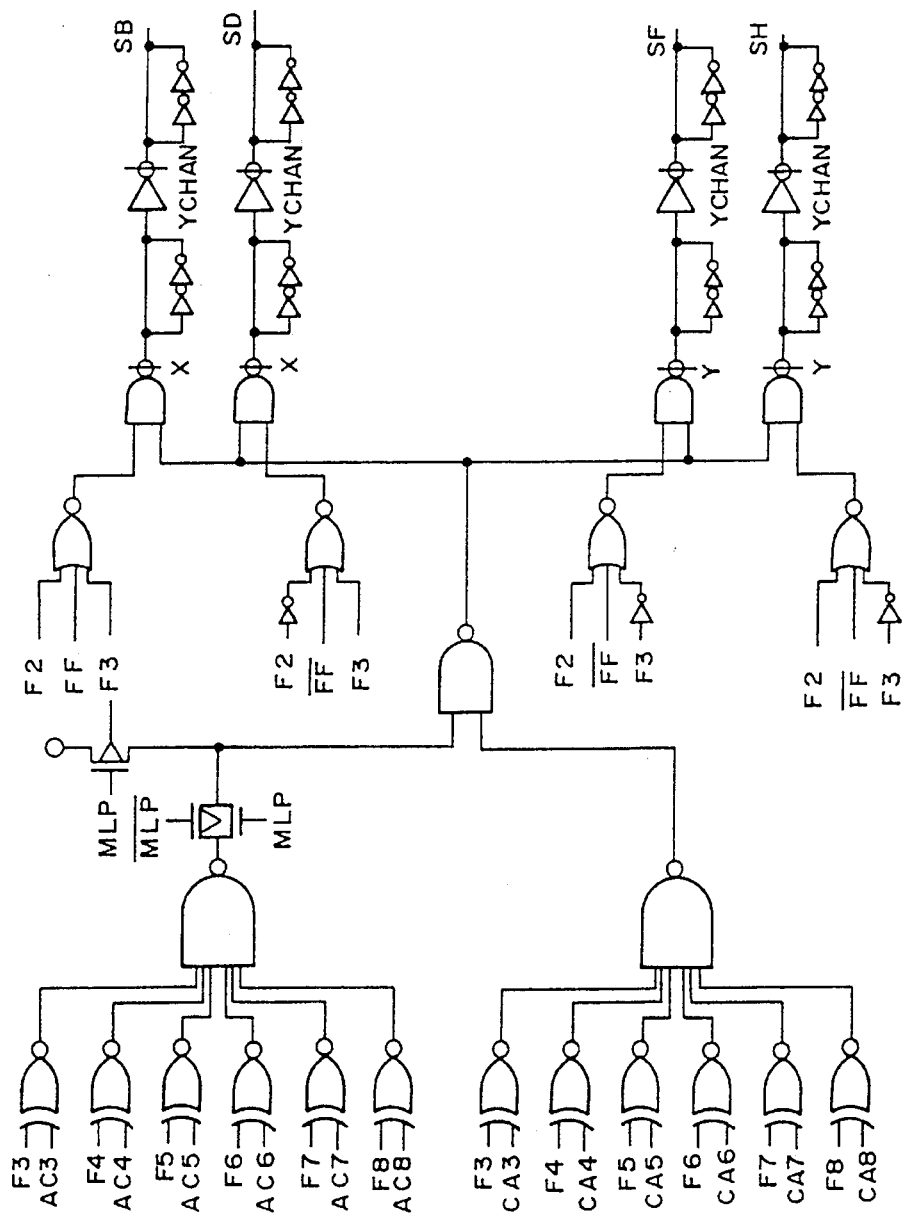
FIG. 74 is a circuit diagram showing an (A1c="1")-side S/N discriminating circuit.

With respect to the column address, the addresses are generated or the spare circuit is operated by the configurations as shown in FIGS. 62 to 75. FIG. 62 shows an address-change basic pulse generating circuit; FIG. 63 shows a counter driver circuit; FIG. 64 shows a spare select signal generating circuit; FIG. 65 shows a partial decode S/N discriminate result acquisition signal generating circuit; FIG. 66 shows a first part of the address counter circuit; FIGS. 67 to 72 show the other address counter circuits; FIG. 73 shows a spare circuit; FIG. 74 shows an (A1c="1")-side S/N discriminating circuit; and FIG. 75 shows an (A1c="0")-side S/N discriminating circuit, respectively.

First, the counter generates column addresses at which the partial decode signals are changed for each 8 cycles in the page mode. In the modes other than the page mode, since no count-up operation by the counter is required, it is unnecessary to transmit a carry. Therefore, in the page mode, a head address is set to the counter output on the basis of a signal CLSETP in the column access cycle. In the burst cycle, the counter begins to operate between the fifth cycle and the eighth cycle after the column access cycle.

The count-up cycle in the burst cycle in the page mode can be detected by a circuit as shown in FIG. 62, and the counter is directly driven by a circuit as shown in FIG. 63. The counters are connected as shown in FIG. 66, and the counters are configured as shown in FIGS. 67 to 72, respectively for implementing the desired address counting operation.

In the page mode, the column spare circuit executes the spare/normal discrimination without delay caused by the spare circuit operation. For this purpose, the address counter is first operated; a spare address is compared with an address outputted next; and the address is discriminated before the actual address is used. Further, in the page mode, the column decoder corresponding to the head address and the column decoder corresponding to the next address are both activated. Therefore, one of the discriminated results of both the decoders is determined by a circuit as shown in FIG. 64.

The switching of the partial decode signals and the S/N discrimination result acquisition by the column system address will be described hereinbelow with reference to Table 37.

The spare/column discrimination signal and the column partial decode signal are changed at 8 cycle intervals after the column access cycle. The spare/normal discriminating circuit is connected to another circuit, as shown in FIG. 73, and configured as shown in FIGS. 74 and 75. In the modes other than the page mode, since the column decoders will not be changed in the burst cycle, a switching signal as shown in FIG. 65 is kept at a constant value.

The switching operation between 4-bit and 8-bit in the column system data access will be described hereinbelow with reference to Tables 38 to 40. Table 38 the change between X4 and X8 and the decode of A9c in the X4; Table 39 explains the X4 page; and Table 40 explains the QACT control and the A9c control, respectively.

FIG. 76 shows the addresses and the output numbers corresponding to the respective cell arrays in the 8-bit, and FIG. 77 shows the addresses and the output numbers corresponding to the respective cell arrays in the 4-bit, respectively. To switch X8 to X4 or vice versa, the connection between the RWD lies and the DQ buffers are changed as listed in Table 9.

First, when the X8 is switched to the X4, the signal QACT for activating the DQ buffer is decoded. In the case of the page length of X4, as listed in Table 10, there exists the case where the two cell arrays are accessed. In this case, however, the QACT0 and QACT3 are both activated securely.

Figure 79:
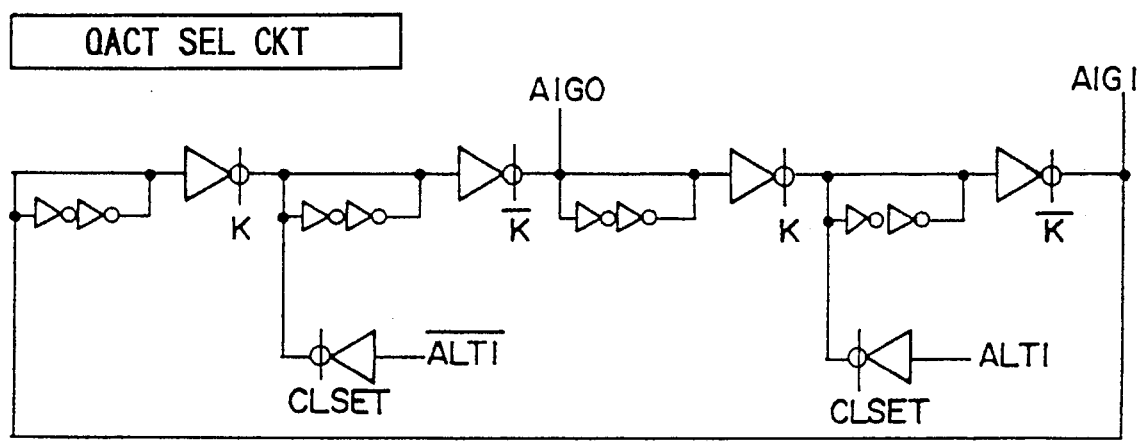
FIG. 79 is a circuit diagram showing a QACT selecting circuit.
Figure 80:
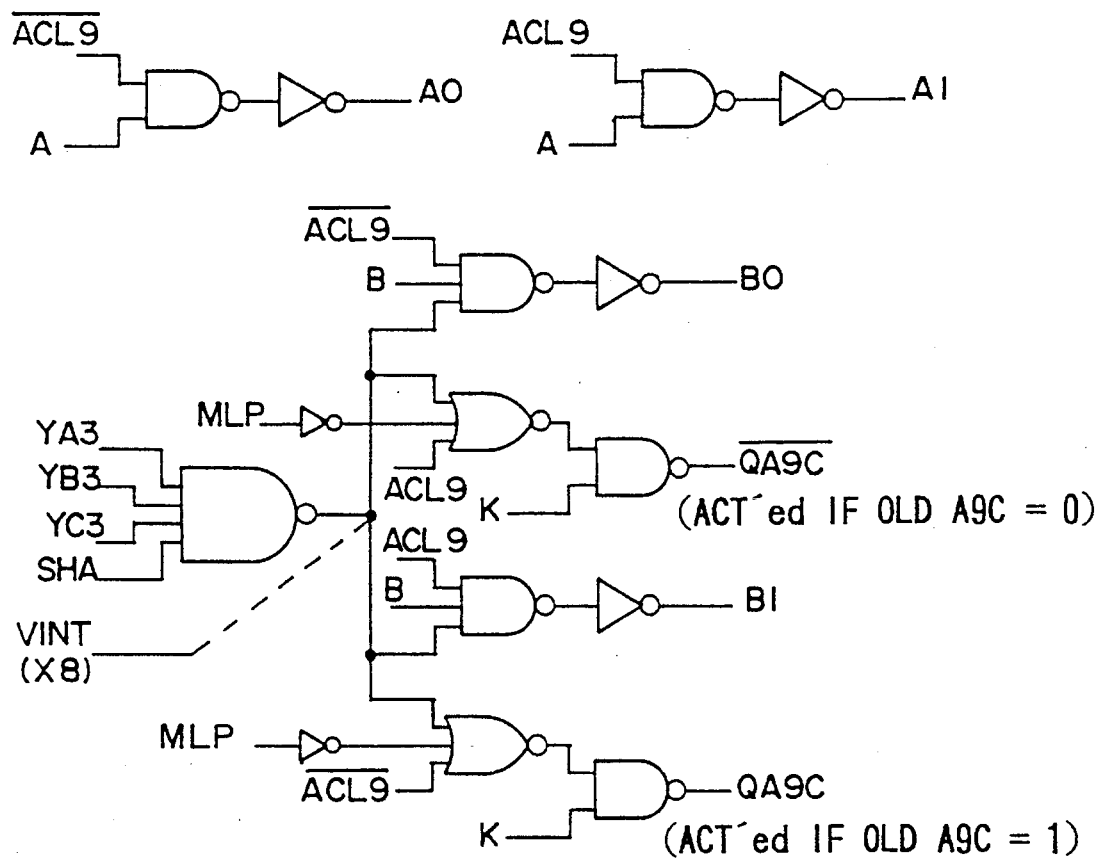
FIG. 80 is a circuit diagram showing a QACT selecting circuit.
Figure 81:
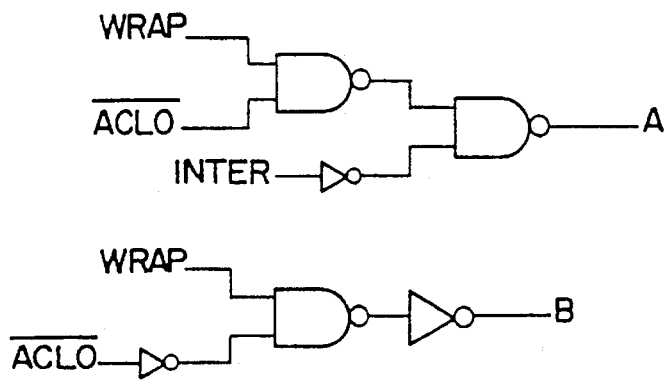
FIG. 81 is a circuit diagram showing a QACT selecting circuit.
Figure 82:
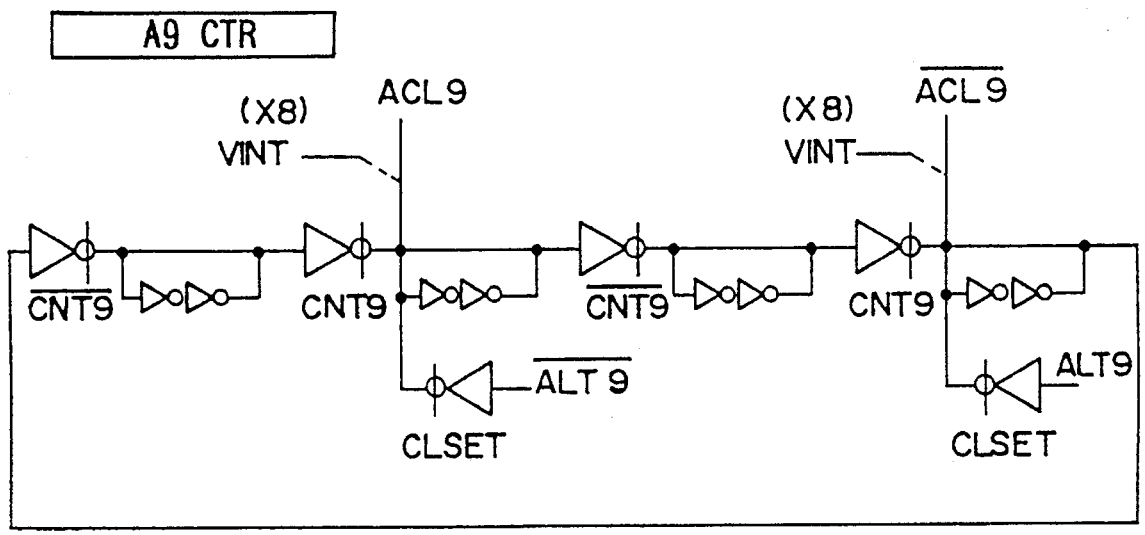
FIG. 82 is a circuit diagram showing an A9 counter circuit.
Figure 83:
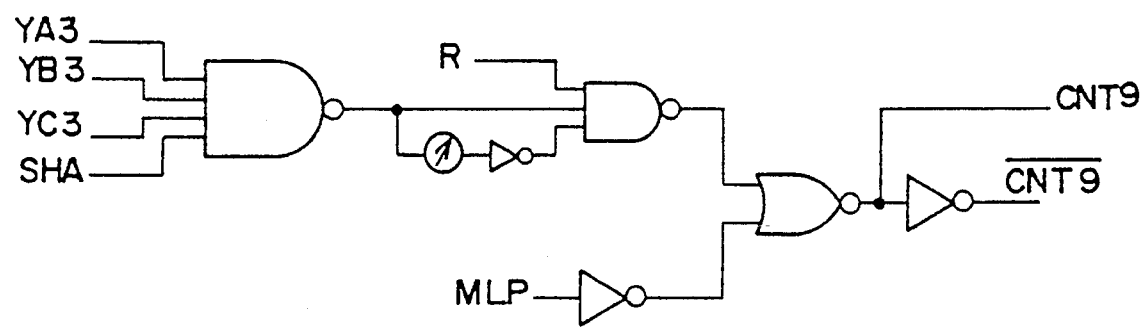
FIG. 83 is a circuit diagram showing an A9 counter circuit.

The signals QACT0 exist in the cell arrays to be accessed subsequently and the signals QACT3 exist in the cell arrays to be accessed previously. Therefore, the addresses A9c of the cell arrays to be accessed previously and subsequently are latched, and the timings at which two cell arrays are accessed are detected. These operations are executed by the circuits as shown in FIGS. 79 to 83. Here, FIGS. 79, 80 and 81 show QACT selecting circuits; FIG. 82 shows an A9 counter; and FIG. 83 shows an A9 counter driving circuit, respectively.

Further, FIG. 84 shows a DQ buffer; FIG. 85 shows a DQ line read control circuit;

FIG. 86 is a circuit diagram showing a DQ line write control circuit; FIG. 87 shows a DQ line read control circuit in an A9c and /A9c coexistent section; and FIG. 88 shows a DQ write control circuit of in the A9c and /A9c co-existent section.

Further, the column system bank switching is executed by a circuit as shown in FIG. 51, and the column system selection is executed by a circuit as shown in FIG. 52. Further, when the KI/KII are used as the opposite phase signals, a circuit as shown in FIG. 53 is used.

Figure 93:
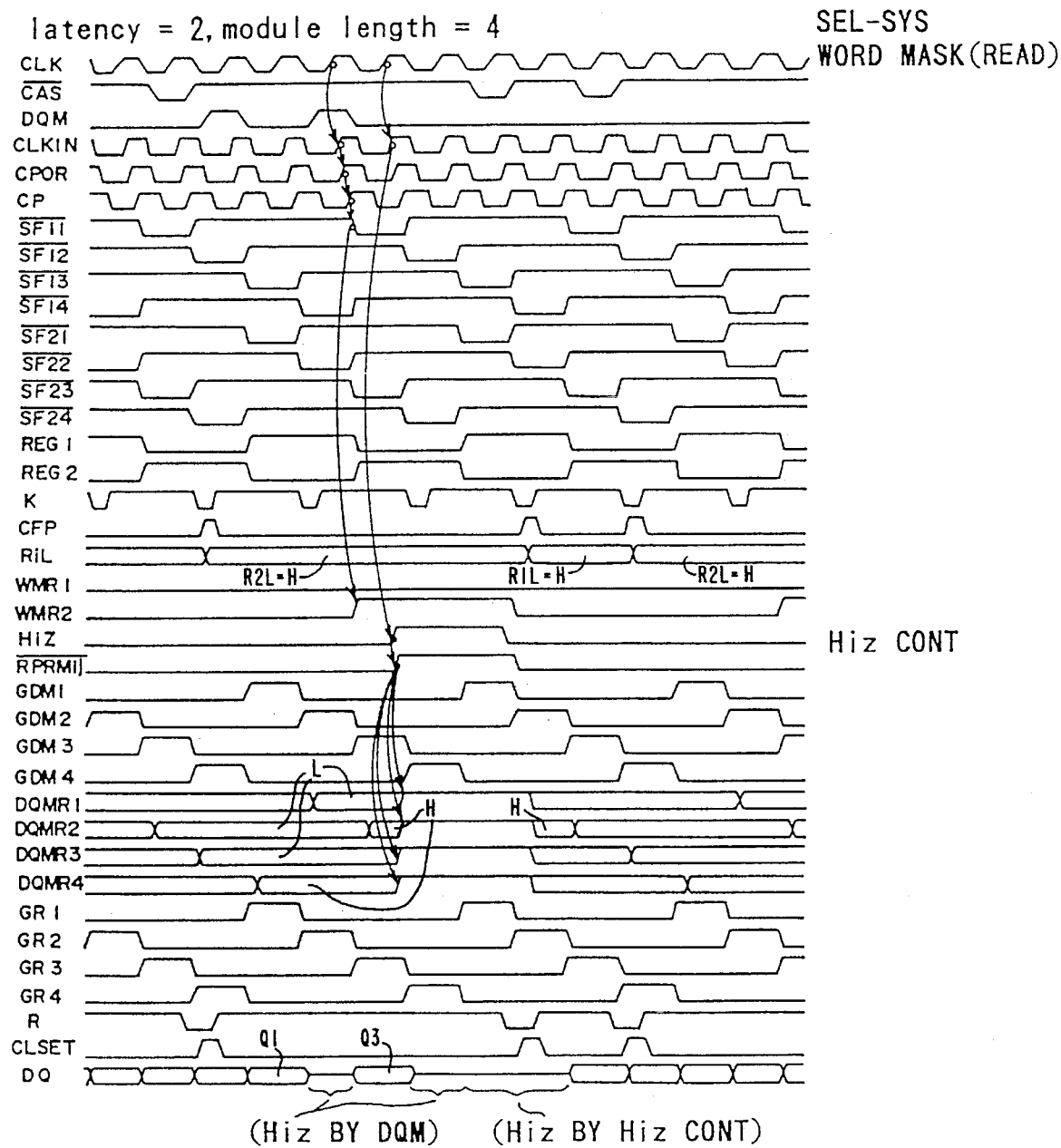
FIG. 93 is a timing chart for assistance in explaining the detailed operation of the embodiment according to the present invention.
Figure 94:
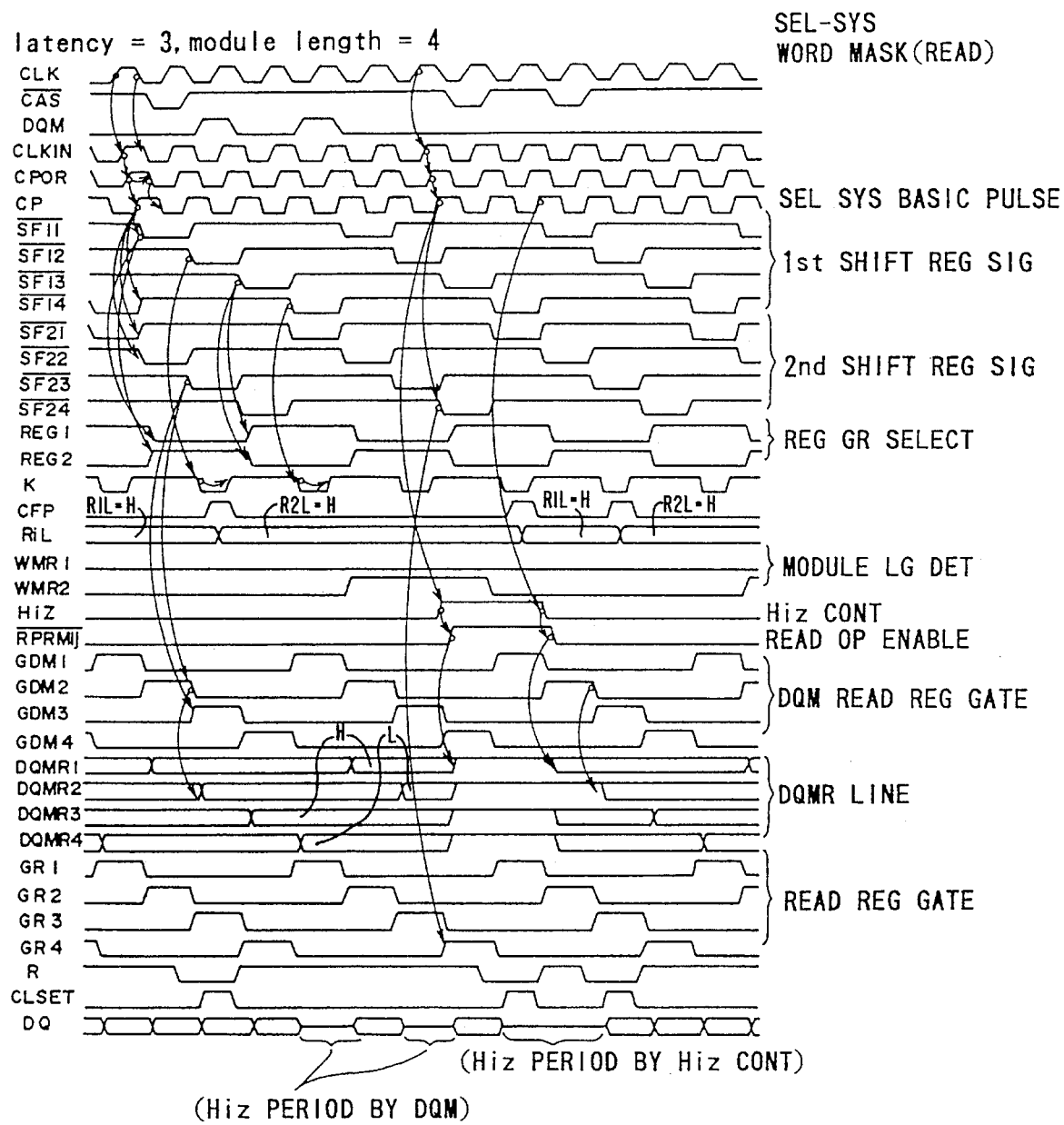
FIG. 94 is a timing chart for assistance in explaining the detailed operation of the embodiment according to the present invention.
Figure 95:
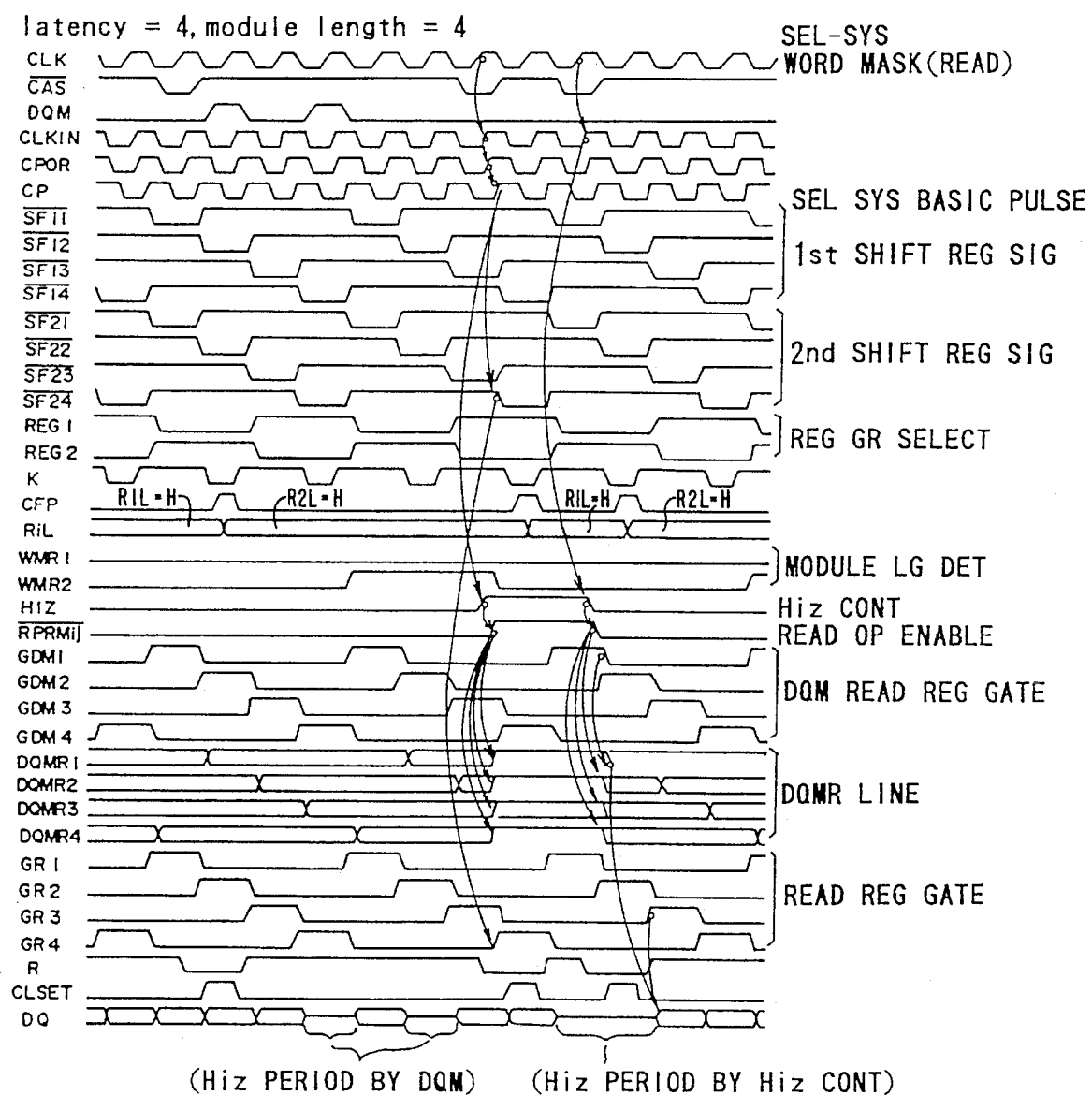
FIG. 95 is a timing chart for assistance in explaining the detailed operation of the embodiment according to the present invention.
Figure 96:
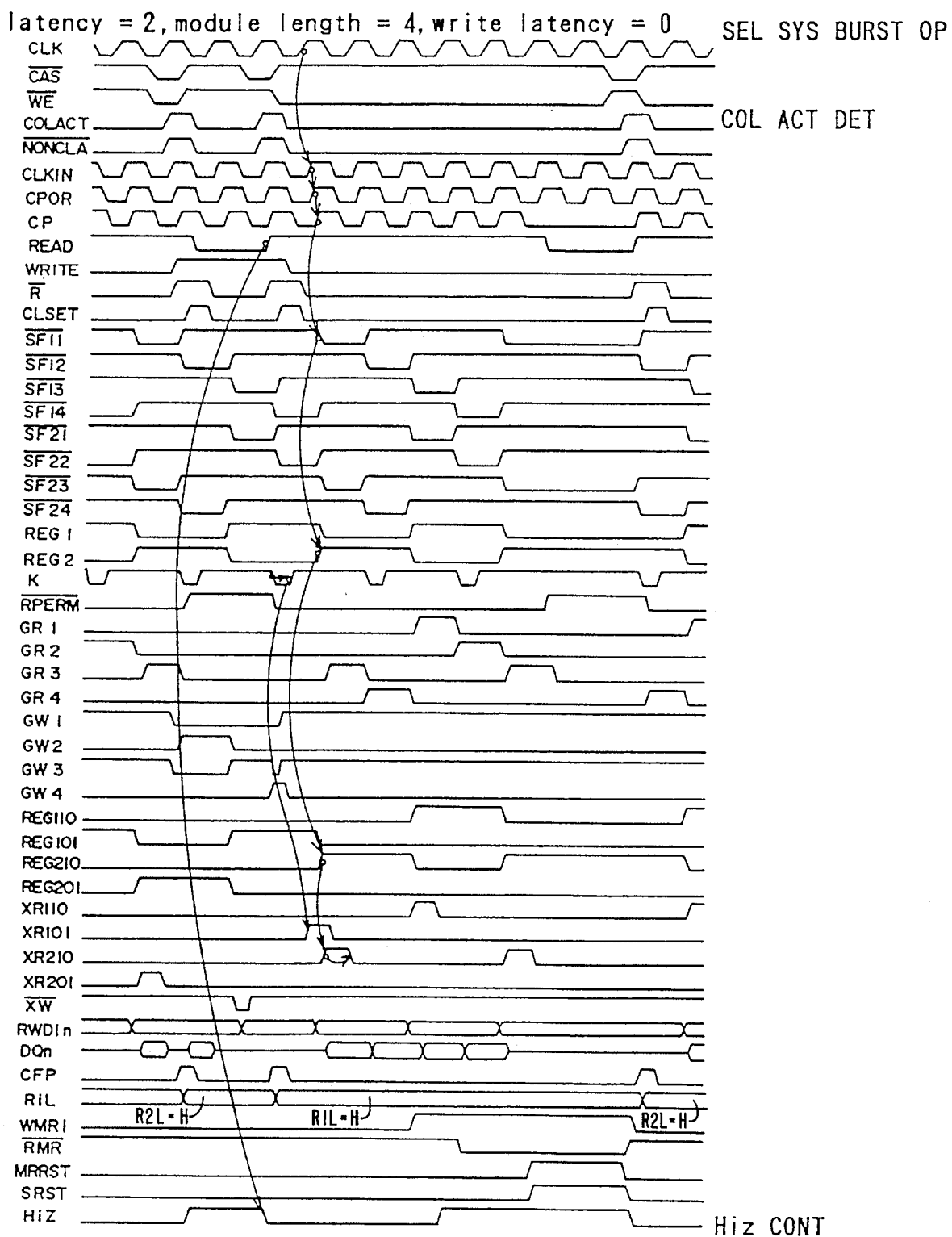
FIG. 96 is a timing chart for assistance in explaining the detailed operation of the embodiment according to the present invention.
Figure 97:
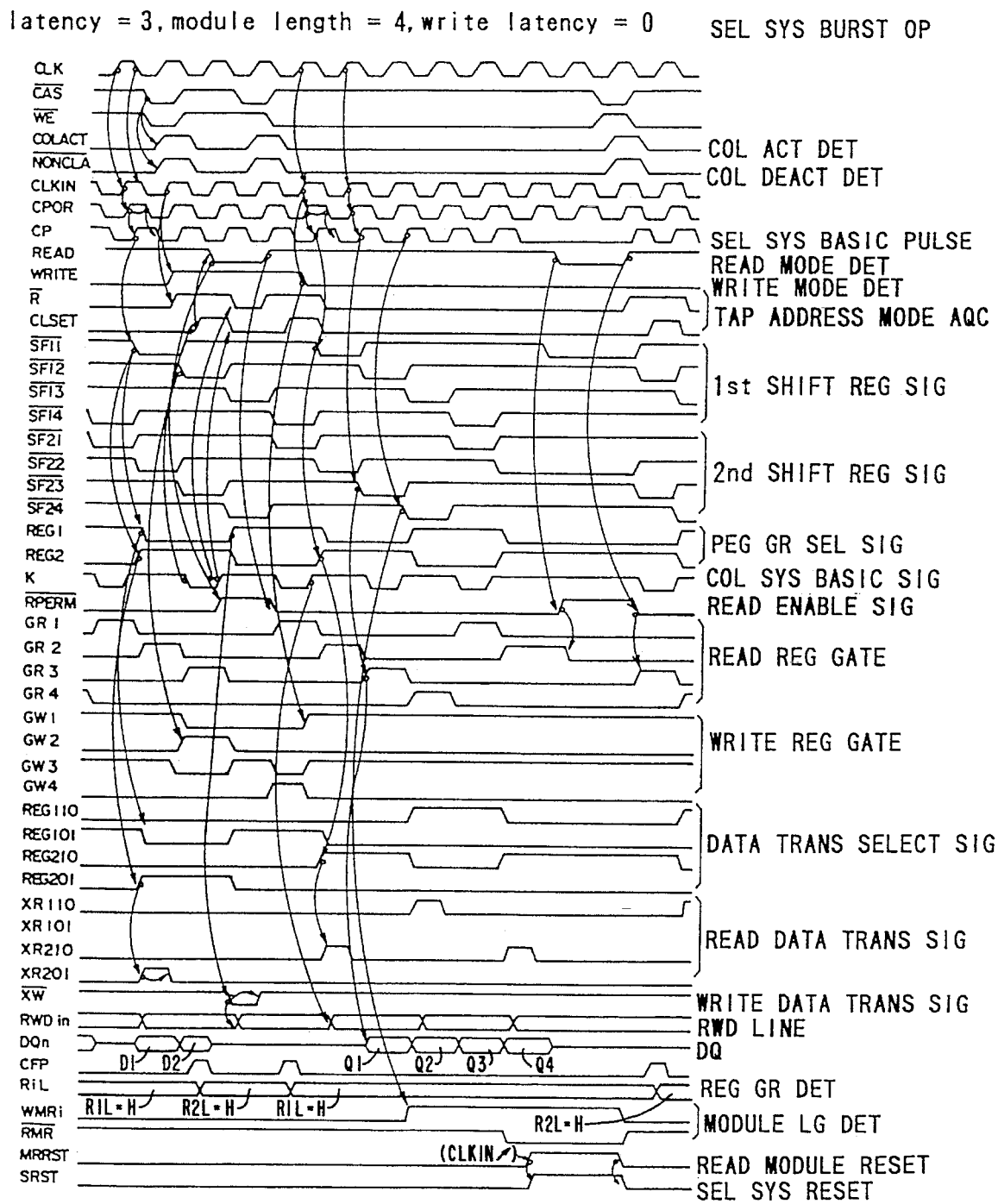
FIG. 97 is a timing chart for assistance in explaining the detailed operation of the embodiment according to the present invention.
Figure 98:
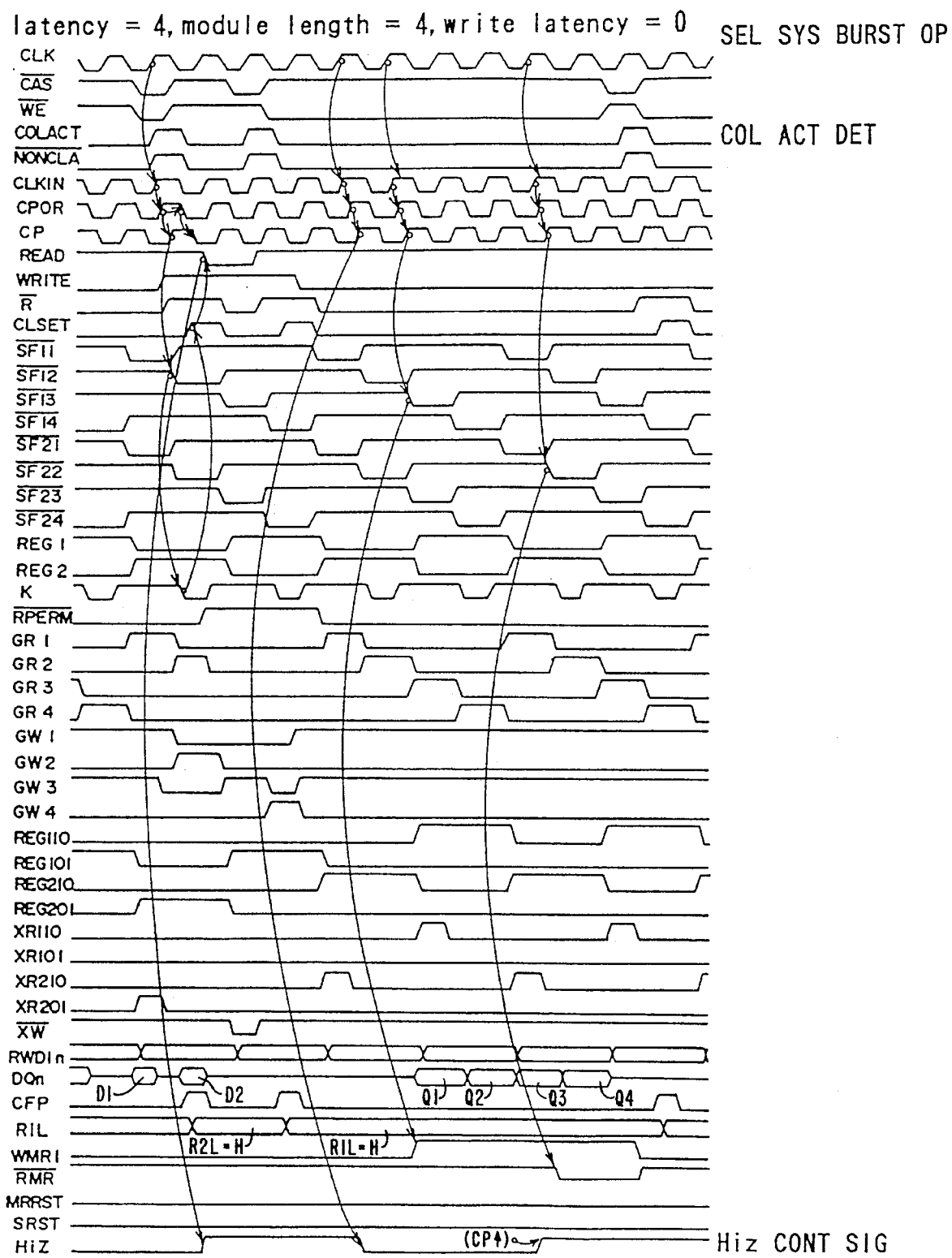
FIG. 98 is a timing chart for assistance in explaining the detailed operation of the embodiment according to the present invention.
Figure 99:
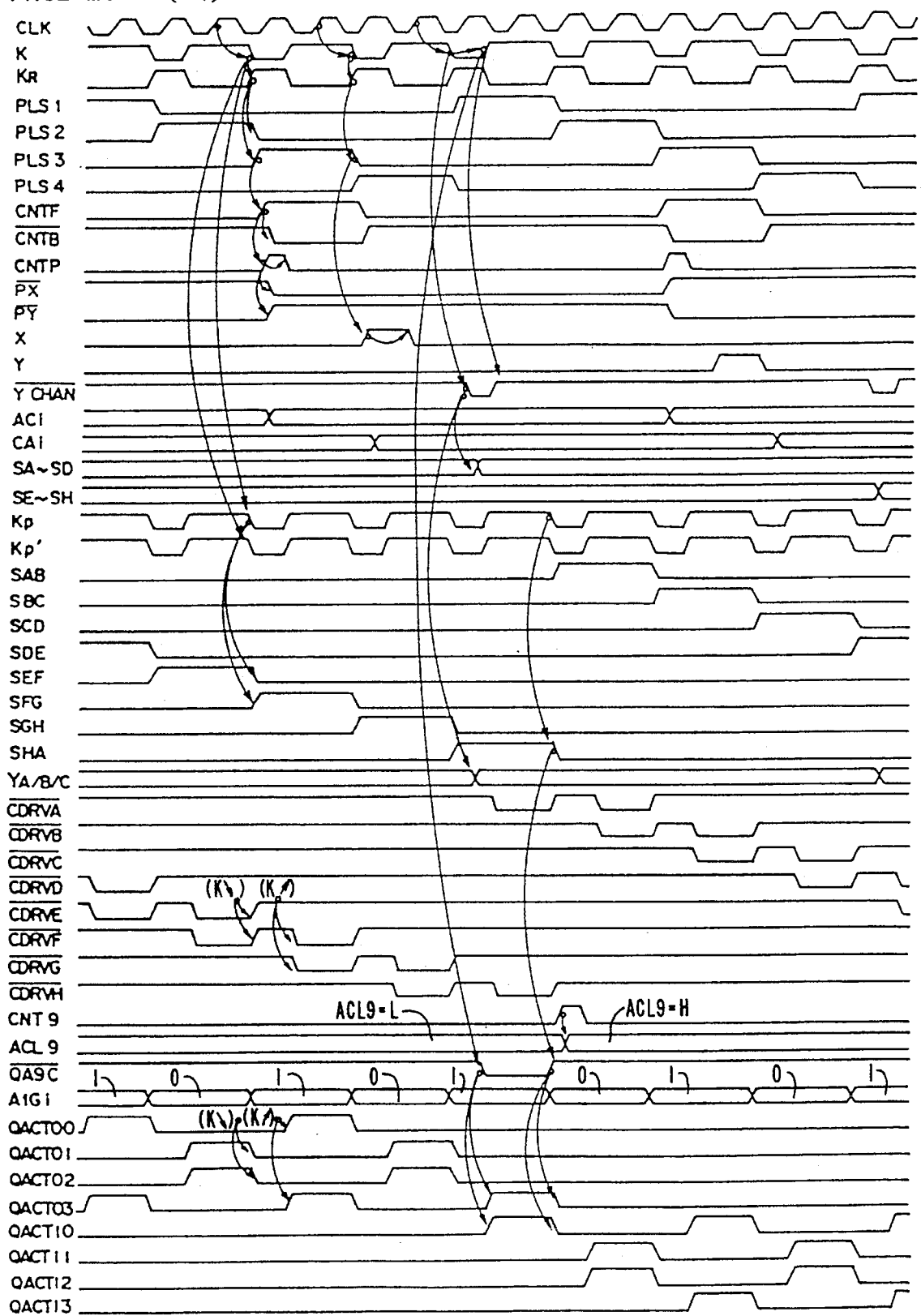
FIG. 99 is a timing chart for assistance in explaining the detailed operation of the embodiment according to the present invention.

The detailed operation of the embodiment according to the present invention is explained in timing charts shown in FIGS. 93 to 99. FIG. 93 shows the operation obtained when the latency is "2" and the module length is "4"; FIG. 94 shows the operation obtained when the latency is "3" and the module length is "4"; and FIG. 95 shows the operation obtained when the latency is "4" and the module length is "4", respectively. In these timing charts, there are shown various signals CLK, /CAS, DQM, CLKIN, CPOR, CP, /SF11, /SF12, /DF13, /SF14, /SF21, /SF22, /SF23, /SF24 /REG1, REG2, K, CFP, RLL, WMR1, WMR2, HiZ, /RPRMij, GDM1, GDM2, GDM3, GDM4, DQMR1, DQMR2, DQMR3, DQMR4, GR1, GR2, GR3, GR4, R, CLSET, DQ, etc., respectively. Further, FIG. 96 shows the operation obtained when the latency is "2", the module length is "4" and the write latency is "0"; FIG. 97 shows the operation obtained when the latency is "3", the module length is "4" and the write latency is "0"; and FIG. 98 shows the operation obtained when the latency is "4", the module length is "4" and the write latency is "0", respectively. In these timing charts, there are shown various signals such as CLK, /CAS, /WE, COLACT, /NONCLA, CLKIN, CPOR, CP, READ, WRITE, /R, CLSET, /SF11, /SF12, /DF13, /SF14, /SF21, /SF22, /SF23, /SF24, REG1, REG2, K, /PERM, GR1, GR2, GR3, GR4, GW1, GW2, GW3, GW4, REG110, REG101, REG210, REG201, XR110, XR101, XR210, XR201, /XW, RWDin, DQn, CFP, RiL, WMRi, /RMR, MRRST, SRST, Hi-Z, etc., respectively. Further, FIG. 99 shows the operation obtained when the page mode is (X4) and the tap=9, in which there are shown various signals such as CLK, K, KR, PLS1, PLS2, PLS3, PLS4, CNTF, /CNTB, CNTP, /PX, /PY, /PX, X, Y, /YCHAN, ACi, SA to SD, SE to SH, Kp, Kp', SAB, SBC, SCD, SDE, SEF, SFG, SGH, SHA, TA/B/C, /CDRVA, /CDRVB, /CDRVC, /CDRVD, /CDRVE, /CDRVF, /CDRVG, /CDRVH, /CNT9, /ACL9, /QA9C, ALGi, QACT00, QACT01, QACT02, QACT03, QACT10. QACT11, QACT12, QACT13, etc., respectively.

As understood by the above-mentioned embodiment, the present invention provides the synchronous LSI memory device as follows:

(1) The basic signal synchronous with the CKE signal related to the mask is generated according to the status of the CKE signal, and the memory device is accessed on the basis of the second signals stopped after the previously determined number of accesses has been made or when the stop signal is inputted.

(2) Further, in the configuration of (1), the initial operation is executed by the shift registers accessed on the basis of the second signal.

(3) Further, with the use of the 4-bit shift registers of the configuration of (2), the column system is activated on the basis of the outputs of the specific shift registers.

(4) Further, the two sets of the shift registers of the configuration of (2) are incorporated.

(3) Further, in the configuration of (2), the initial conditions are changed according to the read latency.

(6) The shift registers for acquiring externally inputted data in synchronism with the CLK signal are provided. Further, 4-bit input registers are provided for each DQ pin. The data input is so controlled that data can be inputted to the input registers in sequence. When the data input sequence is not changed, the alternate two-bit registers are provided for inputting data.

(7) The DQM status is acquired by the 4-bit registers in sequence. The acquired data are outputted in sequence, and the outputted data are inputted to the specific 4-bit registers, respectively. When the inputted DQM data is in the first status, the 4-bit registers generate a signal for setting the output circuits thereof to a high impedance status in synchronism with the second signal of the configuration of (1).

(8) The data registers for acquiring the DQM by the 4-bit registers in sequence in synchronism with the second signal only in the write mode are provided. The data of the registers are outputted to the DQMW lines two bits by two bits for each two cycles under scrambling condition, and the DQMW lines are precharged at predetermined cycle intervals.

(9) When the predetermined access length is "1", the second and fourth register values of the 4-bit length DQM write registers are fixed in the same status as when the masked data are acquired.

(10) The data registers for acquiring the DQM in the 4-bit registers in sequence in synchronism with the second signal in the read mode are provided. The data of these data registers are outputted in sequence to the DQMW lines. In the write mode, the DQMW lines are fixed in a high impedance status by an output circuits.

(11) When the predetermined access length is "1", the second and fourth outputs of the 4-bit length DQM read registers are fixed in the mask data outputting status.

(12) In the configuration of (1), the stop signals are outputted subsequent to the two bank precharge, after a predetermined number of accesses has been completed.

(13) Further, when the write latency is "1" in the configuration of (1), the stop signal is outputted between the non-write status and the first cycle in the write mode.

(14) The previously determined number of cycles is counted on the basis of signals selected two bits by two bits by interleaving the 4(2+2)-bit registers.

(15) When a plurality of cell arrays are serial-accessed, the serial access is so controlled that a plurality of cell arrays are accessed simultaneously.

(16) In the configuration of (15), when the a plurality of cell arrays are accessed simultaneously, the DQ buffers whose number is half that accessed separately are activated.

(17) In the configuration of (1), the second signals are divided into a plurality of signals according to the uses, for instance as CPK, CPW, CPR, etc. in FIG. 3, so as to be controlled respectively.

As describe above, in the synchronous LSI memory device according to the present invention, the cell arrays are divided into two banks; there are provided the timing generators for generating accessing signals in synchronism with the masked CLK signal; the column systems of the two-band cell arrays are pipeline-operated via DQ buffers and registers so that an access can be made once between the core sections for each two clocks. Further, in the read mode, the data read from the core section are transferred being interleaved to the 4-bit serial registers two bits by two bits, and the data transferred to the serial registers are outputted in series. In the write mode, data are read to the serial registers in sequence, the read data are written being interleaved in the core sections two bit by two bits.

As a result, it is possible to operate both the CPU operative in response to a high speed clock signal and the memory device operative in response to a low speed on the basis of the same single clock, thus realizing a synchronous LSI memory device which can be incorporated in a high speed CPU, without complication of the system.

As described above, in the synchronous LSI memory device according to the present invention, it is possible to operate the memory device whose access speed is lower than the CPU on the basis of a single high speed clock signal suitable for the CPU, so that the it is possible to simplify the clock control so as to be correspond to the higher speed CPU without complicating the system configuration.

TABLE 1

1) Truth table
1. CKE is active high.
2. CBR and Self-Refresh Entry are other commands on CL level.
3. CBR becomes auto-precharge.
4. Auto precharge by A10 is added to read/write operation.
5. CKE suspends clocks for inputting all command and inputting and outputting data.

TRUTH TABLE

| COMMAND | CKE | DQM | BS | A10 | A90 | /CS | /PAS | /CAS | /WE | MNEMONIC |
|---|---|---|---|---|---|---|---|---|---|---|
| MODE REG SET | $H^2$ | X | V | V | V | L | L | L | L | MRS |
| CBR & AUTO-PRECHG | $H^2$ | X | X | X | X | L | L | L | H | REFR |
| SELF-REFRESH ENTRY | $L^1$ | X | X | X | X | L | L | L | H | SREF |
| BANK DEACTV/PRECHG | $H^2$ | X | V | L | X | L | L | H | L | DEAC |
| PRECHG ALL | $H^2$ | X | X | H | X | L | L | H | L | PALL |
| BANK ACTV | $H^2$ | X | V | V | V | L | L | H | H | ACTV |
| WRITE | $H^2$ | X | V | L | V | L | H | L | L | WRIT |
| WRITE & AUTO-PRECHG | $H^2$ | X | V | H | V | L | H | L | L | WRITA |
| READ | $H^2$ | X | V | L | V | L | H | L | H | READ |
| READ & AUTO-PRECHG | $H^2$ | X | V | H | V | L | H | L | H | READA |
| RESERVED | $H^2$ | X | X | X | X | L | H | H | L | NOP1 |
| RESERVED | $H^2$ | X | X | X | X | L | H | H | H | NOP2 |
| DEVICE DESELECT | $H^2$ | X | X | X | X | H | X | X | X | DSEL |
| CLK SUS/STDBY MODE | $L^2$ | X | X | X | X | X | X | X | X | HOLD |
| DATA WR/OUT ENABLE | $H^2$ | L | X | X | X | X | X | X | X | ENBL |
| DATA MSK/OUT DISBL | $H^2$ | H | X | X | X | X | X | X | X | MASK |

(1) CKE status is H level in same cycle/previous cycle.
(2) CKE status is previous cycle.
(3) V = Valid  X = Don't care  L = Low  H = High
(4) All inputs are acquired by rise edges of CLK.
(5) MRS, REFR and SREF are executed when two banks are precharged.

TABLE 2

| | | (Column system activation sequence) | | | |
|---|---|---|---|---|---|
| (PAGE WRAP) TAP | ADD SEQ | CSL SEQ | DQ ACTV SEQ | ADD SCR'BLE | |
| 0 | 01234567 | AB→AB→CD→CD EF→EF→GH→GH | 01→23→01→23 | 01→01→01→01 | 01 |
| 1 | 1234567<u>0</u> | AB→BC→CD→DE | 12→30→12→30 | 10→10→10→10 | 10 |

TABLE 2-continued (Column system activation sequence)

(PAGE WRAP)
| TAP | ADD SEQ | CSL SEQ | DQ ACTV SEQ | ADD SCR'BLE | |
|---|---|---|---|---|---|
| 2 | 23456701 | EF→FG→GH→HA<br>BC→,BC→,DE→DE | 23→01→23→01 | 01→01→01→01 | 01 |
| 3 | 34567012 | FG→FG→HA→HA<br>BC→CD→DE→EF | 30→12→30→12 | 10→10→10→10 | 10 |
| 4 | 45670123 | FG→GH→HA→AB<br>CD→CD→EF→EF | 01→23→01→23 | 01→01→01→01 | 01 |
| 5 | 56701234 | GH→GH→AB→AB<br>CD→DE→EF→FG | 12→30→12→30 | 10→10→10→10 | 10 |
| 6 | 67012345 | GH→HA→AB→BC<br>DE→4DE→FG→FG | 23→01→23→01 | 01→01→01→01 | 01 |
| 7 | 70123456 | HA→HA→BC→BC<br>DE→EF→FG→GH<br>HA→AB→BC→CD | 30→12→30→12 | 10→10→10→10 | 10 |

_: Address corresponding to the succeeding column decoder

TABLE 3

(Column system activation sequence)

(8-WRAP)
| TAP | ADD SEQ | CSL SEQ | DQ ACTV SEQ | ADD SCR'BLE | |
|---|---|---|---|---|---|
| 0 | 01234567 | AB→AB→CD→CD<br>EF→EF→GH→GH | 01→23→01→23 | 01→01→01→01 | 01 |
| 1 | 12345670 | AB→BC→CD→DA<br>EF→FG→HE→HE | 12→30→12→30 | 10→10→10→10 | 10 |
| 2 | 23456701 | BC→BC→DA→DA<br>FG→FG→HE→HE | 23→01→23→01 | 01→01→01→01 | 01 |
| 3 | 34567012 | BC→CD→DA→AB<br>FG→GH→HE→EF | 30→12→30→12 | 10→10→10→10 | 10 |
| 4 | 45670123 | CD→CD→AB→AB<br>GH→GH→EF→EF | 01→23→01→23 | 01,01→01→01 | 01 |
| 5 | 56701234 | CD→DA→AB→BC<br>GH→HE→EF→FG | 12→30→12→30 | 10→10→10→10 | 10 |
| 6 | 67012345 | DA→DA→BC→BC<br>HE→HE→FG→FG | 23→01→23→01 | 01→01→01→01 | 01 |
| 7 | 70123456 | DA→AB→BC→CD<br>HE→EF→FG→GH | 30→12→30→12 | 10→10→10→10 | 10 |

TABLE 4

16M synchronous DRAM
(Column system activation sequence)

(8-INTERLEAVE)
| TAP | ADD SEQ | CSL SEQ | DQ ACTV SEQ | ADD SCR'BLE | |
|---|---|---|---|---|---|
| 0 | 01234567 | AB→AB→CD→CD<br>EF→EF→GH→GH | 01→23→01→23 | 01→01→01→01 | 01 |
| 1 | 10325476 | AB→AB→CD→CD<br>EF→EF→GH→GH | 10→32→10→32 | 10→10→10→10 | 10 |
| 2 | 23016745 | AB→AB→CD→CD<br>EF→EF→GH→GH | 23→01→23→01 | 01→01→01→01 | 01 |
| 3 | 32107654 | AB→AB→CD→CD<br>EF→EF→GH→GH | 32→10→32→10 | 10→10→10→10 | 10 |
| 4 | 45670123 | CD→CD→AB→AB<br>GH→GH→EF→EF | 01→23→01→23 | 01→01→01→01 | 01 |
| 5 | 54761032 | CD→DA→AB→BC<br>GH→HE→EF→EF | 10→32→10→32 | 10→10→10→10 | 10 |
| 6 | 67452301 | CD→DC→,AB→AB<br>GH→GH→EF→EF | 23→01→23→01 | 01→01→01→01 | 01 |
| 7 | 76543210 | CD→CD→AB→AB<br>GH→GH→EF→EF | 32→10→32→10 | 10→10→10→10 | 10 |

TABLE 5

16M synchronous DRAM
(Column system activation sequence)

| (4-WRAP) TAP | ADD SEQ | CSL SEQ | DQ ACTV SEQ | ADD SCR'BLE | |
|---|---|---|---|---|---|
| 0 | 0 1 2 3 | AB→AB/CD→CD EF→EF/GH→GH | 01→23 | 01→01 | 01 |
| 1 | 1 2 3 0 | AB→AB/CD→CD EF→EF/GH→GH | 12→30 | 10→10 | 10 |
| 2 | 2 3 0 1 | AB→AB/CD→CD EF→EF/GH→GH | 23→01 | 01→01 | 01 |
| 3 | 3 0 1 2 | AB→AB/CD→CD EF→EF/GH→GH | 30→12 | 10→10 | 10 |

TABLE 6

16M synchronous DRAM
(Column system activation sequence)

| (4-INTERLEAVE) TAP | ADD SEQ | CSL SEQ | DQ ACTV SEQ | ADD SCR'BLE | |
|---|---|---|---|---|---|
| 0 | 0 1 2 3 | AB→AB/CD→CD EF→EF/GH→GH | 01→23 | 01→01 | 01 |
| 1 | 1 0 3 2 | AB→AB/CD→CD EF→EF/GH→GH | 10→32 | 10→10 | 10 |
| 2 | 2 3 0 1 | AB→AB/CD→CD EF→EF/GH→GH | 23→01 | 01→01 | 01 |
| 3 | 3 2 1 0 | AB→AB/CD→CD EF→EF/GH→GH | 32→10 | 10→10 | 10 |

TABLE 7

CSL SELECTOR TAP SET

| A3 | A2 | A1 | PAGE | 8-WRAP | 8-INTER | 4-WRAP | 4-INTER |
|---|---|---|---|---|---|---|---|
| 0 | 0 | 0 | AB | AB | AB | AB | AB |
|   |   | 1 | BC | BC | AB | AB | AB |
|   | 1 | 0 | CD | CD | CD | CD | CD |
|   |   | 1 | DE | DA | CD | CD | CD |
| 1 | 0 | 0 | EF | EF | EF | EF | EF |
|   |   | 1 | FG | FG | EF | EF | EF |
|   | 1 | 0 | GH | GH | GH | GH | GH |
|   |   | 1 | HA | HE | GH | GH | GH |

TABLE 8

CSL SELECTOR OPERATION COMBINATION

|  | AB | BC | CD | DE | EF | FG | GH | HA | DA | HE |
|---|---|---|---|---|---|---|---|---|---|---|
| COMMON | o | o | o | — | o | o | o | — | — | — |
| PAGE | — | — | — | o | — | — | — | o | — | — |
| WRAP | — | — | — | — | — | — | — | — | o | o |

TABLE 9

(SWITCHING BETWEEN X8 AND X4)

| X8 | | | | X4 | | | |
|---|---|---|---|---|---|---|---|
| DQ | REG | RWD L | DQ BUFF | DQ BUFF | RWL L | REG | DQ |
| 0 | 0 | 0 | 0 | 0 | 1 | 1 | 0 |
| 1 | 1 | 1 | 1 | 1 | 3 | 3 | 1 |
| 2 | 2 | 2 | 2 | 0 | 1 | 1 | 0 |

TABLE 9-continued (SWITCHING BETWEEN X8 AND X4)

| X8 | | | | X4 | | | |
|---|---|---|---|---|---|---|---|
| DQ | REG | RWD L | DQ BUFF | DQ BUFF | RWL L | REG | DQ |
| 3 | 3 | 3 | 3 | 1 | 3 | 3 | 1 |
| 4 | 4 | 4 | 4 | 2 | 4 | 4 | 2 |
| 5 | 5 | 5 | 5 | 3 | 6 | 6 | 3 |
| 6 | 6 | 6 | 6 | 2 | 4 | 4 | 2 |
| 7 | 7 | 7 | 7 | 3 | 6 | 6 | 3 |

TABLE 10

| TAP | ADDRESS SEQ | /CDRV SHIFT REG SEQ | QACT SEQ | TYPE | PRE AC9 LAST | NEW AC9 START | COEXIST |
|---|---|---|---|---|---|---|---|
| 0 | 01234567 | AB→BC→CD→DE | 01→23→01→23 | A | HA | AB | |
|   |          | EF→FG→GH→HA | 01→23→01→23 |   |    |    | |
| 1 | 12345670 | AB→BC→CD→DE | 12→30→12→30 | B | GH | AB | HA |
|   |          | EF→FG→GH→HA | 12→30→12→30 |   |    |    | |
| 2 | 23456701 | BC→CD→DE→EF | 23→01→23→01 | / | HA | AB | |
|   |          | FG→GH→HA→AB | 23→01→23→01 | A |    |    | |
| 3 | 34567012 | BC→CD→DE→EF | 30→12→30→12 | / | GH | AB | HA |
|   |          | FG→GH→HA→AB | 30→12→30→12 | B |    |    | |
| 4 | 45670123 | CD→DE→EF→FG | 01→23→01→23 | A | HA | AB | |
|   |          | GH→HA→AB→BC | 01→23→01→23 | 1 |    |    | |
| 5 | 56701234 | CD→DE→EF→FG | 12→30→12→30 | B | GH | AB | HA |
|   |          | GH→HA→AB→BC | 12→30→12→30 |   |    |    | |
| 6 | 67012345 | DE→EF→FG→GH | 23→01→23→01 | / | HA | AB | |
|   |          | HA→AB→BC→CD | 23→01→23→01 | A |    |    | |
| 7 | 70123456 | DE→EF→FG→GH | 30→12→30→12 | / | GH | AB | HA |
|   |          | HA→AB→BC→CD | 30→12→30→12 | B |    |    | |

: A9c change side

TABLE 11

[ARCHITECTURE EXPLANATION] (See FIGS. 2 to 4)

(1)

SERIAL SYSTEM STUDY

FUNCTIONS REQUIRED FOR SERIAL SYSTEM
- * Clock can be masked. (See Item of clock mask)
- * $t_{pc}$ related operation -
  - * Columns can be activated for each at least two cycles.
  - * Columns can be activated at cycles after module length end.
  - * For both bank precharged.
- * For write latency = 1 (Studied in Item of latency).
- * For 100 MHz CLK.
- * For word mask (Studied in Item of Word Mask).

RESTRICTION OF DATA REGISTER
- * 2 BIT + 2 BIT = 4 BIT construction (for two groups).
- * Interleaved 2 bits by 2 bits (for interleave operation).
- * Access starts from first register.

* Masked CLK-SYN signal CPOR (100 MHz) is operated by basic signal CP.
* CP is used for serial system reset operation and write latency.
* Shift registers are operated by CP, to operate main pass activation signal (K), read register gate (GR), write register gate (GW), register group select signal (REG), and DQM read register gate (GDM) by shift register output.

⇓

(1) Method of dividing basic signal CP according to uses.
(2) Method of not dividing basic signal CP according to uses.

TABLE 11-continued

|   | REQUIRED SHIFT REGISTERS | TOTAL | NO. OF SYN OPR |
|---|---|---|---|
| (1) | FOR K, FOR GR/GDM/REGR, FOR G/REGW | 3 | 2 |
| (2) | FOR K/GW//REG, FOR GR | 2 | 2 |

TABLE 12

(2)

BASIC OPERATION FOR RESPECTIVE SECTIONS

MAIN PASS ACTIVATION SIGNAL (K)
- * During activation
  - * Operates for each two cyles in syn with CP (L pulse).
  - * K stops when serial system stops.
- * Reset operation —
  - * Operation must be started from 1st clock when serial system is reset.

READ DATA REGISTER GATE (GR)
- * GRi proceeds in syn with CP.
- * When serial system is reset, operation must be started from GRi coresponding to latency.
- * All are deactivated in write mode.
- * In read mode, operation starts from 1st CLK.

WRITE DATA REGISTER GATE (GW)
- * GWi proceeds in syn with CP.
- * When serial system is reset, operation must be started from GW1.
- * In read mode, GW1, GW3 = H, GW2/GW4 = L (for 1st cycle).
- * In write mode, GWi selected by shift register is activated.

TABLE 12-continued

```
┌─────────────────────────────────────┐
│ REGISTER SELECT SIGNAL (REG)        │
└─────────────────────────────────────┘
   │
   ├─ * Switched for each 2 cycle in syn with CP.
   └─ * When serial system is reset, operation must by started
        from 1st register group.

┌─────────────────────────────────────┐
│ DQMER REGISTER GATE (GDM)           │
└─────────────────────────────────────┘
   │
   ├─ * GDMi proceeds in syn with CP.
   ├─ * in write mode, GDMi is fixed to HorL on latency.
   └─ * In read mode, operation is same as GRi (Reset operation
        is also same as GRi).
```

TABLE 13

(3)

| READ-RELATED SECTION STUDY |
|---|

* When read data are read from core section, data must be trasnferred to read data registers.
* After data have been transferred to read data registers, gates must be opened.

⇓

New data are trasferred in syn with register select signals.

⇓

New data are outputted from only GR1 or GR3.

* Data transfer signals (XR) are activated with a specific delay time after K ↗.
* GR1 and GR3 are enabled, after XR have been activated.
   └─ * for only when latency is 1 or 2, because of latency relationship.

⇓

* GR can be used for DQMR from logical standpoint.
* Time between CLK ↗ and GR ↗↘ may be delayed when latency is 1 or 2. DQM read hold time is marginal.
   * DQMR cannot be substituted for read data register gate (GR).

⇓

* GDM for DQMR is added to output of shift register for forming GR.

TABLE 14

[SERIAL OPERATION EXPLANATION] (See FIGS. 5 to 32)

(0)

| SERIAL-RELATED OPERATION |
|---|

(1) Address mode can be se at tPC = 2.

(2) /CAS cycle can be set in any cycle after reset cycle subsequent to module access.

(3) /CAS cycle can be set in any cycle after both bank precharge or after self-refresh.

(1) For minimum random access

[tPC = 2] ≡ [Different column addresses can be set every 2 cycles] = (every 20 nsec min).

⇓

* Data must be read from core section for each 20 nsec.
* Data must be written to core section for each 20 nsec.
* Datat are outputted 20 nsec after address input (because of latency).

+

* 20 nsec = between CLK ↗ and RWD line ↗↘ (Read)

* 20 nsec = between CLK ↗ and BL ↗↘ (Write)

* Since core - DQ lines - RWD lines change for 2 cycles (20 nsec min), data cannot be latched there - so that data latch sections are necessary.

* Data registers at least 4-bit length longer than latency are required - to prevent new data from interfering with previous data during data output.

* Since adresses change every two cycles, accessed 2 bits by 2 bits (by dividing 4 bits into 2 bits).

⇓

* Data resgisters of 2-bit + 2-bits construction are used being interleaved.

TABLE 15

READ MODE

* Pipeline operation is executed between CLK and RWD lines and between RWD lines and data registers.
  Data registers are:
  * 2 bit + 2 bit configuration (two groups).
  * 2 bit data are interleaved to input data from RWD lines every 2 cycles (interleave operation).
  * Data are outputted beginning from 1st data register in sequence (serial operation).

⇕

* Because new data must be read when previous cycle data are being outputted.

CLK — K — DQ line eq — CSL — QACT — RWD line — register
|← - - - - - - - - $t_p$ - - - - - - - - →|
                          CLK — K — DQ line eq — CSL - -

WRITE MODE

* Data of data registers are ouputted to RWD lines 2 bits by 2 bits.
* Data mask is always applied by DQM lines, and DQ write is made when write-enabled by DQM.

⇕

Since QACT is activated prior to new data, if DQ write is made, normal data write is delayed.

Data registers are:
* 2 bit + 2 bit configuration (two groups).
* 2 bit data are interleaved to output data to RWD lines every 2 cycles (interleave operation).
* Data are inputted beginning from 1st data register in sequence (serial operation).

CLK — K — DQ line eq — CSL — QACT
|← - - $t_{pc}$ - - - - - →|
            CLK — GW — XW — RWD line

TABLE 16

R/W MODE ACQUISTION

* /WE Schmitt trigger output — — — — — — — /WEIN

* Column access mode latch — — — — — — — /WELT
  (New cycle mode is latched by CLK ↗).

* Internal column access mode — — — — — — — /WECL
  (Switched during K = L by column access code designation signal

ADRESS ACQUISTION

* Ai Schmitt trigger output — — — — — — — AINi

* New tap address latch — — — — — — — ALTi
  (Tap address used in new column cycle is
  (latched on CLK ↗.)

* New column address — — — — — — — ACTi
  (New address used for column system is switched during K = L.)

COUNTER RELATIONSHIP

* Tap address set ─┬─ * In column-active cycle, tap address is set to output-prepare section during /R = H (except module length PAGE).
                └─ * Tap address is set to output-section during 1st K = L of column active cycle (module length PAGE)

* Normal operation ─┬─ * Counters are inoperative with outputs kept open (except module length PAGE).
                  └─ * Count up starts when CNT ↗
                     (module length PAGE.)

TABLE 17

ADDRESS SIGNALS USED FOR CIRCUITS (IN TAP SET)

| Ai | DESTINATION | USED SIG | CHANGE TIMING | CHANGE SIG |
|---|---|---|---|---|
| An | XR, XW | ALTi | CLK ↑ | /RGRAM |
|  | QACT | ACLi | K ↓ | CLSET |
| A1 | QACT | ACLi | K ↓ | CLSET |
|  | /CDRV | ACLi | K ↓ | CLSET |
| A2 | /CDRV | ACLi | K ↓ | CLSET |
|  | /CDRV | ACLi | K ↓ | CLSET |
| A3 | COUNTER | GAMi/ACi | CLK ↑ / K ↓ | /GRAM/CLSETP |
|  | YA | ACi | — | — |
| A4 | YA | ACi | — | — |
|  | COUNTER | GAMi/ACi | CLK ↑ / K ↓ | /GRAM/CLSETP |
| A5 | COUNTER | GAMi/ACi | CLK ↑ / K ↓ | /GRAM/CLSETP |
|  | YB | ACi | — | — |
| A6 | YB | ACi | — | — |
|  | COUNTER | GAMi/ACi | CLK ↑ / K ↓ | /GRAM/CLSETP |
| A7 | COUNTER | GAMi/ACi | CLK ↑ / K ↓ | /GRAM/CLSETP |
|  | YC | ACi | — | — |
| A8 | YC | ACi | — | — |
|  | COUNTER | GAMi/ACi | CLK ↑ / K ↓ | /GRAM/CLSETP |
| A9 | COUNTER | ACLi | CLK ↑ / K ↓ | CLSET |
|  | QACT | ACLi | K ↓ | CLSET |

TABLE 17-continued

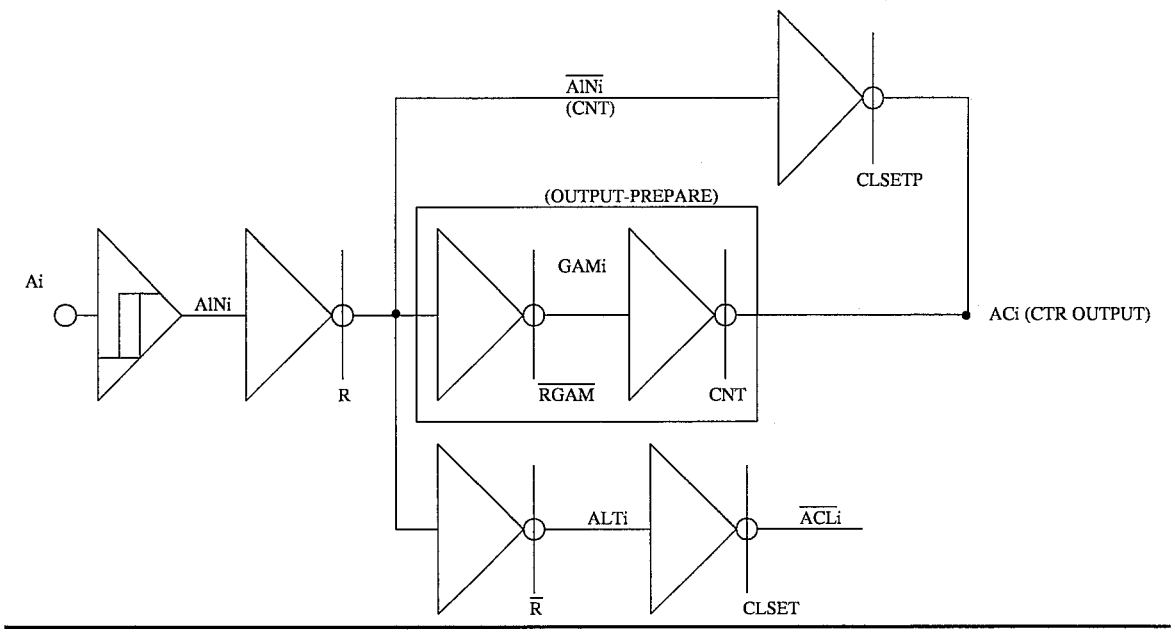

TABLE 18

/WE USED FOR VARIOUS SECTIONS

| SECTION | SIGNAL |
|---|---|
| ACCESS MODE DET SECT | /WEIN |
| OTHERS | /WECL |

* READ/WRITE MODE & FUNCTION DETECTING SECTS

* External input signals (not relaxed to CLK) are used by setup/hold.

*SERIAL & COLUMN SYSTEM CIRCUITS

* When used in accessing circuits, read/write mode can be changed only after previous cycle ends.

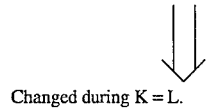

Changed during K = L.

TABLE 18-continued

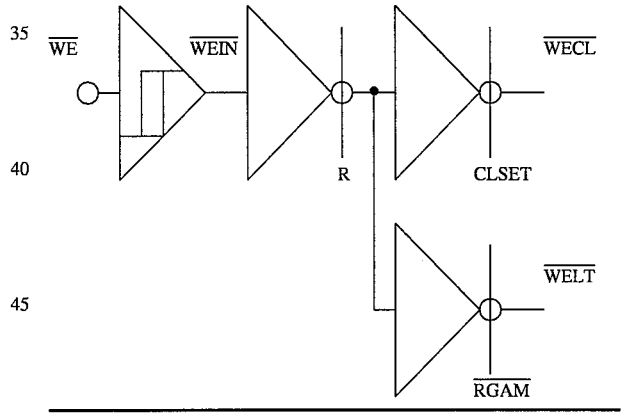

TABLE 19

| SERIAL SYSTEM ENABLE |

* After access of module length data:

(Read mode) —┬— Column set cycle (/CAS=L) cannot be set after
             │   latency-related cycle subsequent to data
             │   output cycle.
             │       /CAS=L cycle:* Register is intialized.
             │                   * Serial system is stopped.
             └— When next column set cycle starts.
                     └— * Serial system is enabled.

(Write mode)—┬— After final data input cycle.
             │                   * Serial system is stopped.
             └— When next column set cycle starts.
                     └— *Serial system is enabled.

* After final data access after both bank precharge:
                     ├— * Serial system is stopped.
                     └— * Register is initialized.

* In WRITE LATENCY = 1 — Serial system signals are stopped
  for one cycle in write mode after read or module.

|  | STOP SER SYS | INITIALIZE REG |
|---|---|---|
| AFT MODULE (READ) | O | O |
| AFT MODULE (WRITE) | O | — |
| BOTH BANK PRECHG | O | O |
| WRITE LATENCY=1 | O | — |
| BURST STOP | O | O |

TABLE 20

| MODE DETECTION |

* Read and write mode are detected by signals activated only
  in read and write modes, to stop writing circuits in read
  mode and reading circuits in write mode.
* Read and write detections are both reset, after module
  length access ends and stop or reset cycle starts,
  because of no read or write mode.
* Read and write detections are both reset, after both
  bank are pre-charged, because of no read or write mode.

Read dectection —┬— set ——— * When set to read mode.
                 └— reset —┬— * When set to write mode.
                           ├— * When set to reset mode after
                           │     module.
                           └— * After final data output
                                 subsequent to both bank
                                 precharge.

Write detection —┬— set ——— * When set to write mode.
                 └— reset —┬— * When set to read mode.
                           ├— * When set to reset mode after
                           │     module (when latency = 1).
                           └— * After final data write
                                 subsequent to both bank
                                 precharge

TABLE 20-continued

* MODE DETECTION RESET AFTER MODE CHANGE IS
  MADE DURING K = L (READ & WRITE MUST NOT BE
  INTERFERED WITH EACH OTHER).

* WRITE RESET IS REQUIRED WHEN WRITE
  LATENCY = 1, BECAUSE WRITE MODE MUST BE
  DETECTED AFTER READ MODE OR MODULE TO
  STOP SERIAL SYSTEM OR ONE CYCLE WHEN SET
  TO WRITE MODE AFTER READ MODE OR MODULE.

TABLE 21

| COLUMN CYCLE DETECTION |

(Write latency = 1)
* Signal for acquiring address mode in column activation
  cycle.
* When write latency = 1, address mode cannot be acquired
  by R because being offset by one cycle from used cycle.

In read mode:  /R ↗ -- CLK ↗ in column activation cyle when READ = H & WRITE = L.

/R ↘ -- KL ↗

Write → Read:  /R ↗ -- READ ↗

/R ↘ -- KL ↗

In write mode: /R ↗ -- CLK ↗ of when ZW = H when READ = L & WRITE = H

/R ↘ KL ↗

Read → Write: * WRITE ↗ is transmitted to sections used in read mode after F/F has been set.
              * Or, { /R ↗ -- WRITE ↗ }
              { /R ↘ -- KL ↗    }  are added.

* When write lattency = 1, /R is always operated in column
  activaition cycles.

/R ↗ -- CLK ↗ on colmn active condition

/R ↘ -- KL ↗

/R IS SET TO "H" AT START OF SERIAL CYCLE,
AND RESET BY 1st K PULSE.

TABLE 22
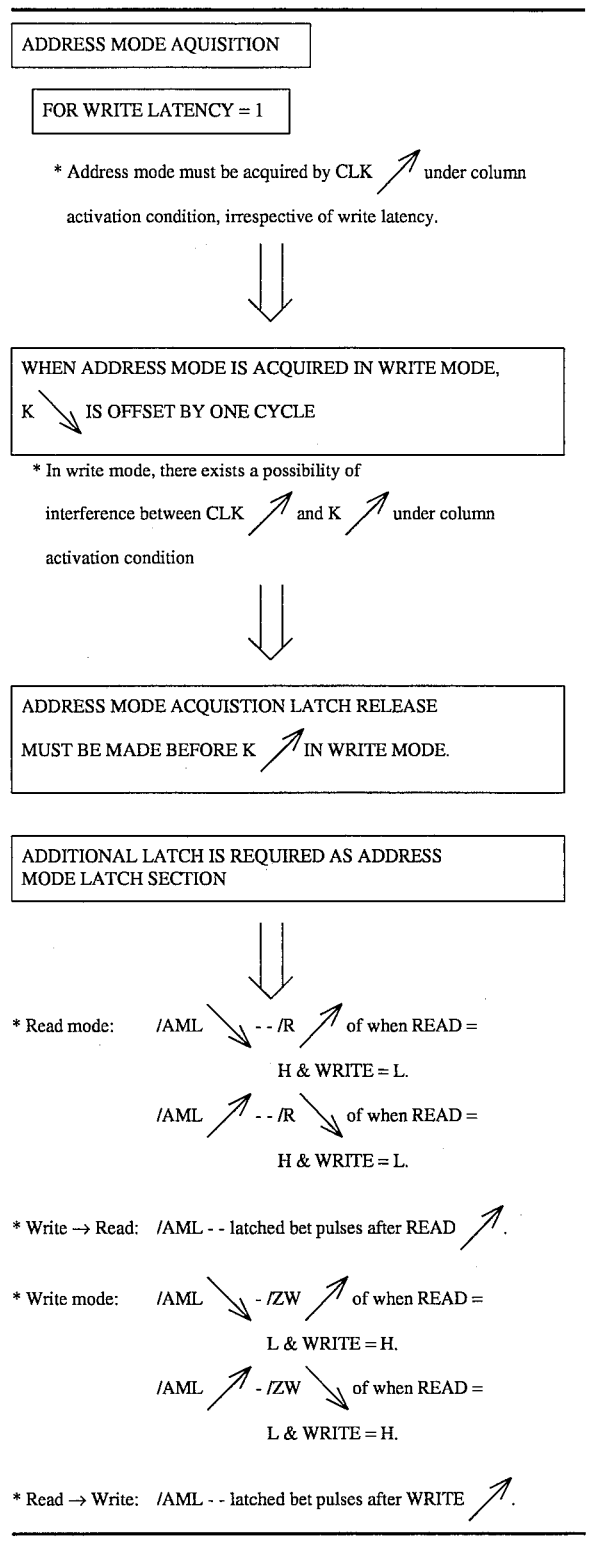
TABLE 23
[WORD MASK EXPLANATION] (See FIGS. 33 to 40)
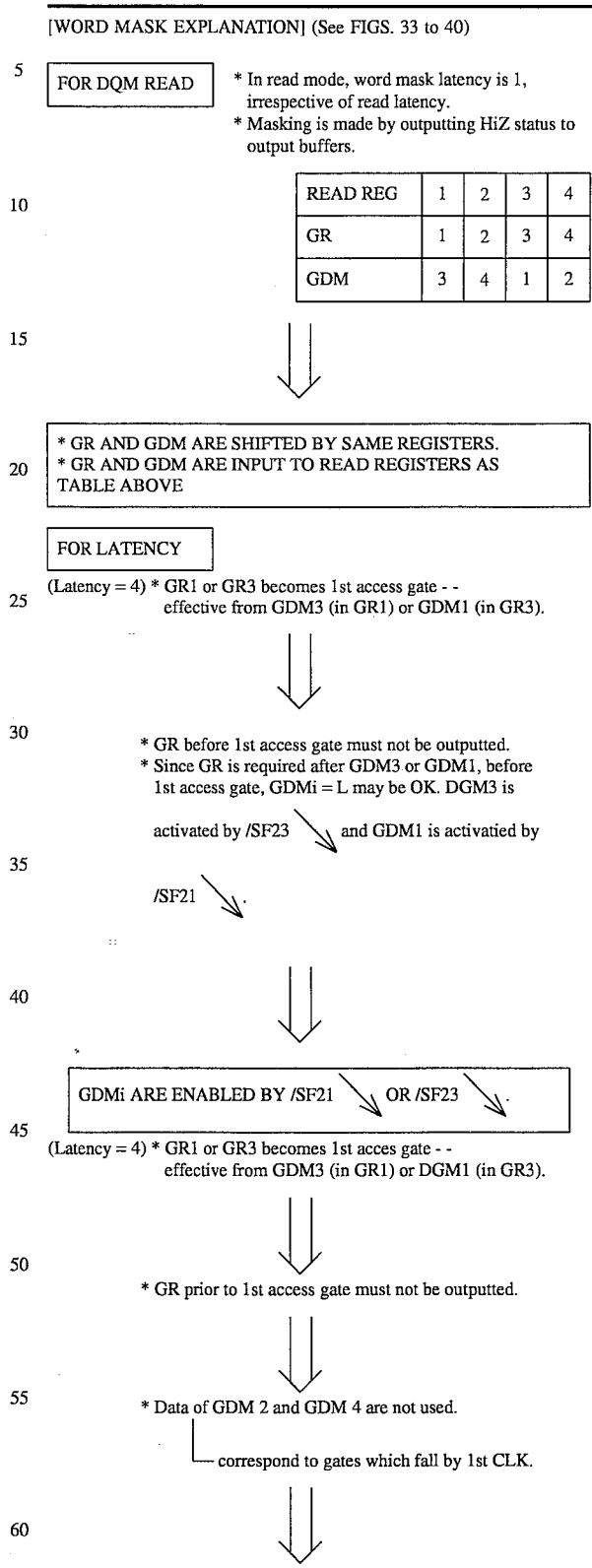

TABLE 23-continued

GDMi ARE ENABLED BEING DELAYED BY SPECIFIC TIME AFTER READ ↗.

( Specific delay ≡ so that DGMi can be enabled simultaneously when /SF21 ↘ or /SF23 ↘. )

TABLE 24

(Latency = 2) * GR1 or GR3 becomes 1st access gate -- effective from GDM3 (in GR1) or GDM1 (in GR3).

* Data acquired in 1st cycle is used as mask data.
* It is too late to read data after read mode.

⇓

* GDM1 & GDM3 ARE FIXED TO "H" IN MODE EXCEPT READ MODE
* IN READ MODE, GDMi ARE ENABLED.

└─ * There exist a possibility that GR3 (if starts from GR1) or GR1 (if starts from GR3) is outputted in one cycle.

⇓

GDMi are activated after 1st /SF22 ↘ or /SF24 ↘.

⇓

GDMi ARE ACTIVATED BEING DELAYED BY SPECIFIC TIME AFTER READ.

FOR DQMHi

* When mode changes from write mode or module to read mode, output must be kept at HiZ till effective data output.

⇓

TABLE 24-continued

* ALL DQMR ARE SET TO "H" WHEN READ ↘.
* DATA ARE TO BE OUTPUTTED BY DQMR REGISTER TO DQM LINES AFTER GDMi HAVE BEEN ENABLED

* Do not set to Hiz till 1st access, even if GRi begin to operate before 1st access. - GRi operate before 1st access gate.

⇓

* INTERNAL CIRCUITS OF DQMR REGISTERS ARE ALSO RESET.
* ONLY REGISTERS 2 AND 4 ARE RESET WHEN LATENCY = 2.
* RESET IS RELEASED AFTER GDMi HAVE BEEN ACTIVATED.

TABLE 25

FOR HiZ AFTER MODULE

WHEN NEXT COLUMN CYCLE DO NOT START MORE THAN MODULE LENGTH AFTER COLUMN ACTIVATION CYCLE.

⇓

(MUST BE SET TO HiZ CYCLE)

+

* WHEN COLUMN CYCLE STARTS BEFORE RESET CYCLE AFTER MODULE, HiZ STATUS IS REQUIRED FOR ACCESS CORRESPONDING TO LATENCY.
* CLK OF (MODULE LENGTH + LATENCY) IS SET TO HiZ.

⇓

TABLE 25-continued

| LATENCY | SET SIDE (HiZ) | RESET SIDE (NO HiZ) |
|---|---|---|
| 2 | CYCLE NEXT TO /WMR IS CLK ↗ IN COLUMN DEACTIV CYCLE. (HiZ 2 ↗) | COLUMN ACTIV CYCLE (HiZ 2 ↘) |
| 3 | 1ST CLK ↗ WHEN HiZ 2 = H (HiZ 3 ↗) | 1ST CLK ↗ WHEN HiZ 2 = L (HiZ 3 ↘) |
| 4 | 1ST CLK ↗ WHEN HiZ 3 = H (HiZ 4 ↗) | 1ST CLK ↗ WHEN HiZ 3 = L (HiZ 4 ↘) |

\* In write mode, module HiZ circuit must be reset.

\* This is because new status will not be started when write is changed to read.

/WMR: Signal set to "L" after module length from column cycle.
Hiz is set by fixing DQMR to "H".

TABLE 26

DQM WRITE STUDY

\* For DQM write - - DQM write lines are always masked before write, and masked data are outputted to DQMW lines when write data are outputted.

\* DQM DATA AREA LATCHED BY REGISTERS SIMILAR TO WRITE REGISTERS.
\* DQMW LINES ARE EQUALIZED AT K = L IN WRITE MODE.

\* For write latency - - DQM data are acquired to DQM registers being delated by one cycle.

TABLE 26-continued

\* WHEN READ CHANGES TO WRITE, MUST BE INITIALIZED IF NOT SET TO WRITE MODE FOR INPUTTING 1st DATA (DQM ACQUIRE STATUS IN INITIALIZATION).
\* NOT OPERATED EXCEPT WRITE MODE.

⇓

\* TWO PRE-LATCHES OPERATED AT INTERVALS OF 2 CYCLES ARE USED BY INTERLEAVE.
  ├ \* OUTPUTS OF TWO CIRCUITS ARE DQMW ARE
  └ \* DATA ARE READ IN REGISTERS.

TABLE 27

[CLOCK MASK EXPLANATION] (See FIG. 41)

CLOCK MASK OPERATION

\* CLK in cycle next to cycle of /CKE = L is masked when CLK
  ├ \* Mono synchronizing basic signal CPOR is stopped.
  └ \* Mask to FCN setting cycle must be effected by inputting clock mask signal to FCN settting detection circuit without satisfying setting condition at CMLAT = H.

CLOCK MASK
  ├ \* CKE status before one cycle is latched.
  ├ \* CKE = L - - - CPOR = L fixed
  └ \* Timing where internal CKE is switched is after CPOR signal forming signal ends.

TABLE 28

[MODULE LENGTH RELATED OPERATION EXPLANATION]
(See FIGS. 42 to 49)

Module length detection

End of module length ≡ Read: Cycle where module length data are outputted.
Write: Cycle where module length data are inputted TABLE 28-continued Read:

* ACCESS BEGINS ALWAYS FROM GR1 OR GR3.
  ⇓
* FINAL DATA OUTPUT IS ACCESSED FROM GR2 OR GR4.
  ⇓
* FINAL ACCESS DATA IS THAT STORED IN 2nd OR 4th REGISTER.

+

* REGISTER GROUP FOR OUTPUTTING FINAL DATA IS DETERMINED BY ONLY MODULE LENGTH, IRRESPECTIVE OF LATENCY.
  — DETERMINED ON WHICH OF REG 1 OR REG 2 IS L AT /CAS = L.

Write:

* WRITE IS EXECUTED IN UNIT OF 2 BITS.
  ⇓
* WHEN FINAL DATA WRITE STARTS, FINAL DATA INPUT CYCLES MATCH.
  ⇓
* REGISTER GROUP FOR EXECUTING FINAL DATA WRITE IS DETERMINED BY ONLY MODULE LENGTH, WHICH CAN BE DECIDED ON WHICH OF REG 1 OR REG 2 IS L AT /CAL = L.

(Final access data groups)

| REGi AT /CAS=L | REG 1 | | REG 2 | |
|---|---|---|---|---|
| MODULE \ MODE | READ | WRITE | READ | WRITE |
| 1 | REG 1 | REG 1 | REG 2 | REG 2 |
| 2 | REG 1 | REG 1 | REG 2 | REG 2 |
| 4 | REG 2 | REG 2 | REG 1 | REG 1 |
| 8 | REG 2 | REG 2 | REG 1 | REG 1 |
| PAGE | REG 2 | REG 2 | REG 1 | REG 1 |

MODULE 8 AND PAGE: 2nd

TABLE 29

MODULE OPERATION (Read mode) ── Latency = 2/4 - When column activation condition cannot be obtained at CLK edge in 2nd cycle after module length end is detected.

* Stop serial system for reset.

── Latency = 3 - - When column activation condition cannot be obtained at CLK edge in next cycle after module length end is detected.

* Stop serial system for reset.

(Write mode) ── Latency = 0 - Cycle in which module length end is detected.

* Stop serial system.

── Latency = 1 - Cycle in which module length end is detected.

* Stop serial system.

MODULE RESET RELEASE

* Read mode/write mode (latency=0) - * In next column activation condition.

* Write mode (latency=1) - * In next cycle after column activation condition.

⇕

* Since column operation starts at next cycle after column activation cycle.

TABLE 30

| MODULE LENGTH DETECTION RESET |

\* Cycle from which module length is counted.
     — \* Read mode - - Column activation cycle
     — Write mode - - latency = 0 - - Column activation cycle
                       — latency = 1 - - Next cycle after column activation cycle Since column operation starts from next cycle after column activation cycle

TABLE 31

(SUMMARY)

| MODULE\MODE | READ | WRITE |
|---|---|---|
| 1 | *1st K ↘ AFT /CAS=L<br>REG1=L: /SF22 ↘ AFT REG1 ↗<br>REG2=L: /SF24 ↘ AFT REG2 ↗ | *1st K ↘ AFT /CAS=L<br>REG1=L: REG1 ↗<br>REG2=L: REG2 ↗ |
| 2 | SAME AS WHEN MODULE LENGTH = 1 | SAME AS WHEN MODULE LENGTH = 1 |
| 4 | *1st K ↘'AFT /CAS=L<br>REG1=L: /SF24 ↘ AFT REG2 ↗<br>REG2=L: /SF22 ↘ AFT REG1 ↗ | *1st K ↘ AFT /CAS=L<br>REG1=L: REG2 ↗<br>REG2=L: REG1 ↗ |
| 8 | *1st K ↘ AFT /CAS=L<br>REG1=L:/SF24 ↘ AFT 2nd REG2 ↗<br>REG2=L:/SF22 ↘'AFT 2nd REG1 ↗ | *1st K ↘ AFT /CAS=L<br>REG1=L: 2nd REG2 ↗<br>REG2=L: 2nd REG1 ↗ |
| PAGE | *DETECT COUNTER IS RESET (BY /R) ON 1st CLK AFT /CAS-L.<br>⇓<br>*DETECT COUNTER IS OPERATED BY 2nd YCHAN.<br>⇓<br>*FINAL 8 DATA CYCLES ARE DETECTED AT DET COUNTER All=1.<br>⇓<br>*THEREAFTER, SAME AS MODULE LENGTH = 8 | |
| ALL | *MODULE DETECTION IS RESET AT COLUMN ACTIVE CYCLE (READ/WRITE 0).<br>*MODULE DETECTION IS RESET AT NEXT TO COLUMN ACTIVE CYCLE (WRITE 1). | |

| | MODULE DET | REG 1 | | REG 2 | |
|---|---|---|---|---|---|
| | REGi AT /CAS=L | REG 1 | REG 2 | REG 1 | REG 2 |
| MODULE LENGTH | 1 | o | — | — | o |
| | 2 | o | — | — | — |
| | 4 | — | o | o | — |
| | 8 | — | o | o | — |
| | P | — | o | o | — |

8 AND P: 2nd

TABLE 32
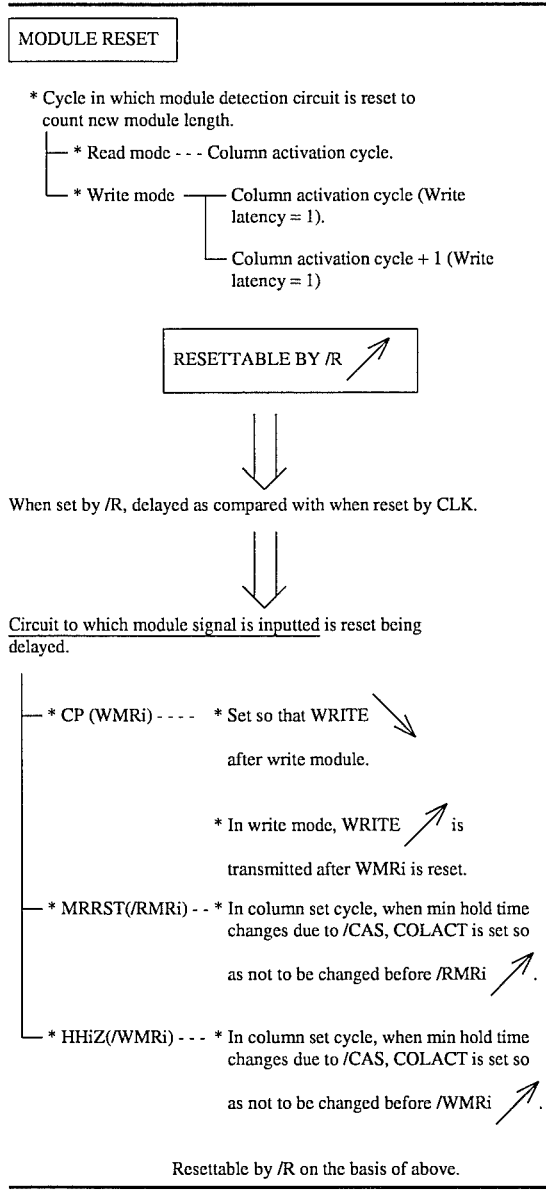
TABLE 33
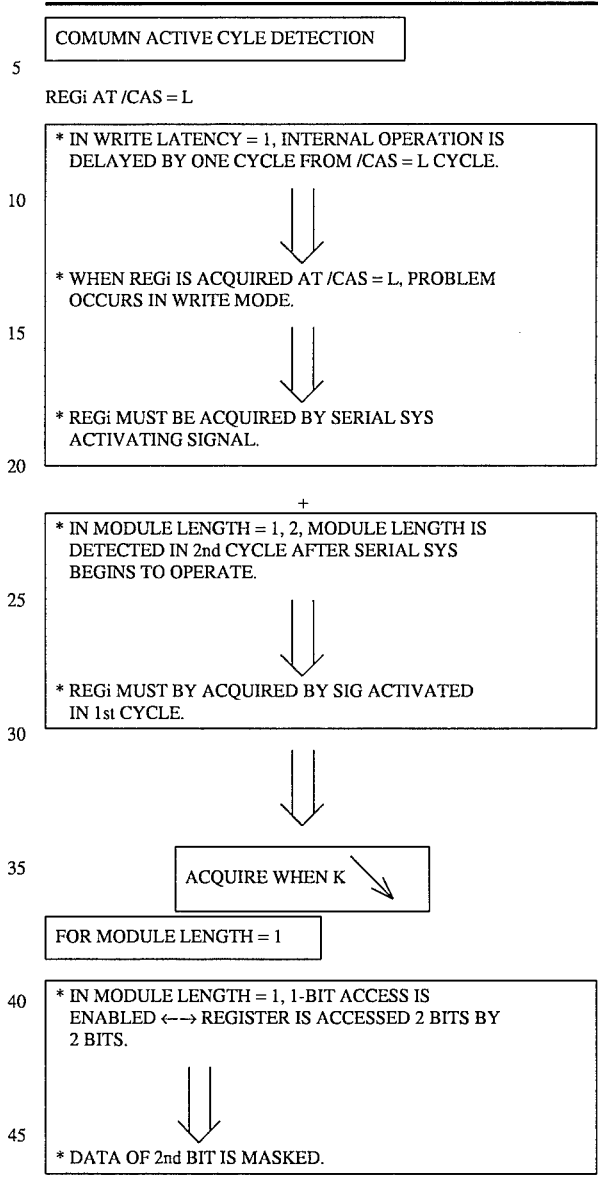

TABLE 33-continued (Read): Only data from GR1 or GR3 are effective.

* SET SO THAT DQMR 214 IS FIXED AT H.

(Write): Data are scrambled when outputted from registers to data lines.

Cannot be fixed at specific DQMW lines.

* RESET 2nd & 4th REGISTERS SO THAT SAME STATUS AS WHEN DQM=H IS AQUIRED.

TABLE 34

[BURST STOP EXPLANATION] (See FIG. 50)

BURST STOP OPERATION

* In burst cycle, serial system is disabled next to the cycle where burst stop command is inputted even midway of module length.
  — * READ - - - Output HiZ
  — * WRITE - - Input is disabled.

* Burst stop command - - CLK 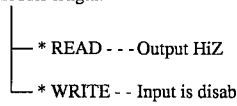 AT /RAS = H, /CAS = H, /CS = L, and /WE = L
* Stop status reset - - - When next column active cycle starts.
* Burst stop is executed even if internal status is odd.

* Odd status is not preferable at next columnn access start.

* Internal status must be initialized.

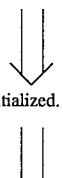

SAME OPERATION AS RESET AFTER MODULE LENGTH

OUTPUT HiZ
* Reset READ in same way as module length.

NOT INPUTTED
* Reset WRITE.

TABLE 35

[COLUMN SYS EXPLANATION]
(See FIGS. 51 to 6 and Tables 2 to 8)

COLUMN SYS BANK DESIGNATION

* BS is acquired when column is active, and column system on designated bank side is activated.
  — * Only signals related to bank are bank-designated.
    * DQ buffer control system
    * CSL control system
  — * Deactivated when not bank-designated.
  — * Change column system to be activated in column system deactivation status (K = L).

* Divide column system basic signal K into two of:
  Decoded by BS    - - for core access
  Not Decoded by BS - - for serial system

|  | CIRCUITS |
|---|---|
| DECODE BY BS | /CDRV, SCSL, Kw, Kn', Kp, Kp', /EQDQ |
| NOT BS | /R, CLSET, /RGAM, DAT, CFP, $K_R$, YCHAN, /EQDQM, AlGi, QA9c |

* When set to only BS-selected side, tap address is delayed when non-selected side changes to selected side.

Set tap address irrespective of BS.

TABLE 36

[COLUMN SYS ADDRESS EXPLANATION] (See FIGS. 62 TO 75.)

COUNTER DRIVE SIGNAL

* Counter ──┬── Page mode - * Partial decode signal which changes for each 8 cycles is outputted.
             │                * In page, address must be transmitted to output-prepare section to output tap address.
             └── * Other than page- * Set address to output-prepare section in column cycle.
                                    * Output address is not transmitted to output-prepare section, because counter is not operated.

* (Page mode) ──┬── Column cycle - * Set tap address to output by CLSET.
                │                   * CNT = L, /CNT = H
                └── In burst - - - - * Operated for each 8 cycles after 5th cycle.

* Other than page mode ──┬── Column cycle ──┬── * Set tap address to output-prepare section by /RGAM.
                                             ├── * Output address by CLSET.
                                             └── * kEEP /CNT at L.

TABLE 36-continued

SPARE SELECT SIGNAL

* In page mode ——┬— * Combine spare information of A3c in sequence to activate column decoder in order of (tap, tap+1), (tap+1, tap+2), . .
　　　　　　　　├— * This signal is necessary to output S/N discriminate signal without delay in cycle where partial decode signal is switched.
　　　　　　　　└— * Keep open until count-up address is transmitted to output-prepare section (for tap+1).

* Other than page mode - - Kept open.

* (page mode) ——┬— * Column cycle - * X and Y are both opened by CLSET.
　　　　　　　　└— * Burst cycle - Operated for each 8 cycles from 5th cycle.

$$\begin{pmatrix} \text{Tap /A3: Operates from X} \\ \text{A3: Operates from Y} \end{pmatrix}$$

TABLE 37

PARTIAL DECODE SIGNAL SWITCHING

* Partial decode signal ——┬— * Page mode - * Opened at 8 cycle intervals.
　　　　　　　　　　　　　└— * Other than page mode, kept opened.

* Addresses are inputted to banks I and II to set partial decode signals.

⇓

When banks I and II are set selectively, partial decode signal is delayed because outputted after BS.

S/N DISCRIMINATION RESULT ACQUISITION

* Page mode - Opened at 8 cycle intervals - S/N bank discrimination signal must be separated for each bank I or II.

* Other than page mode - Kept opened.

Same as partial decode signal switching

Although small pulse is outputted when switched from PLS1 to PLS2, this is not timing at which counter address and S/N discrimination results are switched, thus causing no problem.

TABLE 38

[COLUMN SYSTEM DATA ACCESS EXPLANATION]
(See FIG. 76 to 88 and Tables 9 and 10)

TABLE 38-continued

CHANGE FROM X4 TO X8 OR VICE VERSA

* Bank is divided into 2 by A9c.- * If divided vertically by A9c, length of RWD lines is doubled to increase load.

* Connection between RWD lines and DQ buffers is changed as in Table 9.

* In X4, registers 0, 2, 5 and 7 are stopped.

A9c DECODE IN X4

* In X4, A9c is decoded by selecting DQ buffer. - QACT is decoded by A3c.

⇓

QACT are prepared for A9c & /A9c and BS & /BS.

TABLE 39

* When A9c is switched in Table 10, QACT for both /A9c are sometimes required to be activated.

├— * In this case, old A9c side is for QACT3 side, and new A9c is for QACT0 side (type A, /A).
├— * Coexistence occurs in only HA select cycle of type B, /B.
├— * In type B, does not extend over new and old.
└— * Only new A9c is used from AB cycle. - A9c is switched in AB cycle.

⇓

When A9c is switched by CNT, this does not match A9c switching timing. - Do not use A9c counter.

* Type A, /A ——┬— Old A9c till HA cycle of $Y_{A/B/C}$ = all 1
　　　　　　　　└— Switched to new A9c in next AB cycle.

Type B, /B ——┬— Old A9c till GH cycle of $Y_{A/B/C}$ = all 1
　　　　　　　├— $\left.\begin{array}{l}\text{QACT3: old A9c}\\\text{QACT0: new A9c}\end{array}\right\}$ till HA cycle of $Y_{A/B/C}$ = all 1
　　　　　　　└— Thereafter, switched to new A9c in AB cycle.

┌— * Old A9c = 0 - $\begin{cases} \text{A9c = 0 side QACT3} \\ \text{A9c = 1 side QACT0} \end{cases}$ └— * Old A9c = 1 - $\begin{cases} \text{A9c = 1 side QACT3} \\ \text{A9c = 0 side QACT0} \end{cases}$

⇓

QAT dependent upon C/D is required and QACT is required for each bank.

TABLE 40

| QACT CONTROL |
|---|

* Type A, /A —— * QACT set is switched by A9c.

* Type B, /B ——┬— * QACT set is switched by A9c.
   │
   ├— * In HA cycle of $Y_{A/B/C}$ = all 1,
   │   if A9c = 0,
   │   QACT3 (/A9c side), QACT (A0c side) = H
   │   others = L
   │
   └— * In HA cycle of $Y_{A/B/C}$ = all 1,
       if A9c = 1,
       QACT0 (/A9c side), QACT (A9c side) = H
       others = L

| A9c CONTROL |
|---|

* CLK ↗ in column active cycle - External A91N is acquired -

Switching is made during K = L.

* In AB cycle after HA cycle of $Y_{A/B/C}$ = all 1 - A9c is changed.
* In X8, A9c and /A9c are both activated.

┌— * In column active cycle next to $Y_{A/B/C}$ = all 1 & HA
  │   cycle, tap must be kept without counting A9c. - Stop
  │   counting-up by /K.
  │
  └— * If $Y_{A/B/C}$ = all 1 & HA cycle are satisfied at tap, A9c
      must be counted in next K cycle.

* A9c is counted up only when module length = PAGE.

What is claimed is:

1. A synchronous LSI memory device supplied with a clock signal, a stop signal and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal;

control means for controlling said memory cell array means on the basis of outputs of said timing generating means and said signal generating means;

mask control means for acquiring statuses of terminals in sequence into register means having a number of bits that are an even-number times larger than that obtained during a cycle interval during which a column address is inputted, outputting the acquired data in sequence, inputting the outputted data, respectively, to specific registers each having the number of bits that are an even-number times larger than that obtained during the cycle interval during which the column address is inputted, and when data inputted through the terminals are in a first status, outputting signals for setting output circuits of the register means to a high impedance status in synchronism with the second signal;

data holding means for, in only a write mode, acquiring the statuses of the terminals in synchronism with the second signal into registers having a plurality of bits in sequence and scrambling the acquired data on first data lines plural bits by plural bits every plural cycles; and precharge means for precharging the first data lines into a write disable status every predetermined cycle interval, said data holding means and said precharge means being activated in the write mode.

2. The synchronous LSI memory device of claim 1, wherein when a predetermined access length is "1", even-number registers of said data holding means are fixed to a status that is the same as when masked data are acquired.

3. A synchronous LSI memory device supplied with a clock signal, a stop signal and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal;

control means for controlling said memory cell array means on the basis of outputs of said timing generating means and said signal generating means;

mask control means for acquiring statuses of terminals in sequence into register means having a number of bits that are an even-number times larger than that obtained during a cycle interval during which a column address is inputted, outputting the acquired data in sequence, inputting the outputted data, respectively, to specific registers each having the number of bits that are an even-number times larger than that obtained during the cycle interval during which the column address is inputted, and when data inputted through the terminals are in a first status, outputting signals for setting output circuits of the register means to a high impedance status in synchronism with the second signal;

read mask registers for acquiring, in a read mode, the statuses of the second terminals into a plurality of registers in sequence in synchronism with the second signal, and outputting the acquired data to data lines in sequence; and potential fixing means for fixing, in a write mode, potentials of the data lines to set output circuits connected to the data lines to a high impedance status.

4. The synchronous LSI memory device of claim 3, wherein when a predetermined access length is "1", even-number registers of said read mask registers having a bit number length half of a word length are fixed to a mask data output status.

5. A synchronous LSI memory device supplied with a clock signal, a stop signal, and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal; and control means for controlling said memory cell array means on the basis of outputs of said timing generating means and said signal generating means, wherein the stop signal is outputted subsequent to a predetermined number of accesses of the memory cells after the memory cells have been precharged by a precharge means.

6. The synchronous LSI memory device of claim 5, wherein when a write latency is "1", the stop signal is outputted in a first clock cycle immediately after a write disable mode has been changed to a write enable mode.

7. A synchronous LSI memory device supplied with a clock signal, a stop signal, and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal; and control means for controlling said memory cell array means on the basis of outputs of said timing generating means and said signal generating means, wherein the number of predetermined accesses is counted on the basis of a signal for selecting bits n-bits by n-bits by interleaving an m(=n+n)-bit register having two sets of n-bit registers.

8. A synchronous LSI memory device supplied with a clock signal, a stop signal, and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal; and control means for controlling said memory cell array means on the basis of outputs of said timing generating means and said signal generating means, wherein when a plurality of said memory cells are accessed in series, a plurality of serially accessed memory cells can be accessed simultaneously.

9. The synchronous LSI memory device of claim 8, wherein when a plurality of said cell array means are accessed simultaneously, a plurality of data buffers whose number is a half of that required when a single cell array is accessed are activated in the respective cell arrays means.

10. A synchronous LSI memory device supplied with a clock signal, a stop signal, and a control signal, comprising:

memory cell array means each having a plurality of memory cells;

timing generating means for generating a first basic signal synchronous with the clock signal and masked according to status of the control signal;

signal generating means for generating a second signal in synchronism with the first basic signal and stopping generating the second signal after a predetermined number of accesses of the memory cells or in response to the stop signal; and control means for controlling said memory cell array means on the basis of outputs of said timing generating means and said signal generating means, wherein the second signal is divided into a plurality of signals according to use so as to be controlled individually.

\* \* \* \* \*